(12) United States Patent
Machida

(10) Patent No.: US 12,517,335 B2
(45) Date of Patent: Jan. 6, 2026

(54) ZOOM OPTICAL SYSTEM, OPTICAL APPARATUS AND METHOD FOR MANUFACTURING THE ZOOM OPTICAL SYSTEM

(71) Applicant: Nikon Corporation, Tokyo (JP)

(72) Inventor: Kosuke Machida, Tokyo (JP)

(73) Assignee: Nikon Corporation, Tokyo (JP)

( * ) Notice: Subject to any disclaimer, the term of this patent is extended or adjusted under 35 U.S.C. 154(b) by 1030 days.

(21) Appl. No.: 17/311,330

(22) PCT Filed: Dec. 26, 2018

(86) PCT No.: PCT/JP2018/047780
§ 371 (c)(1),
(2) Date: Jun. 5, 2021

(87) PCT Pub. No.: WO2020/136748
PCT Pub. Date: Jul. 2, 2020

(65) Prior Publication Data
US 2022/0019064 A1    Jan. 20, 2022

(51) Int. Cl.
*G02B 15/14*    (2006.01)
*G02B 15/20*    (2006.01)
*G02B 27/00*    (2006.01)

(52) U.S. Cl.
CPC ...... *G02B 15/144113* (2019.08); *G02B 15/20* (2013.01); *G02B 27/0025* (2013.01)

(58) Field of Classification Search
CPC ........ G02B 15/144113; G02B 15/1461; G02B 15/20; G02B 27/0025
See application file for complete search history.

(56) References Cited

U.S. PATENT DOCUMENTS

2013/0201370 A1    8/2013 Hatada
2016/0252712 A1    9/2016 Uchida et al.

FOREIGN PATENT DOCUMENTS

JP    2013-160944 A    8/2013
JP    2014-209144 A    11/2014
(Continued)

OTHER PUBLICATIONS

International Preliminary Report on Patentability from International Patent Application No. PCT/JP2018/047780, Jul. 8, 2021.
(Continued)

*Primary Examiner* — Jack Dinh
(74) *Attorney, Agent, or Firm* — Potomac Law Group, PLLC

(57) ABSTRACT

A zoom optical system (ZL) comprises, in order from an object, a first lens group (G1) having a positive refractive power, a second lens group (G2) having a negative refractive power, a first intermediate lens group (GM1) having a positive refractive power, a second intermediate lens group (Gd2) having a positive or negative refractive power, and a last lens group (GLT) having a positive or negative refractive power. Upon zooming, distances between adjacent lens groups change. The second intermediate lens group (GM2) includes a focusing lens group that moves upon focusing. The first lens group (G1) includes, a 1-1st lens having a negative refractive power and a 1-2nd lens having a positive refractive power. The zoom optical system satisfies a following conditional expression.

$0.010 < dP1/f1 < 0.075$ where dP1: a sum of a center thickness of the 1-1st lens and a center thickness of the 1-2nd lens, and
f1: a focal length of the first lens group (G1).

23 Claims, 51 Drawing Sheets

(56) References Cited

FOREIGN PATENT DOCUMENTS

| JP | 2016-126278 A | 7/2016 |
| JP | 2018-169563 A | 11/2018 |
| WO | WO 2015/146067 A1 | 10/2015 |

OTHER PUBLICATIONS

Office Action issued Feb. 8, 2022, in Japanese Patent Application No. 2020-562011.
Office Action issued Jan. 24, 2022, in Chinese Patent Application No. 201880099567.5.
International Search Report from International Patent Application No. PCT/JP2018/047780, Apr. 9, 2019.

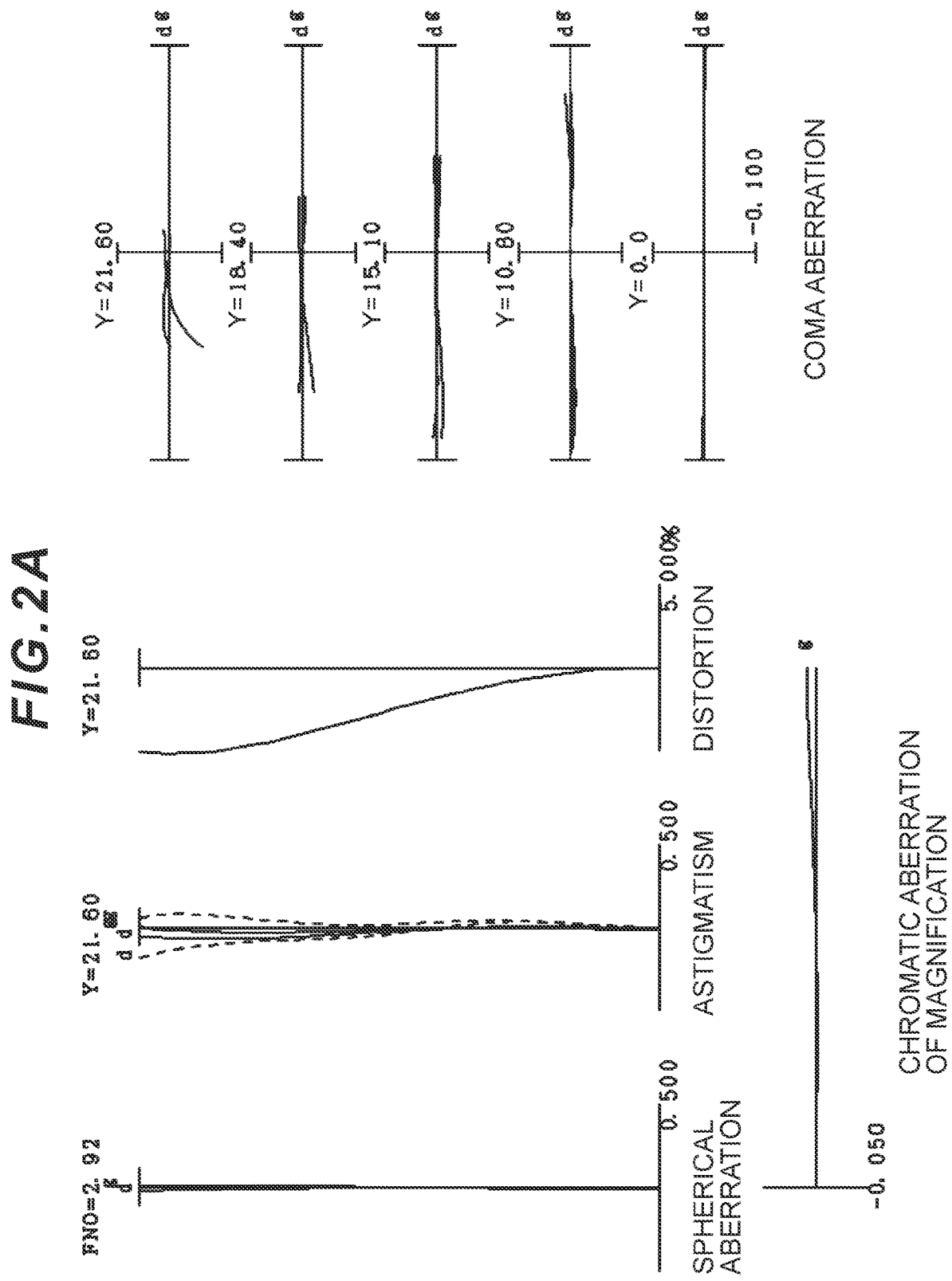

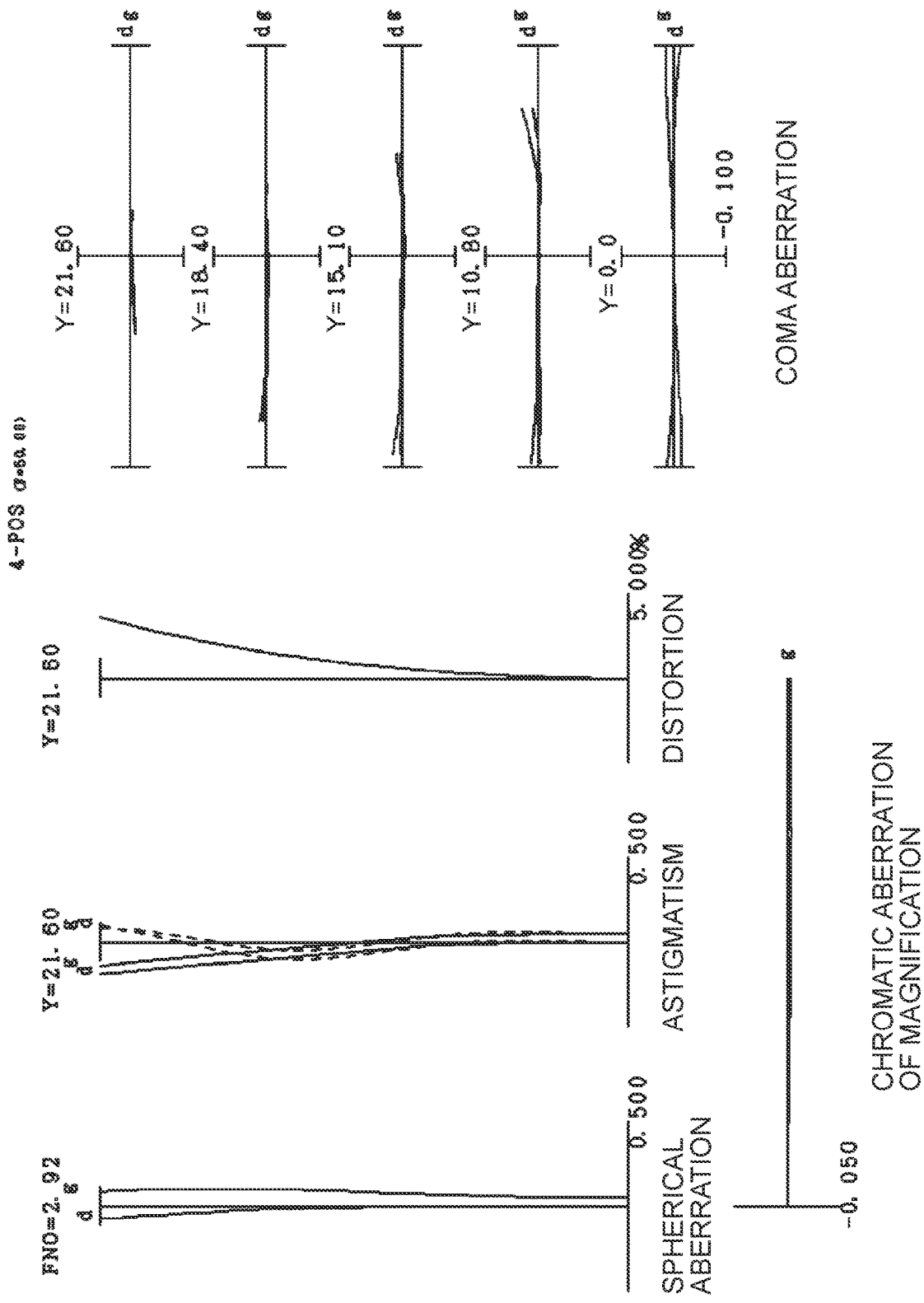

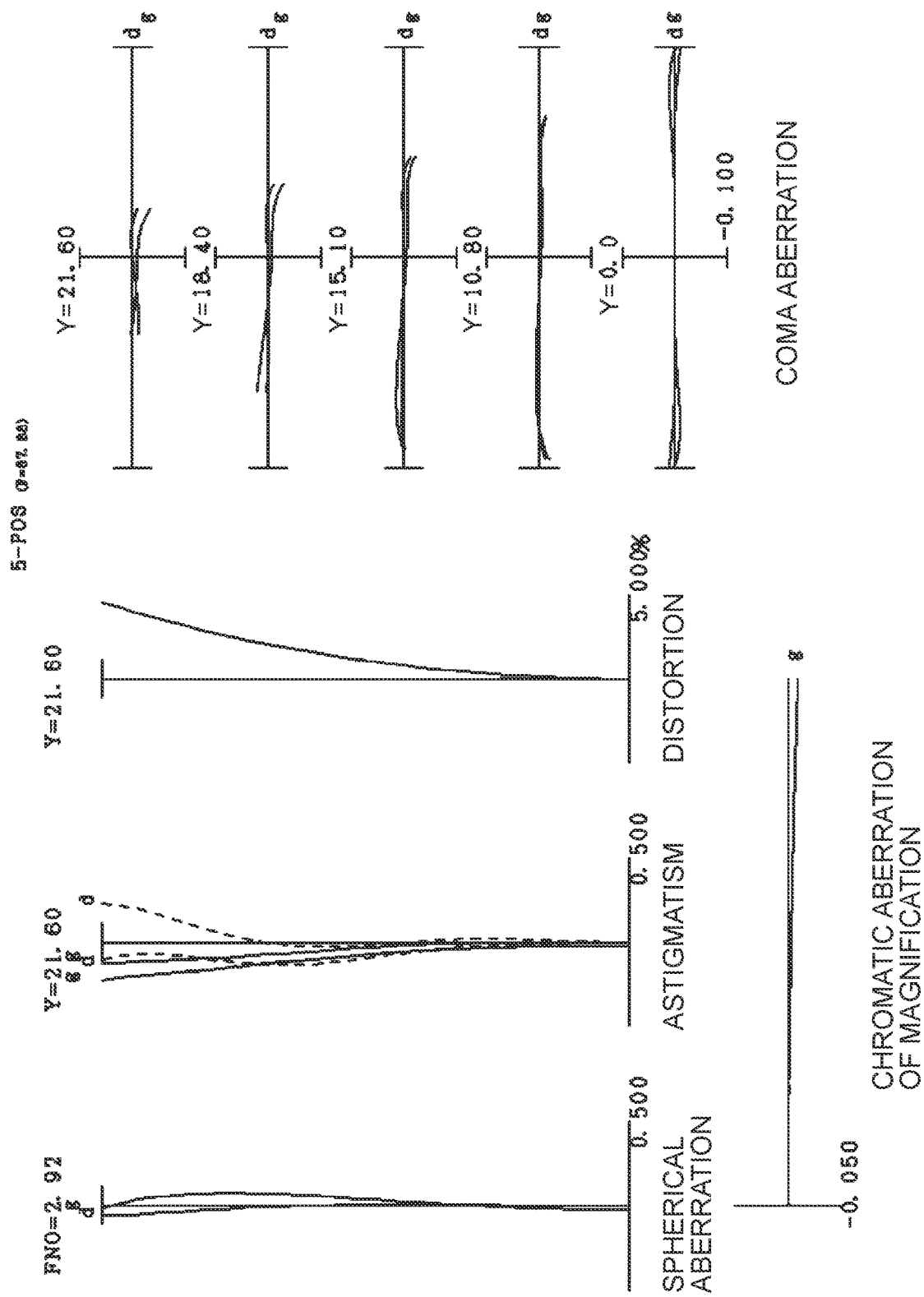

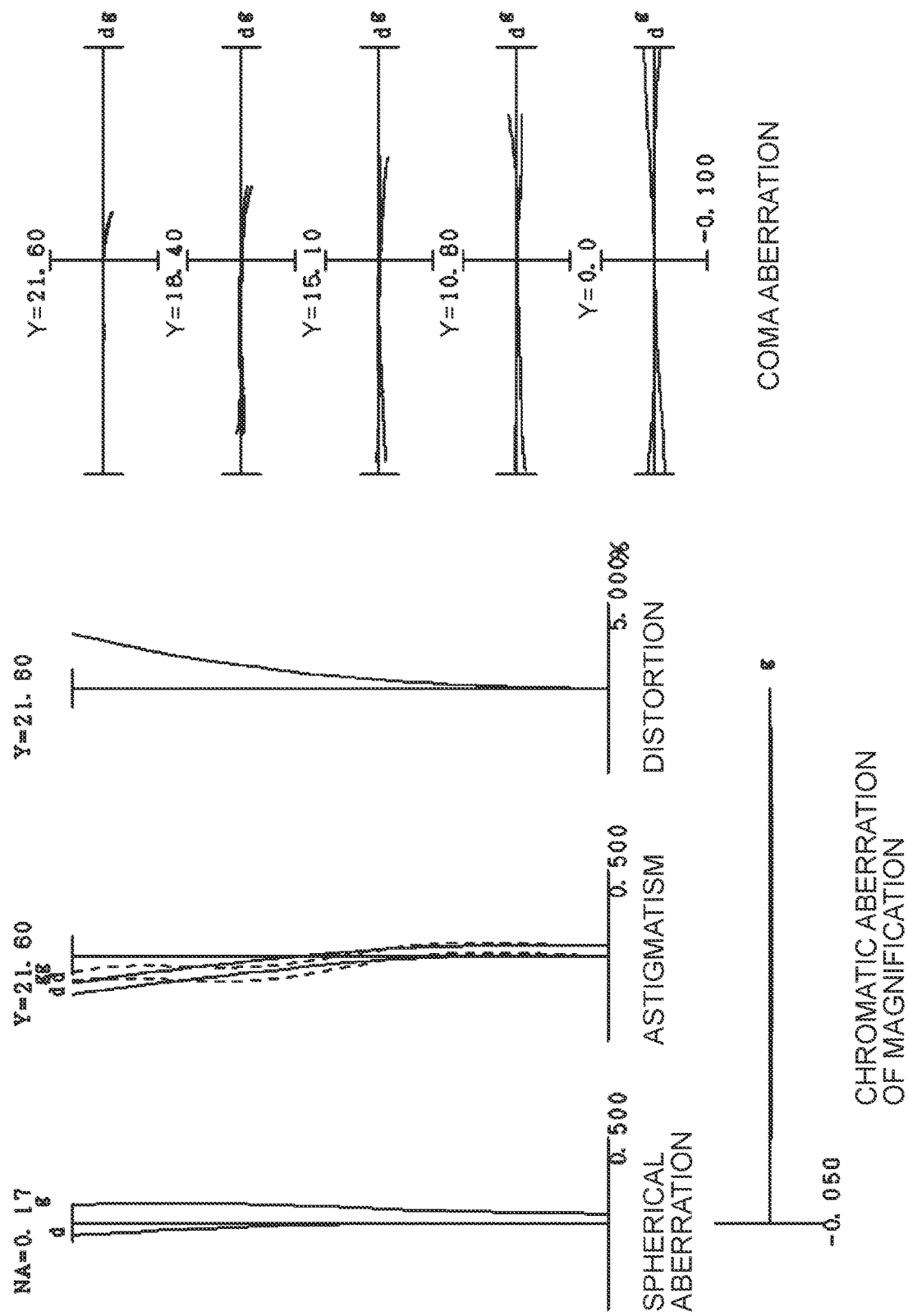

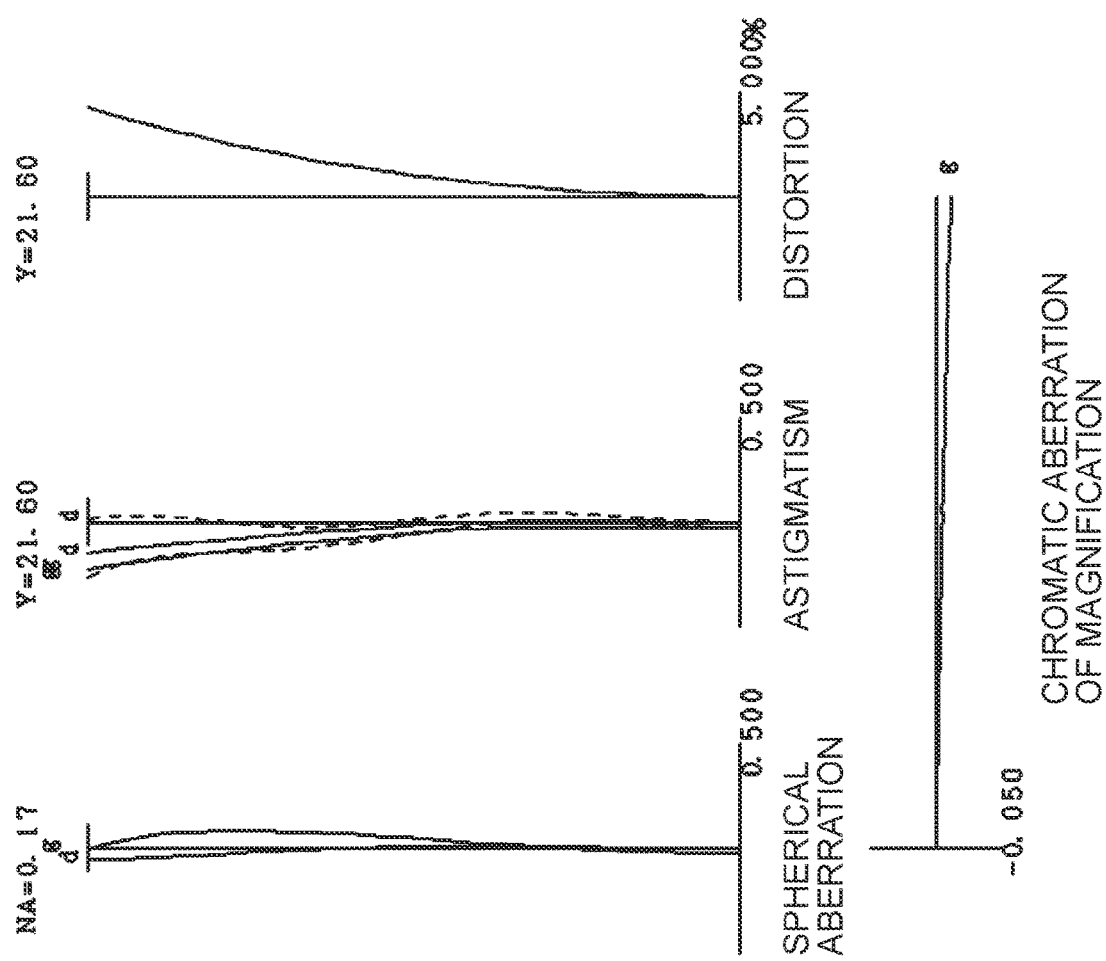

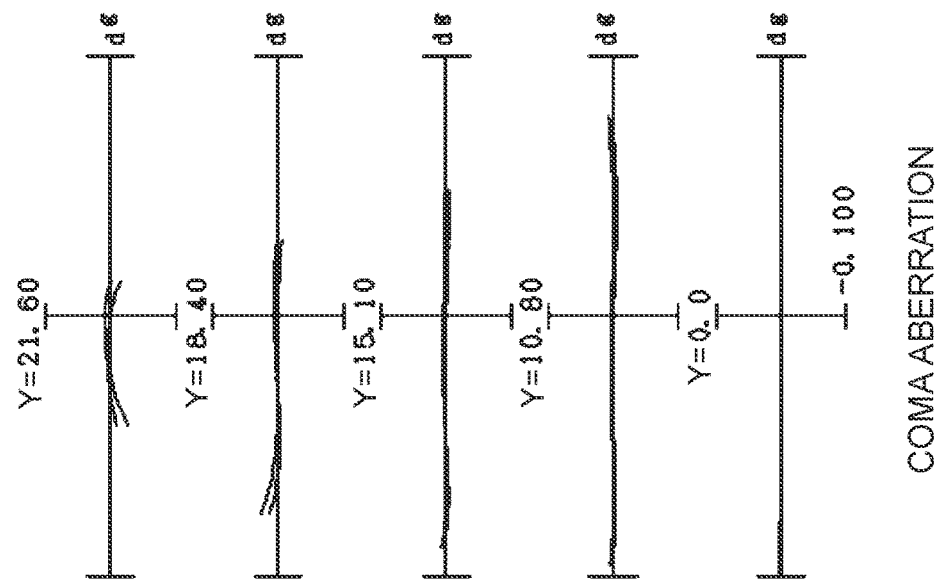
FIG. 5A
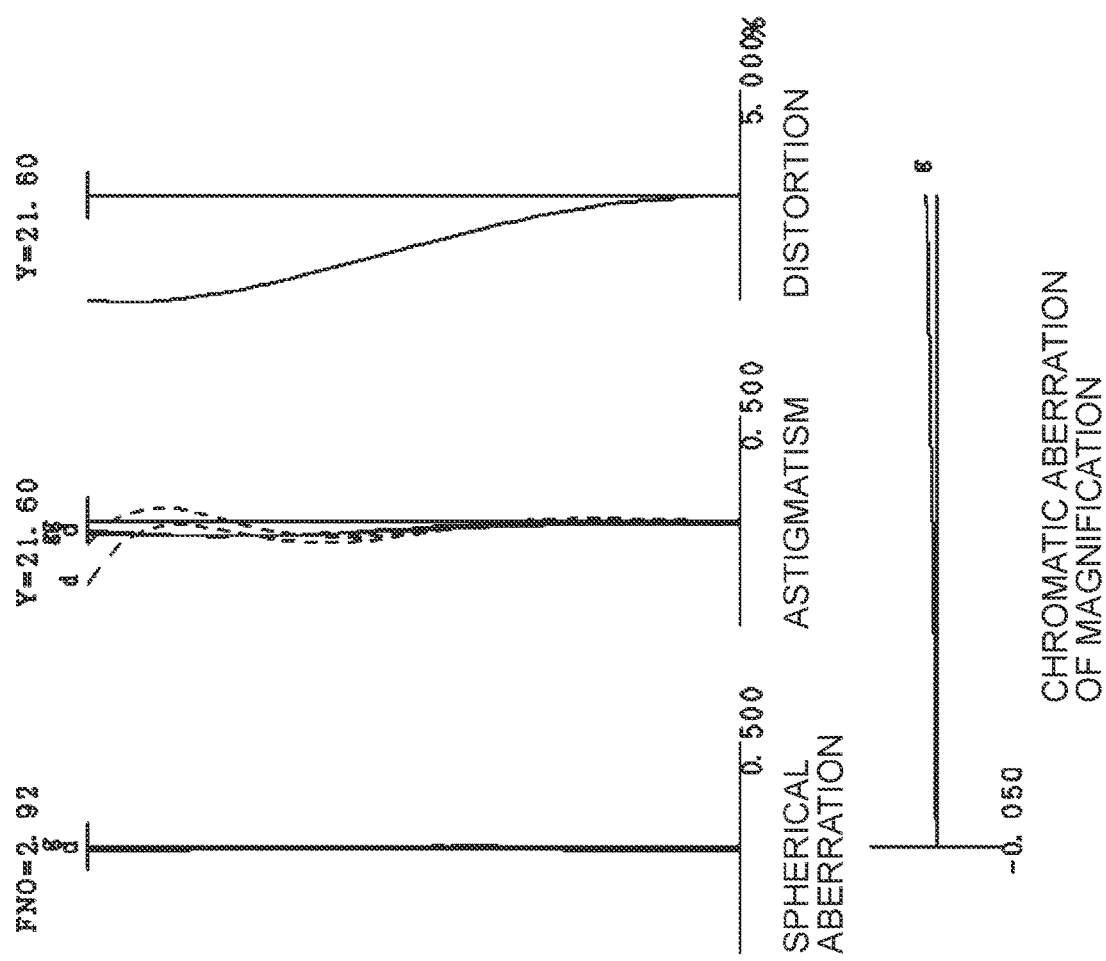

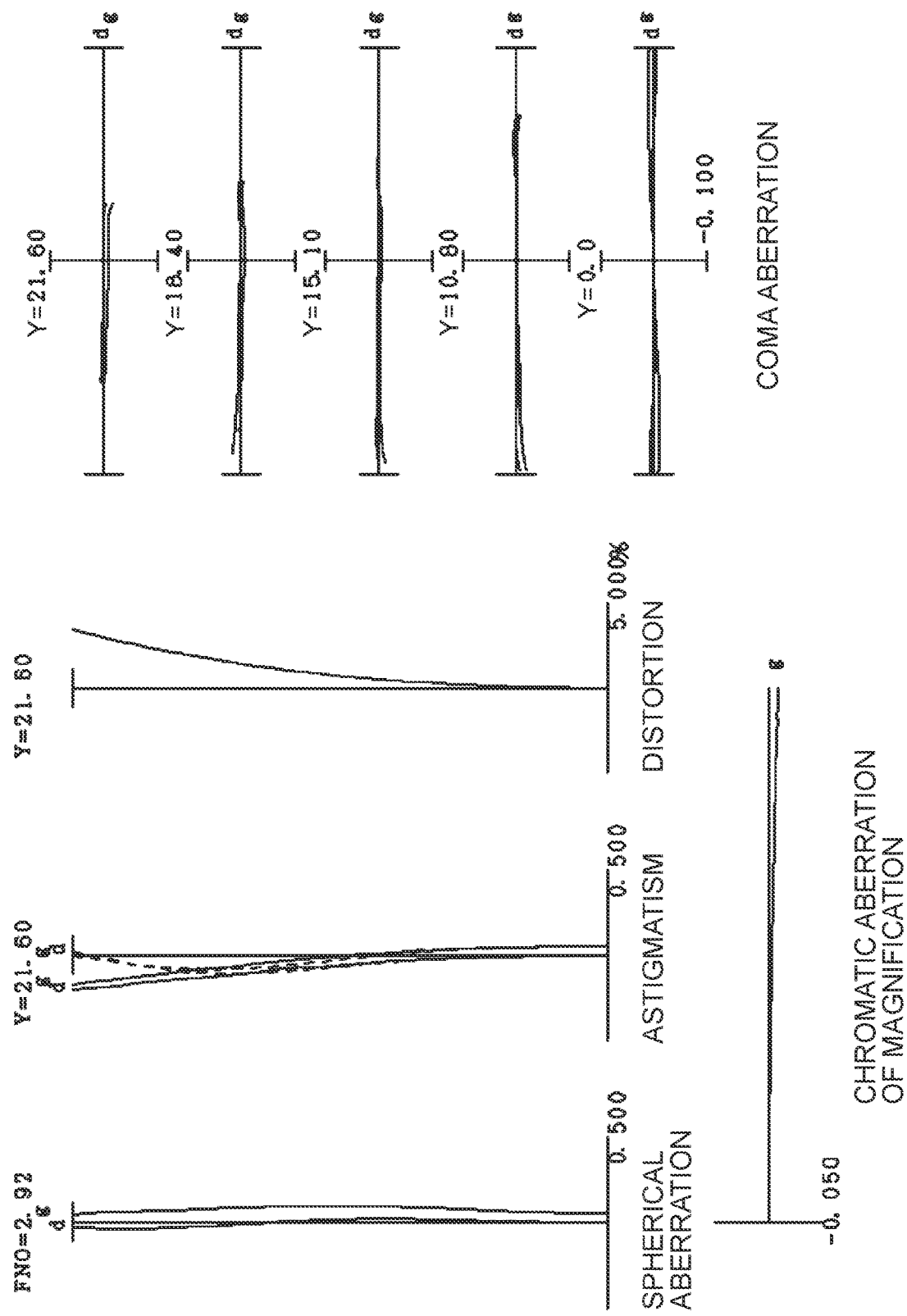

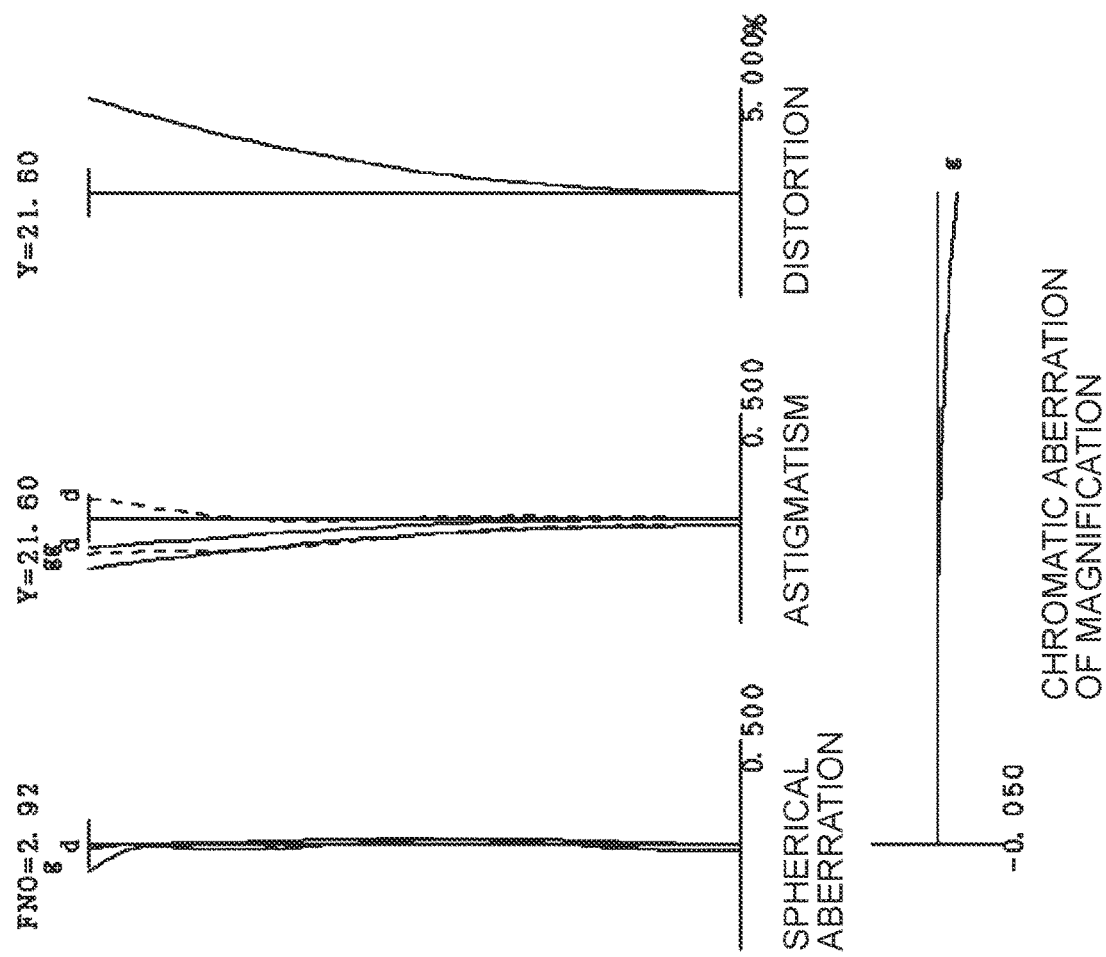

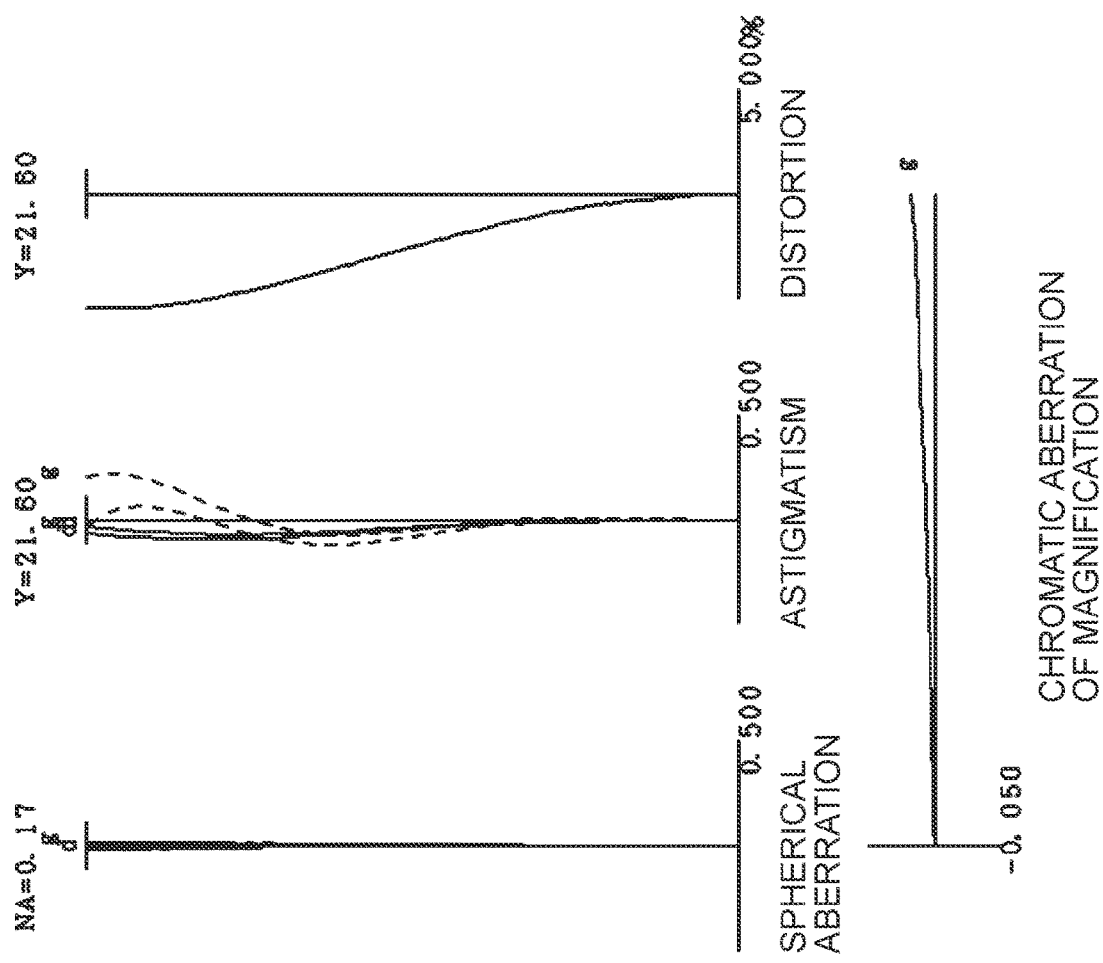

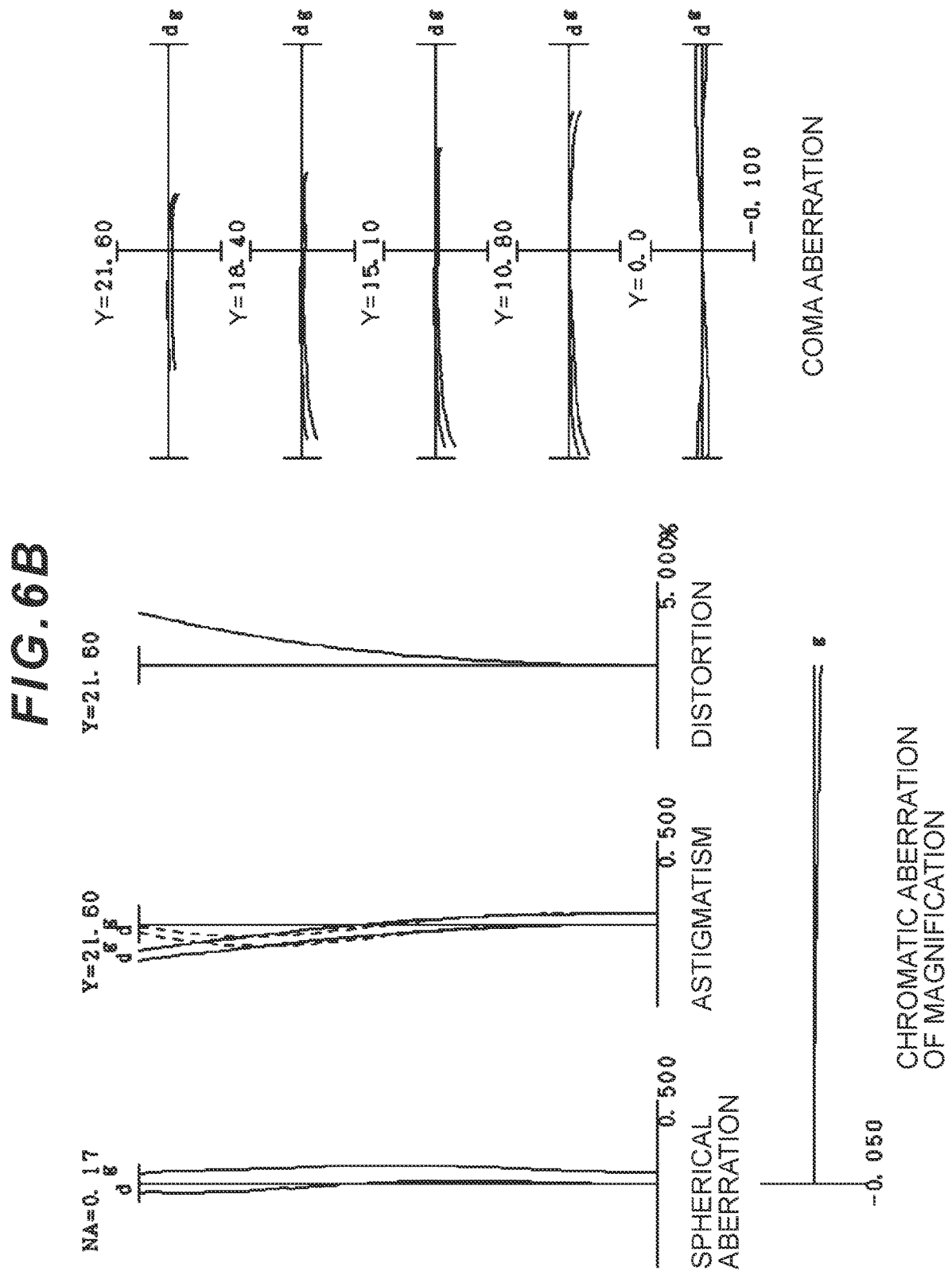

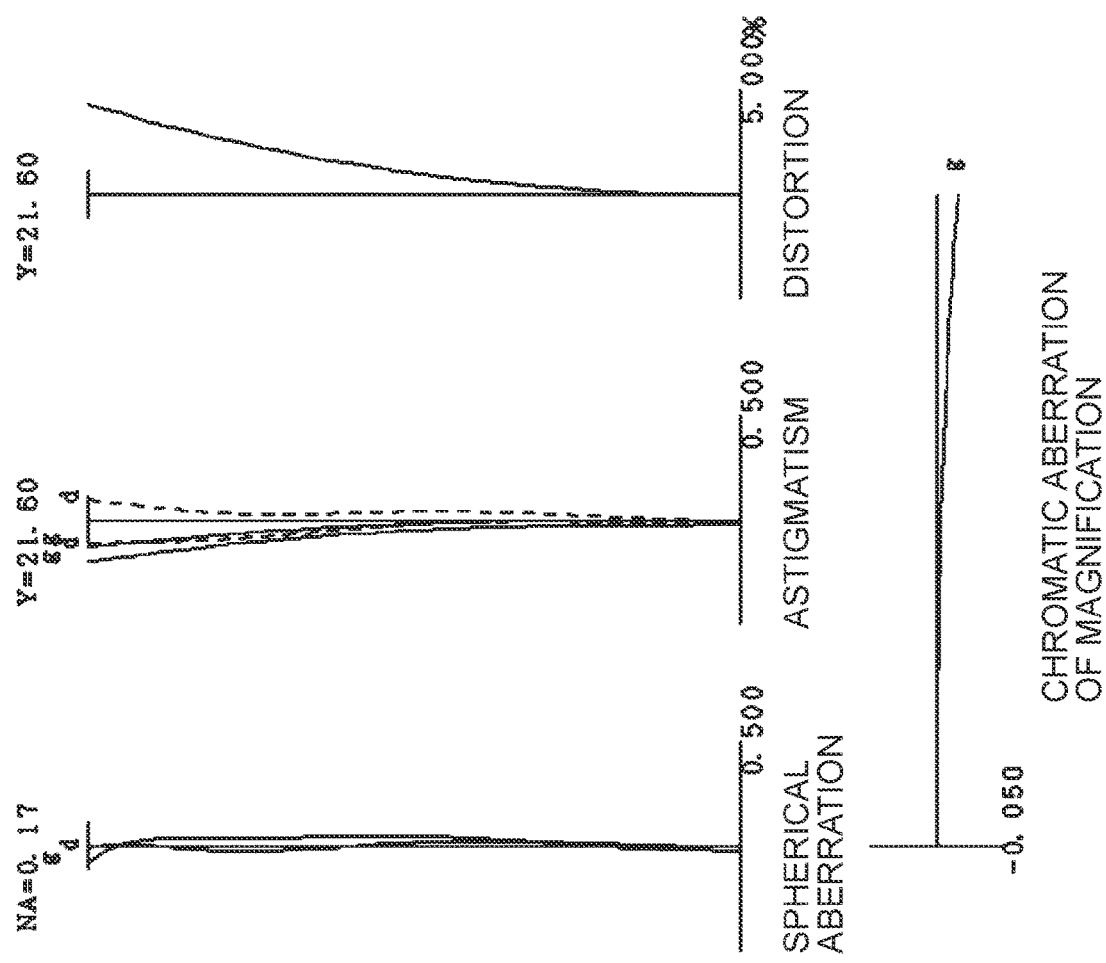

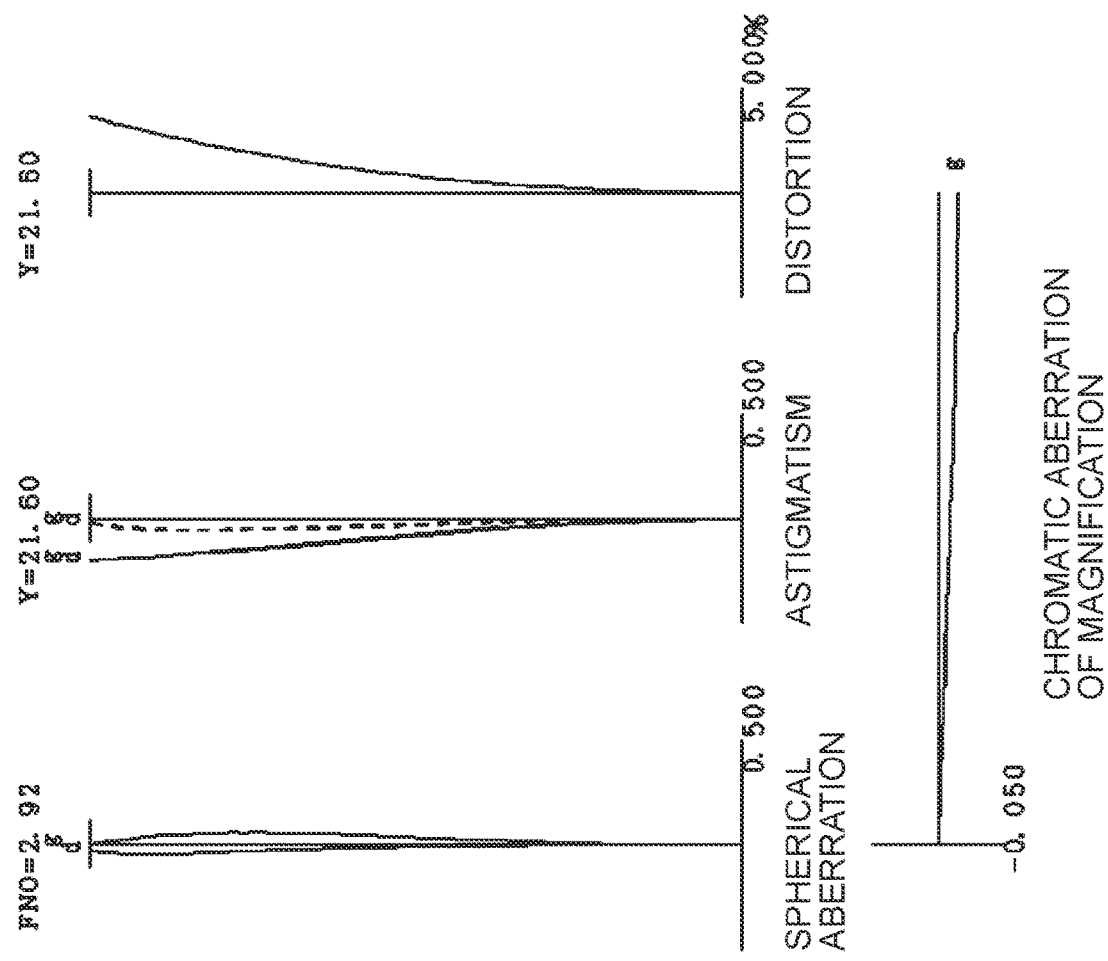

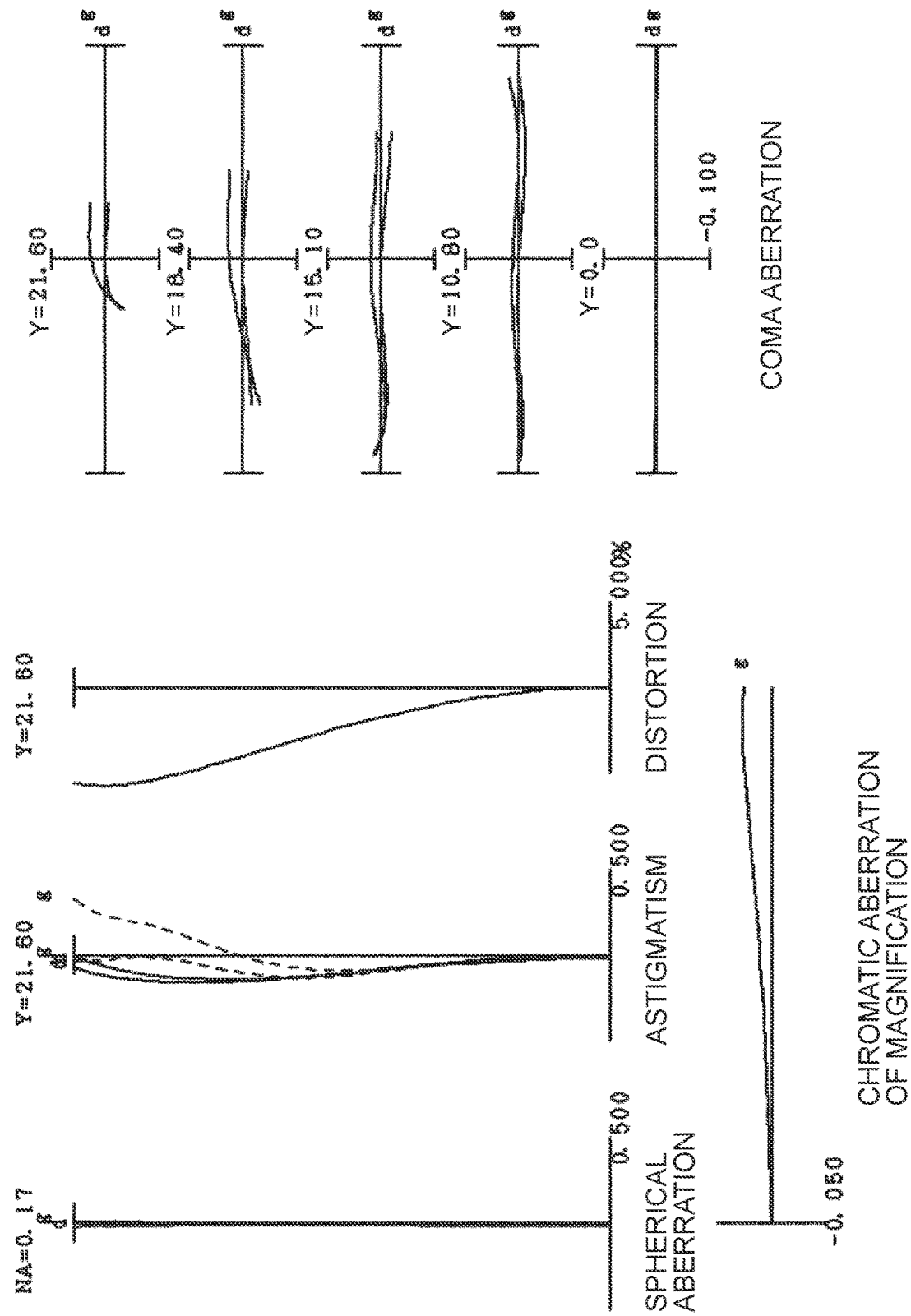

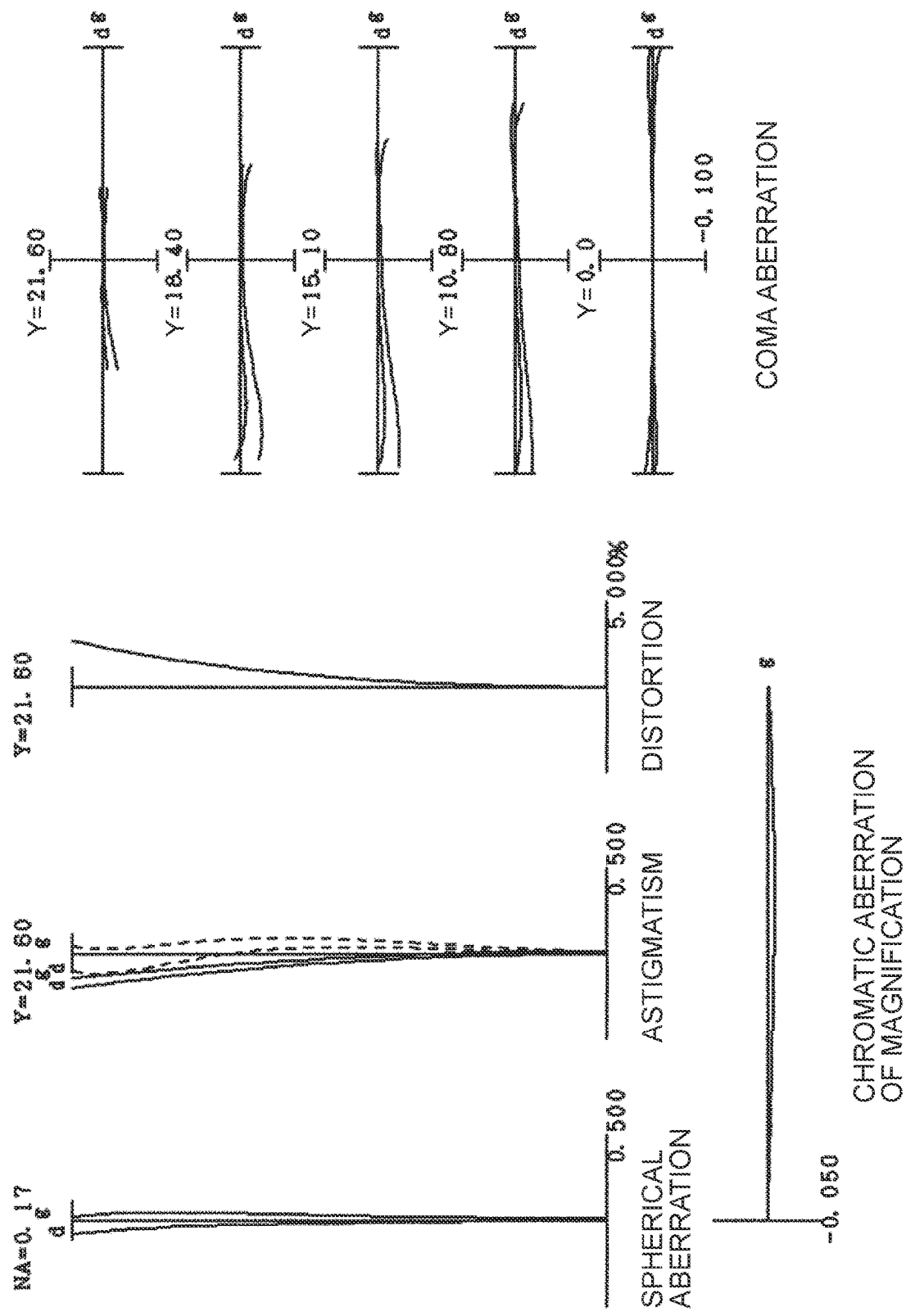

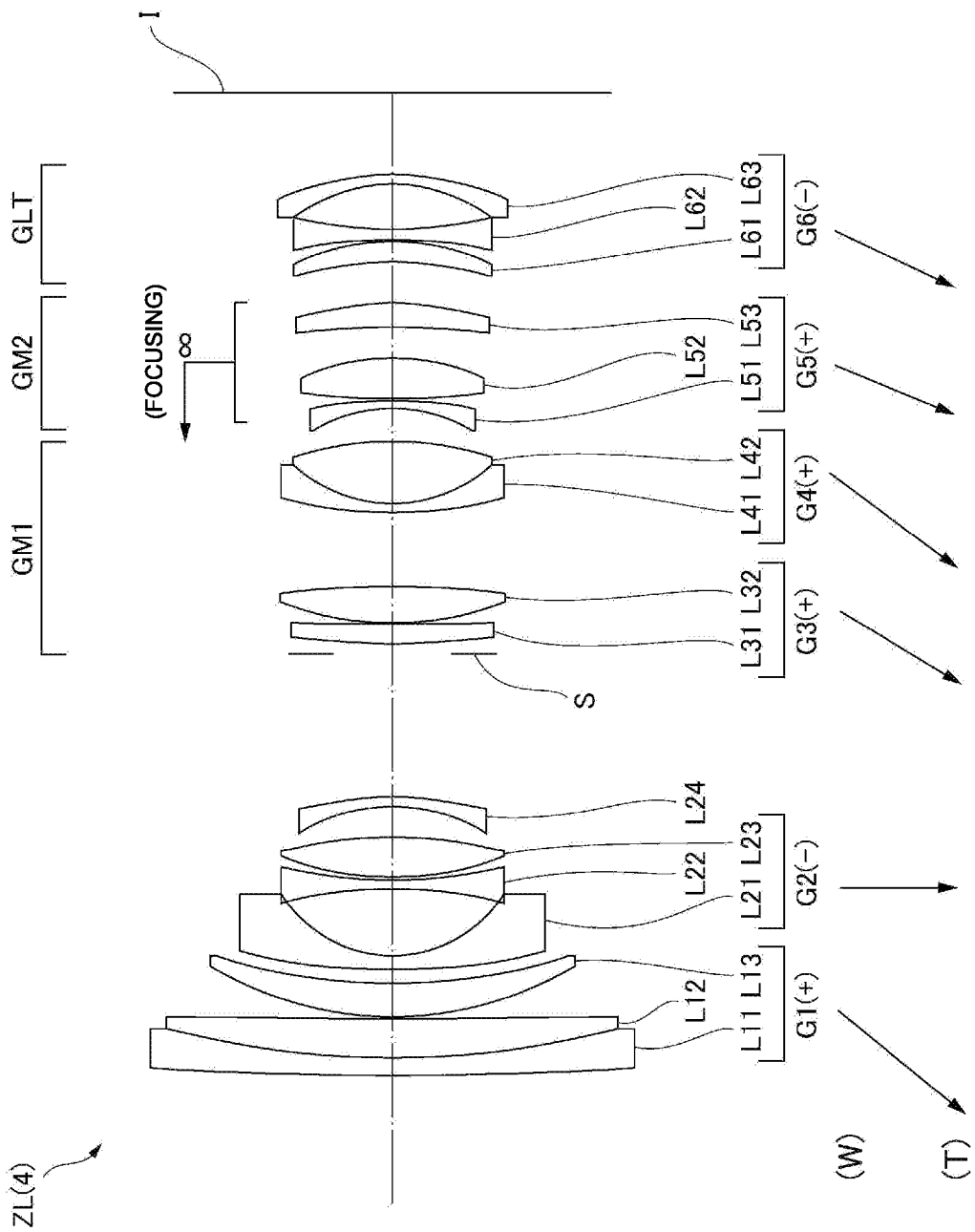

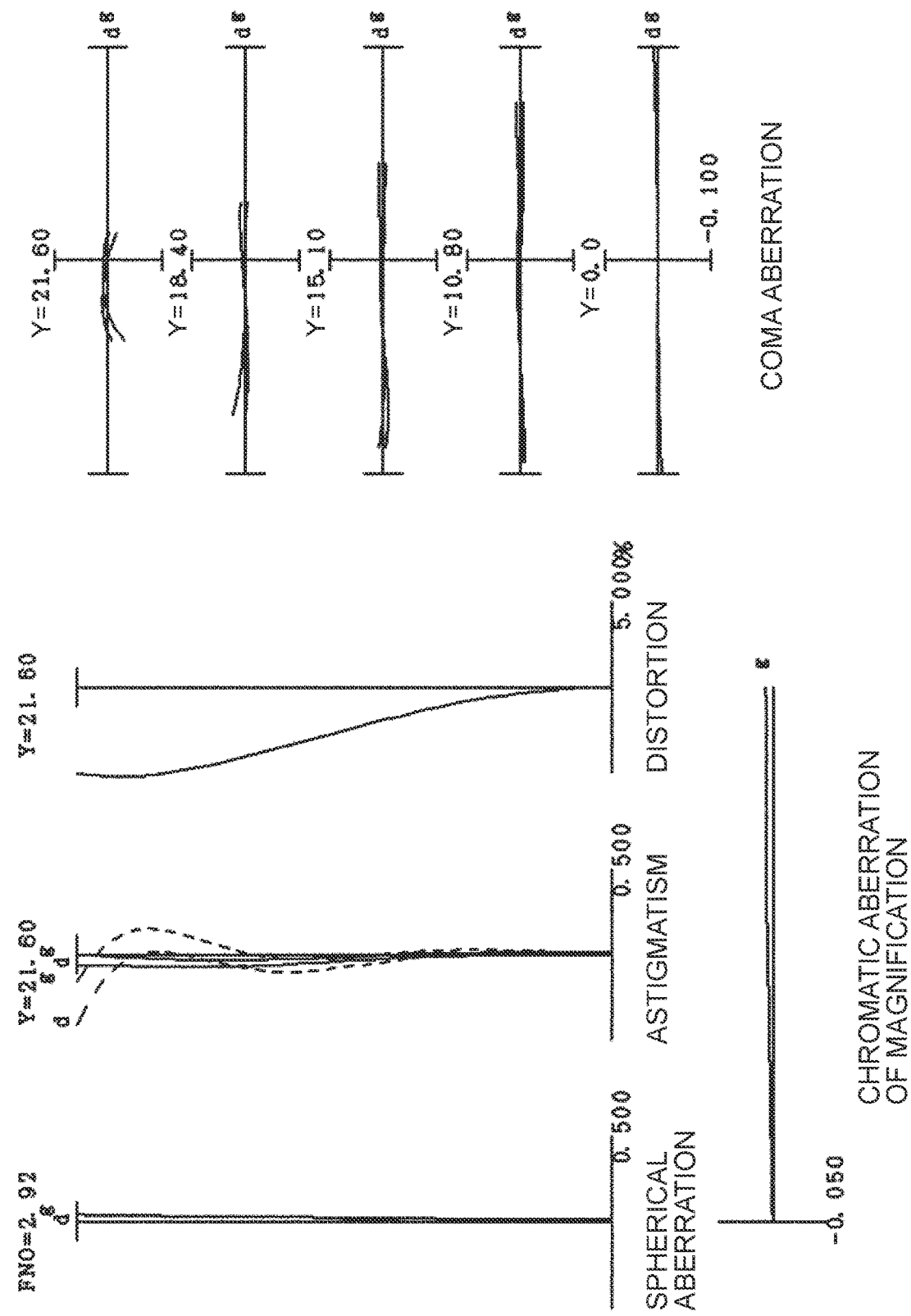

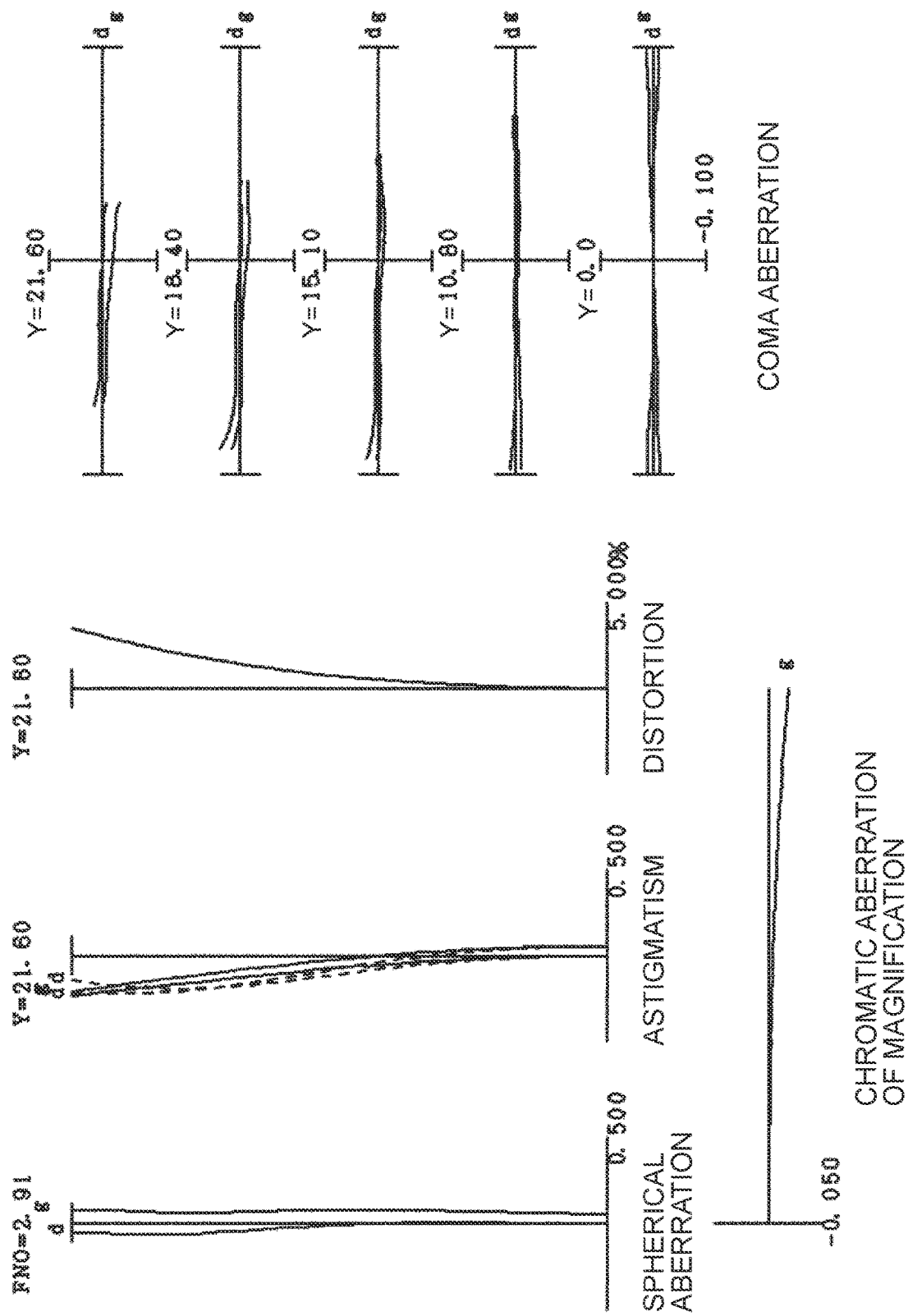

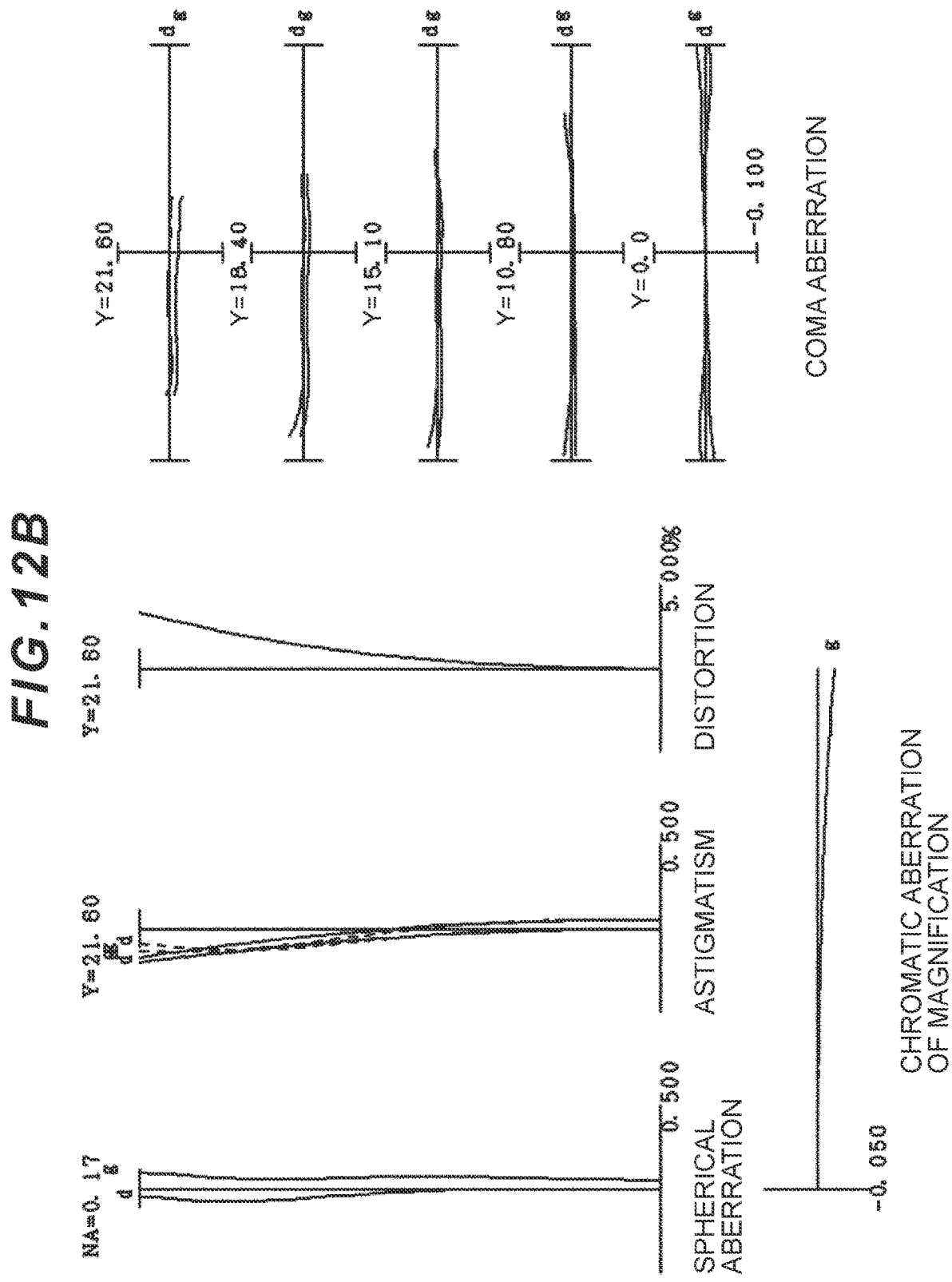

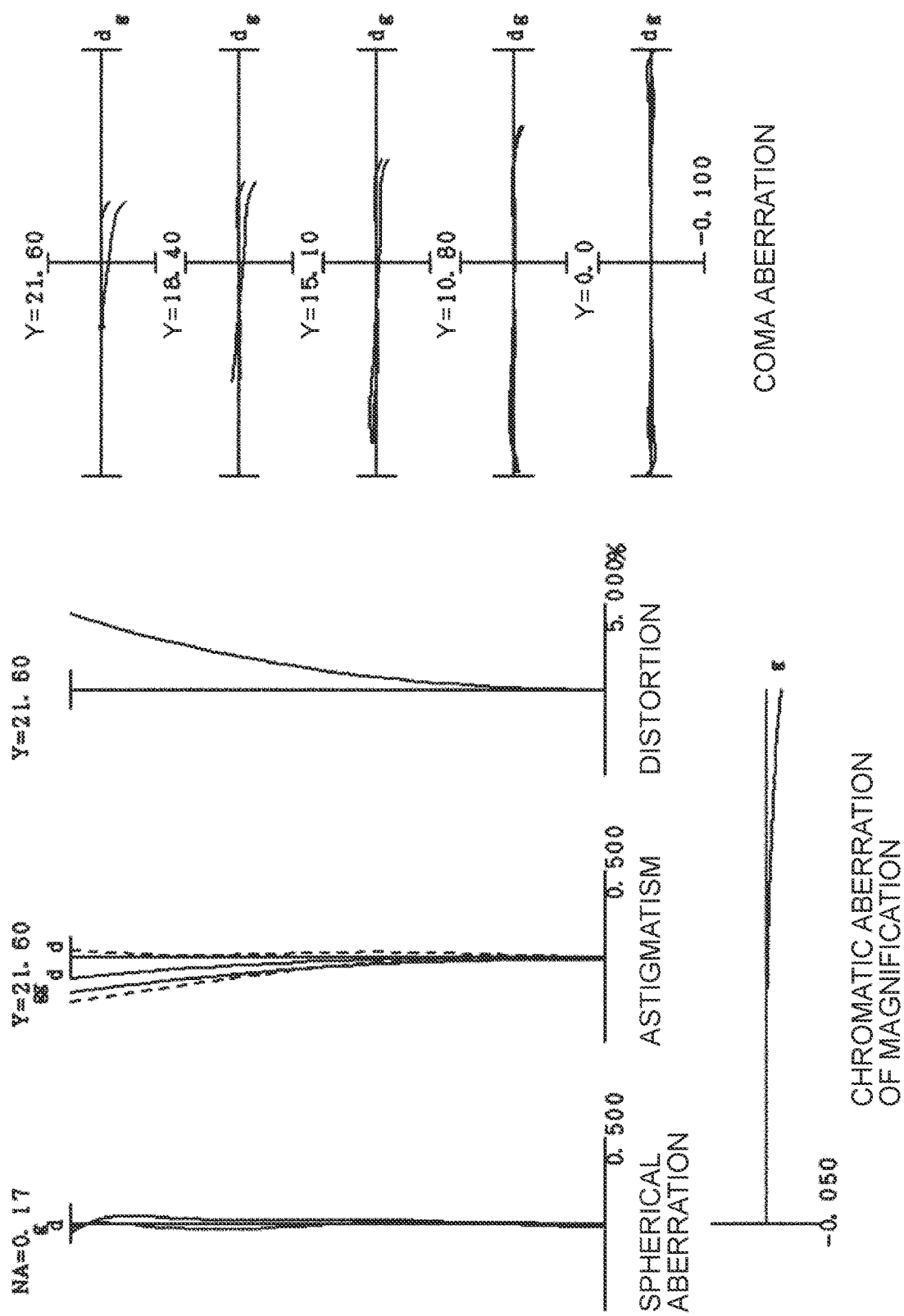

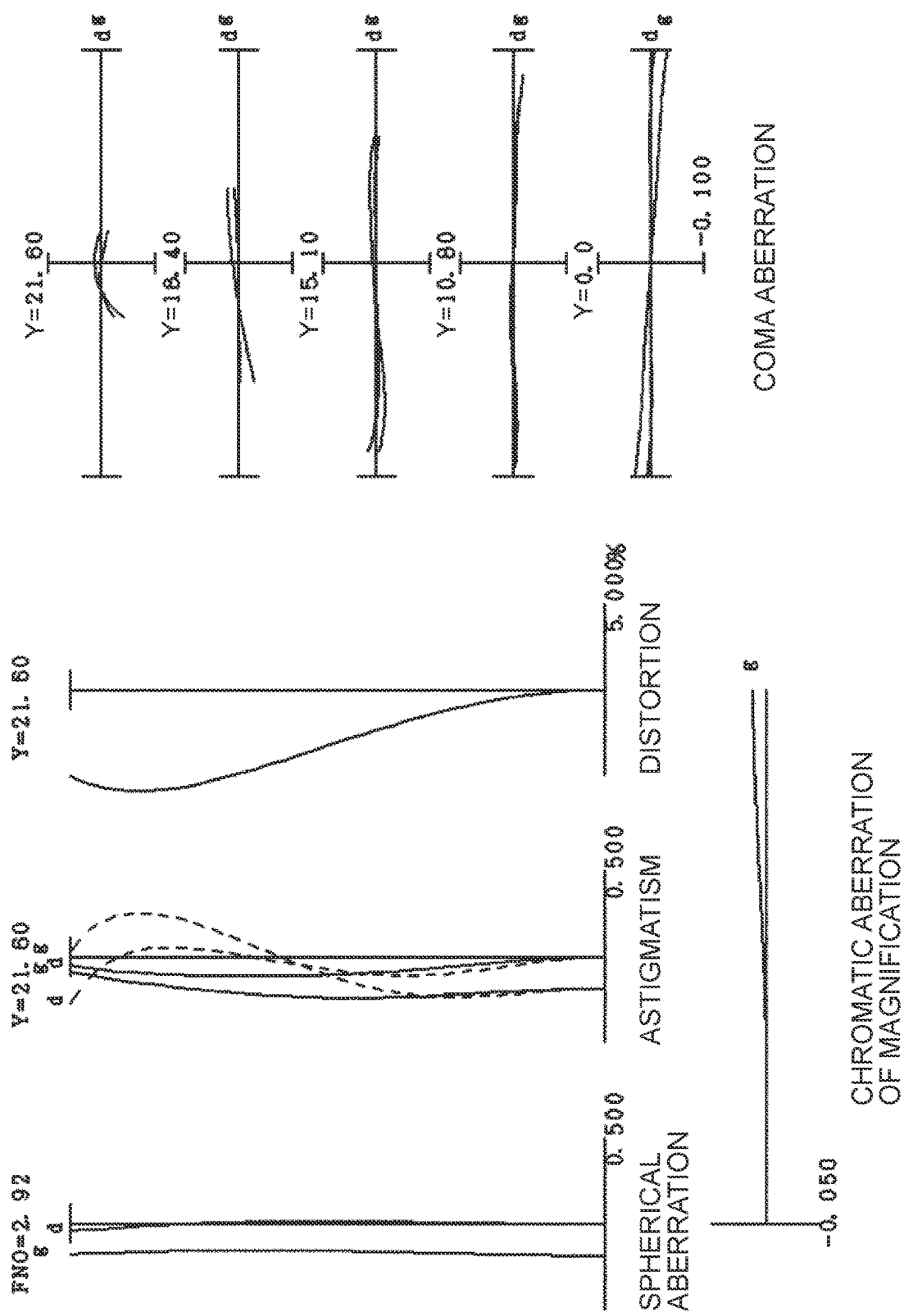

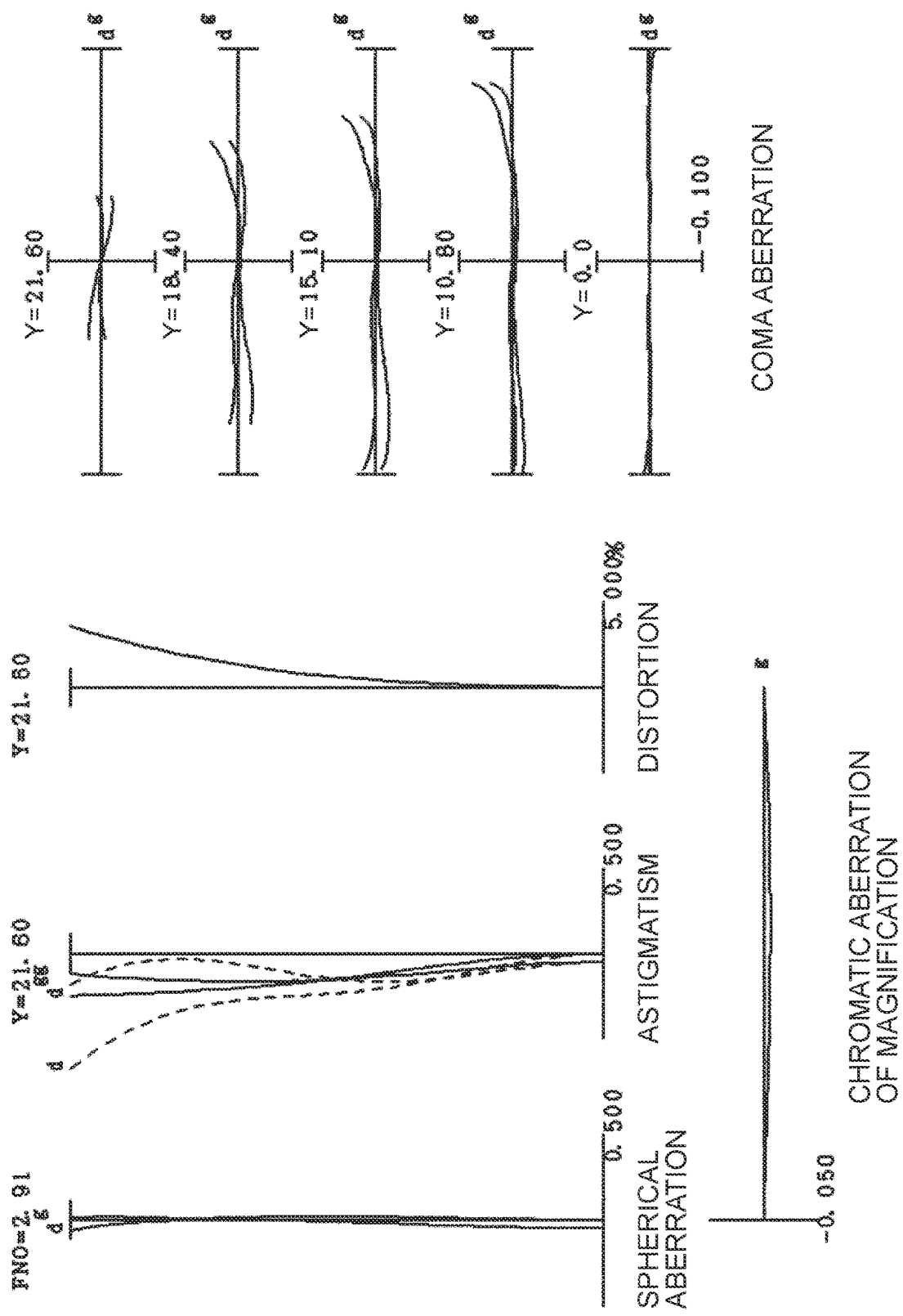

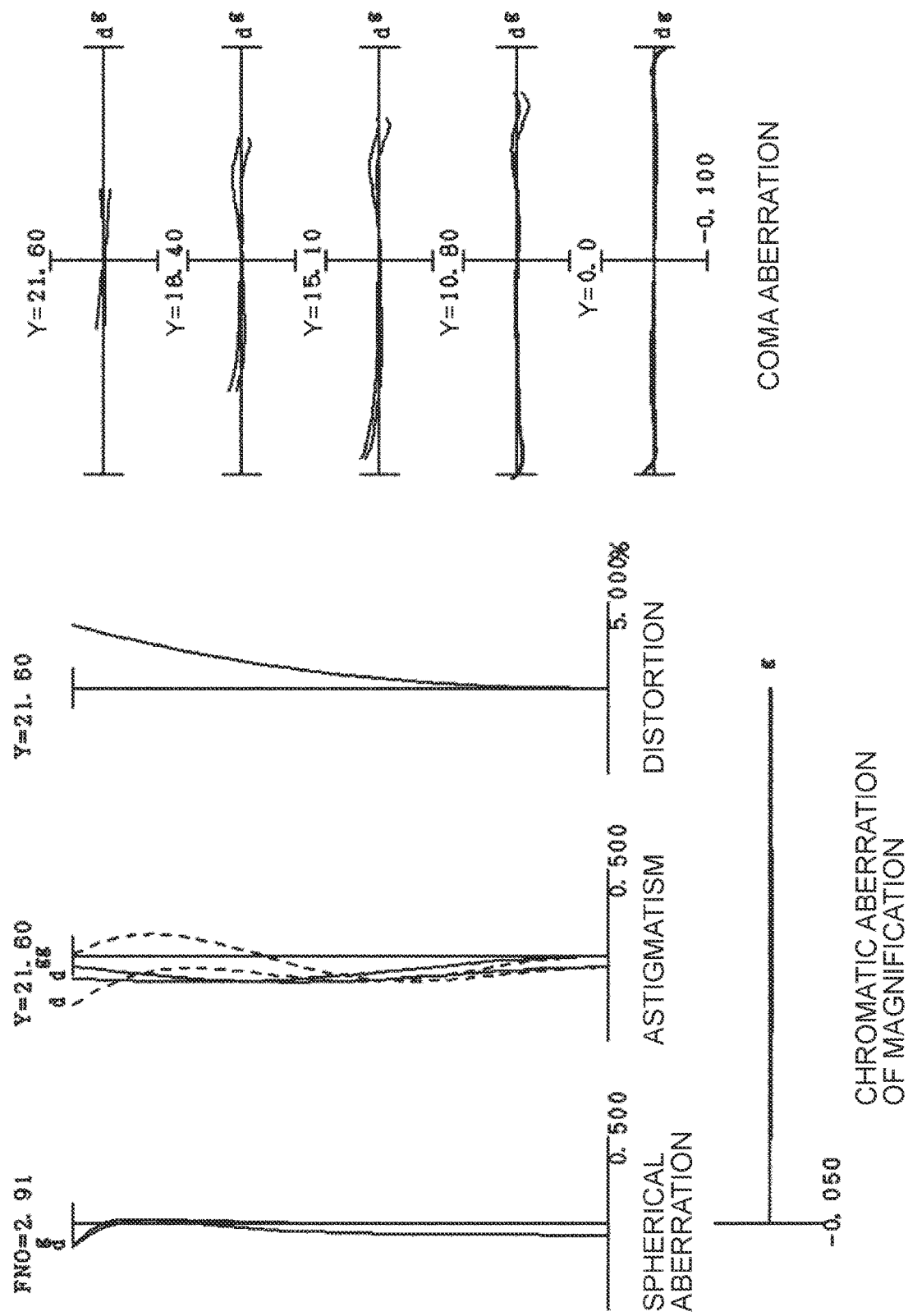

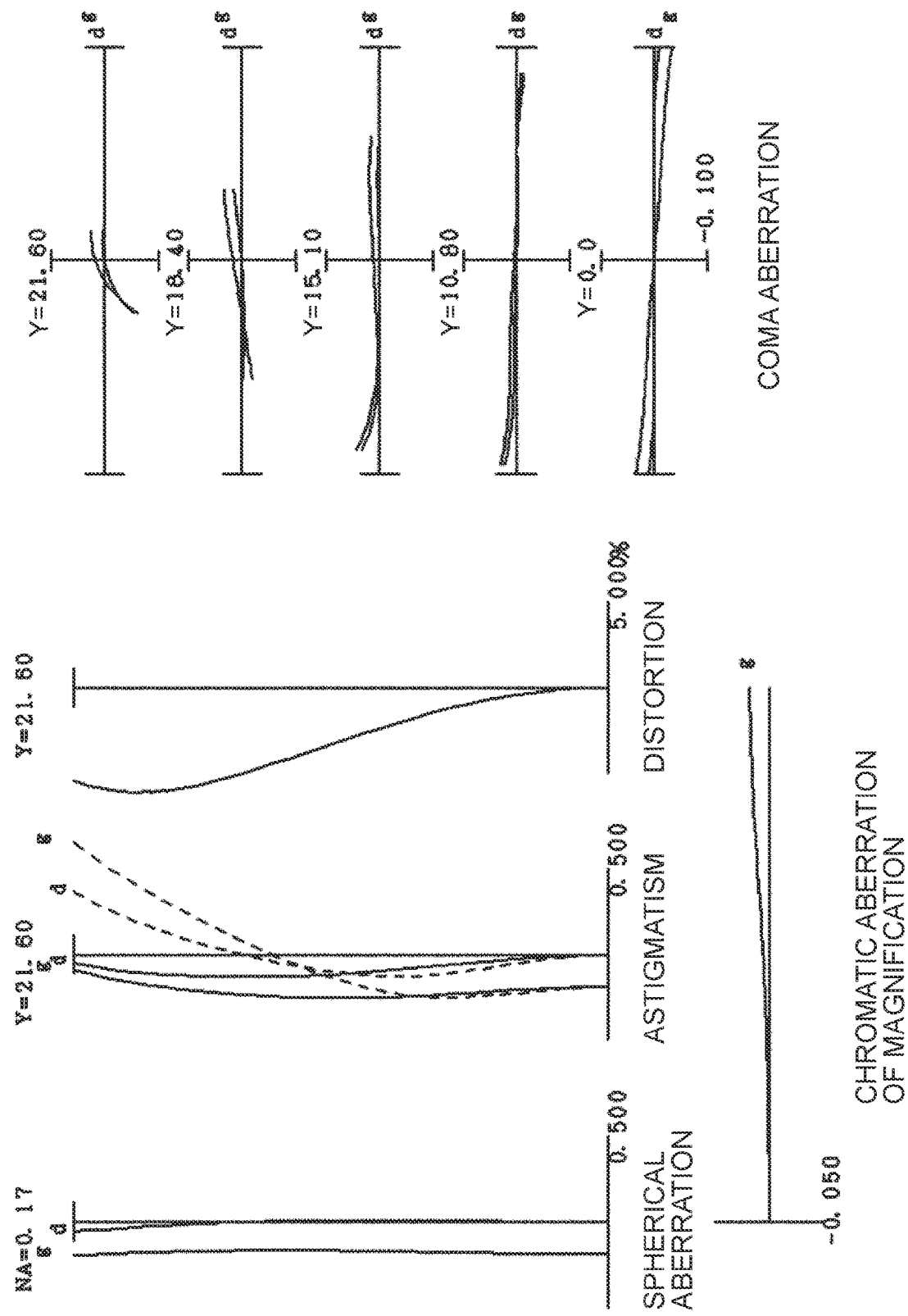

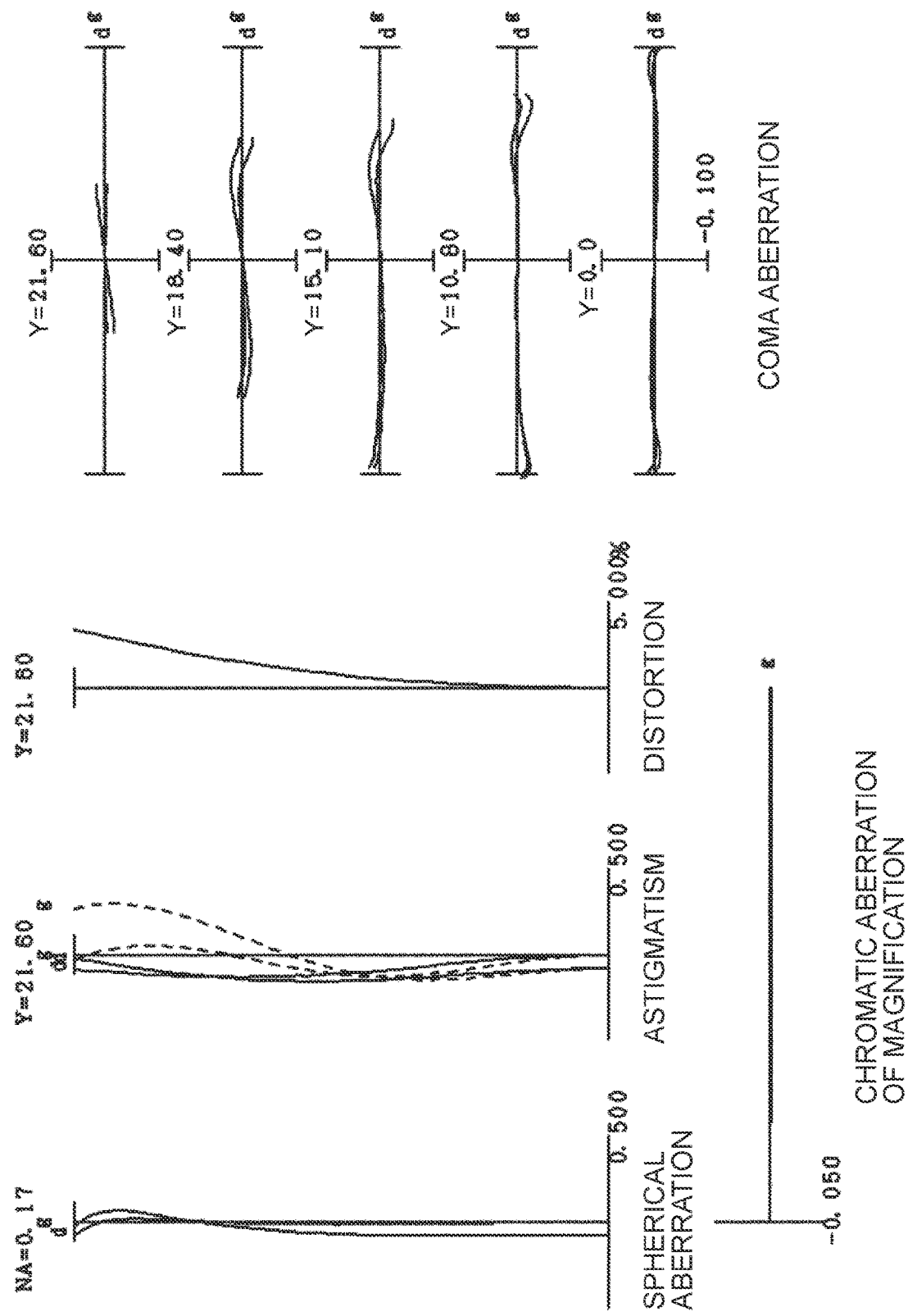

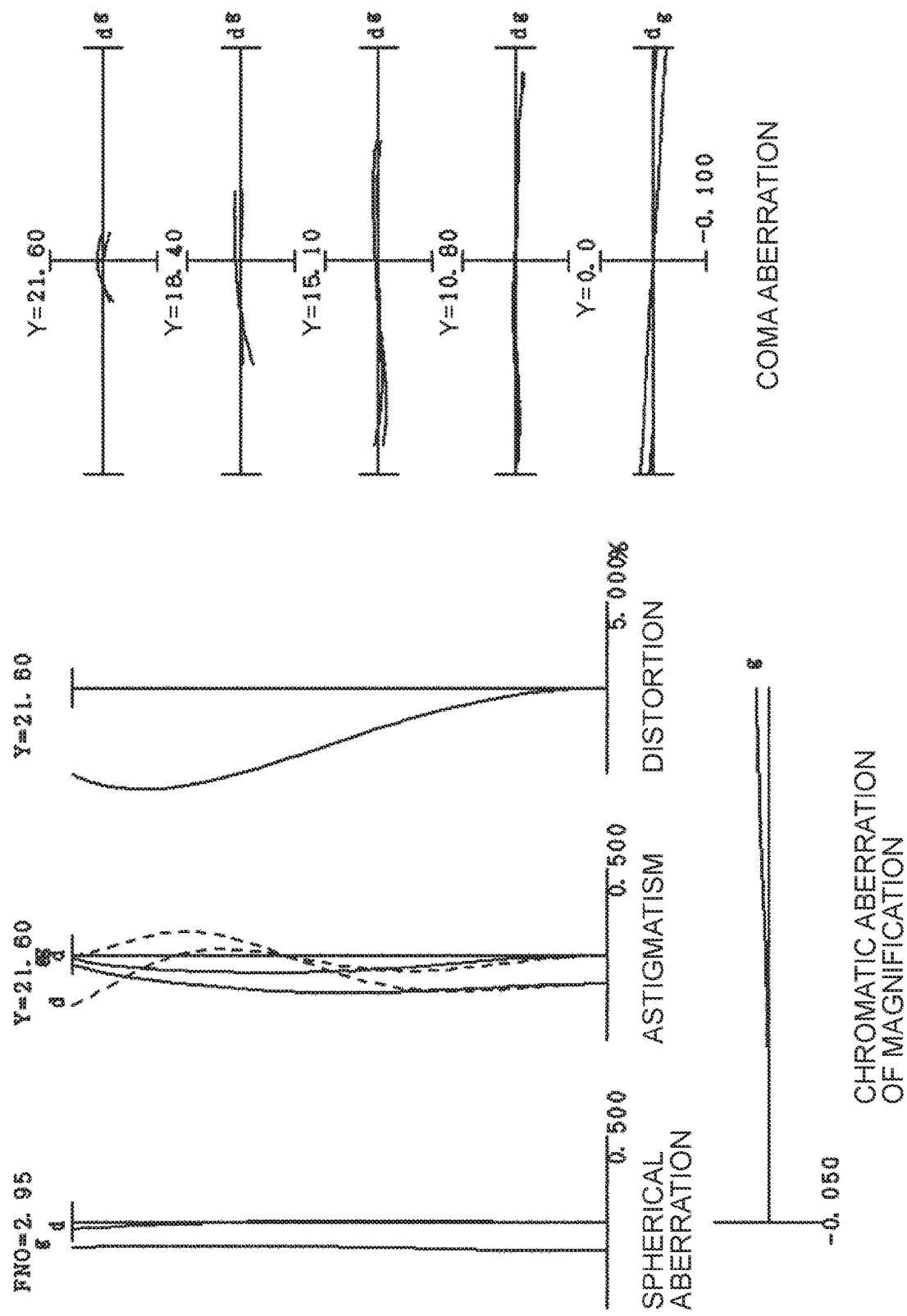

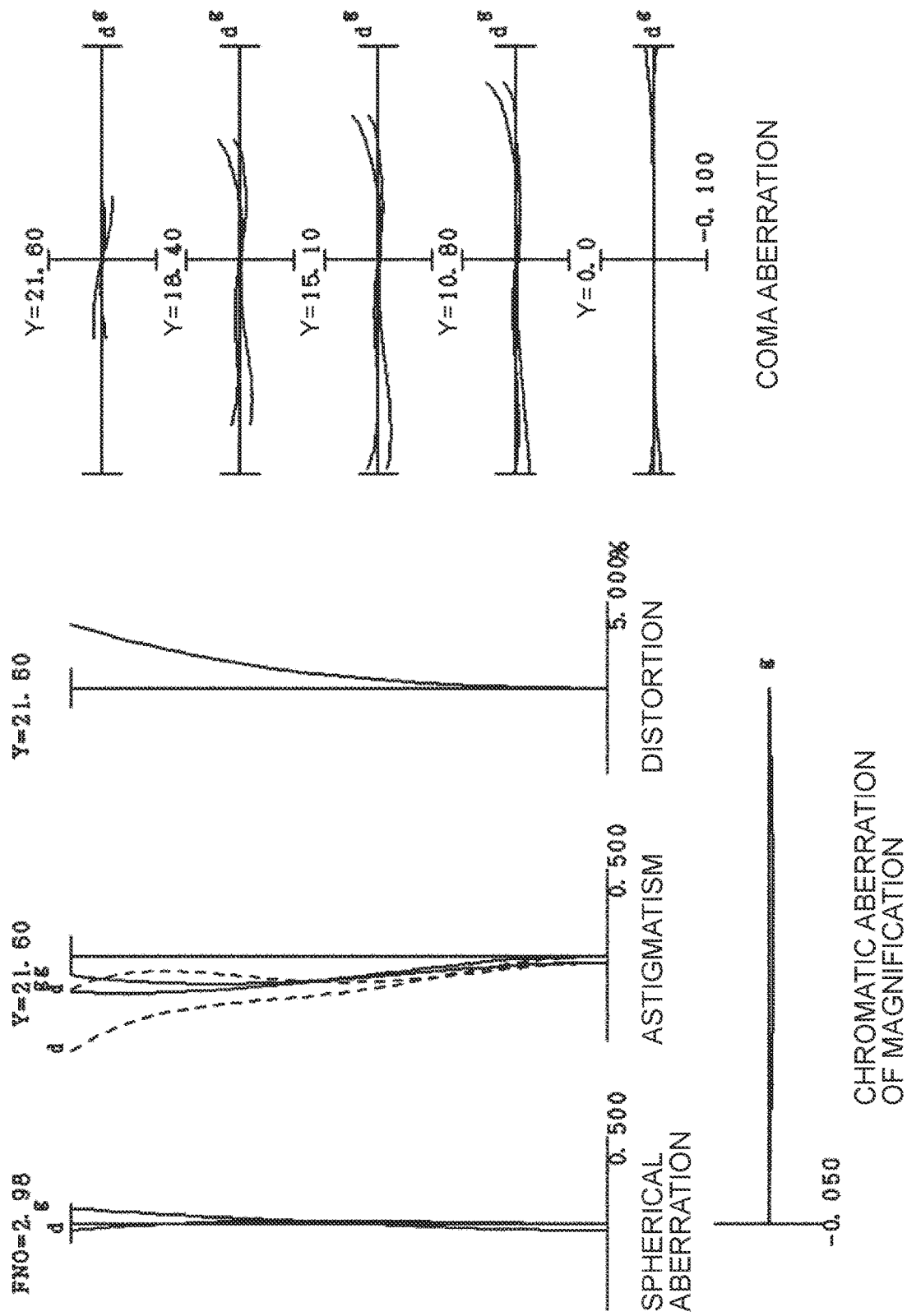

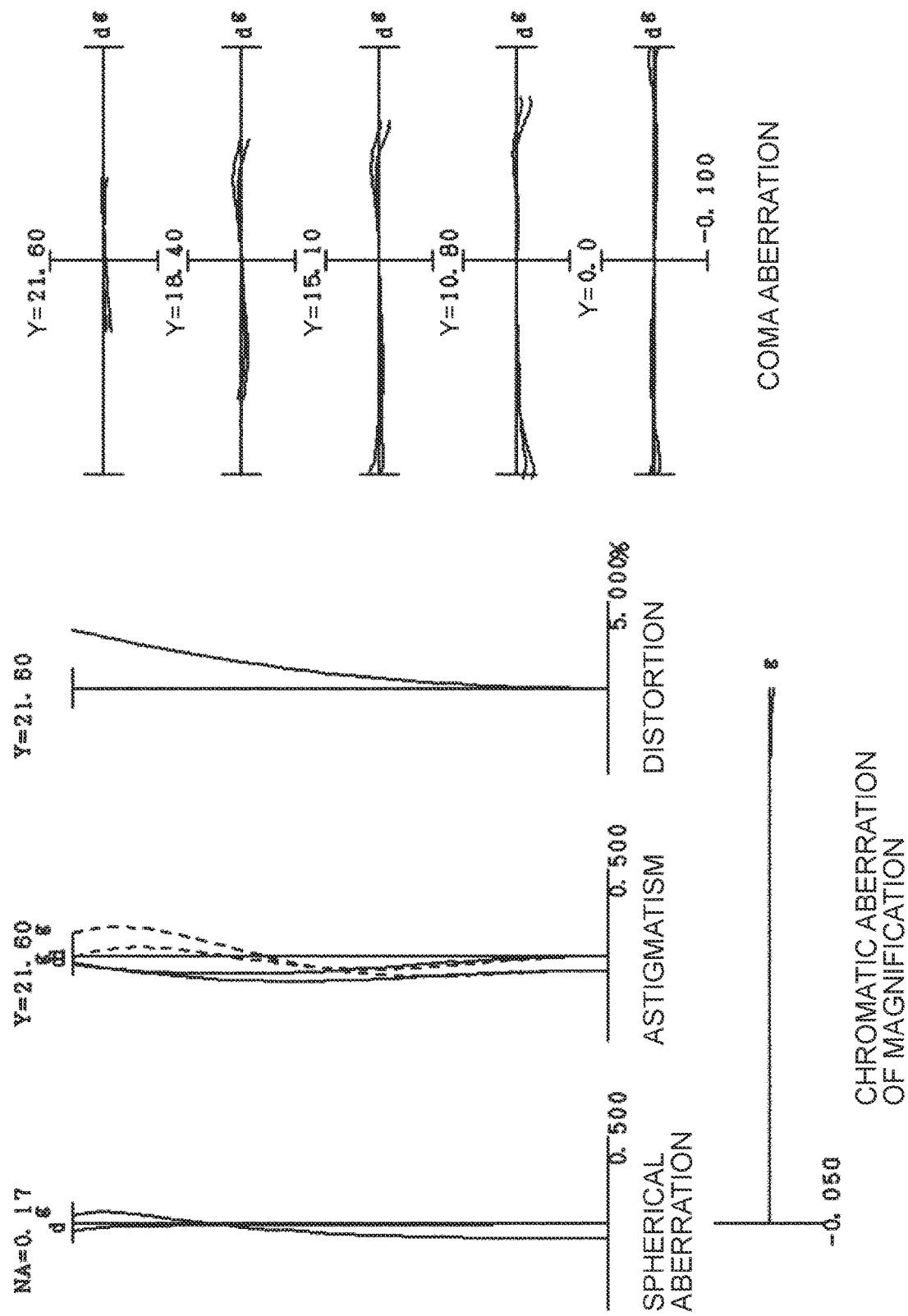

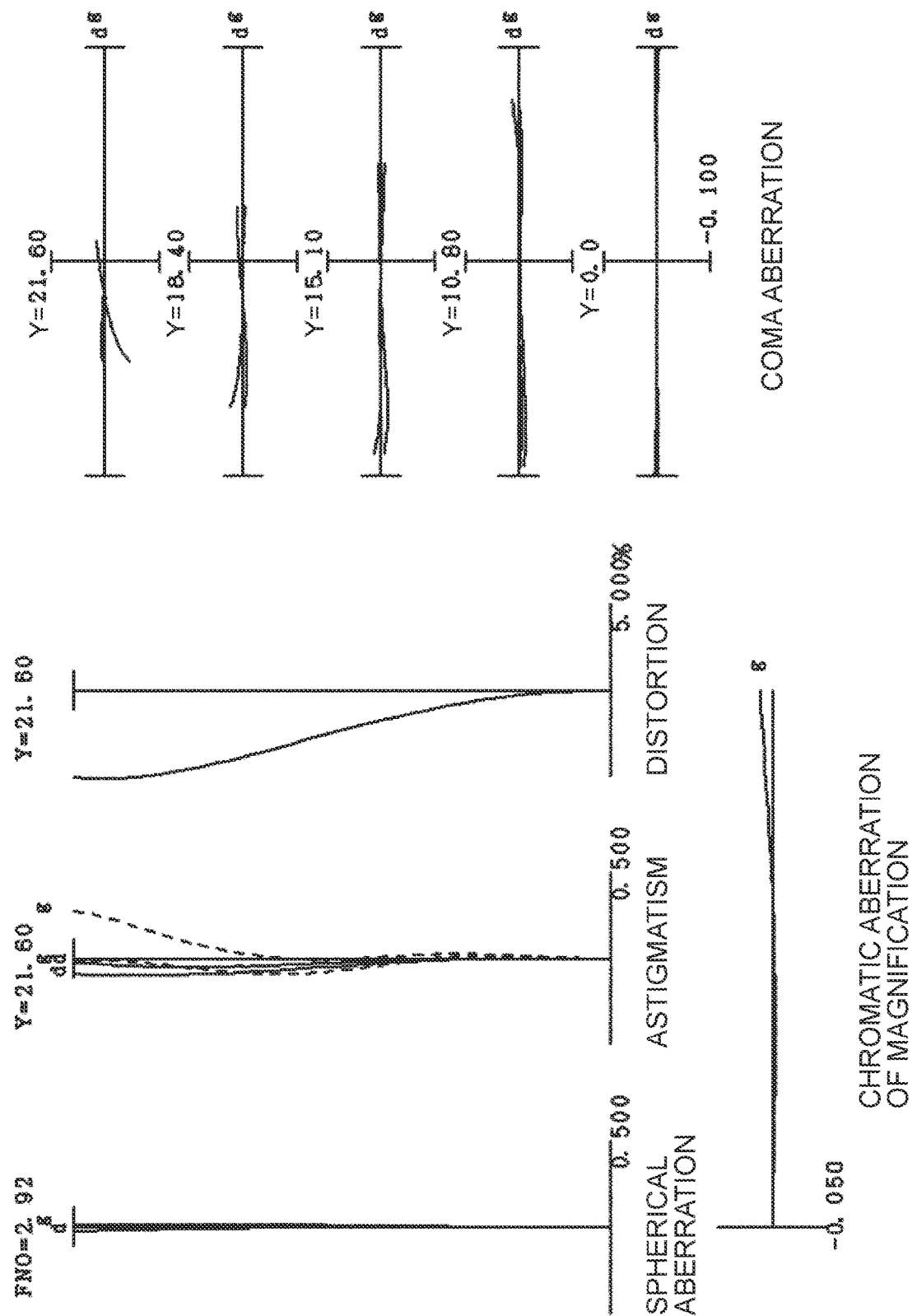

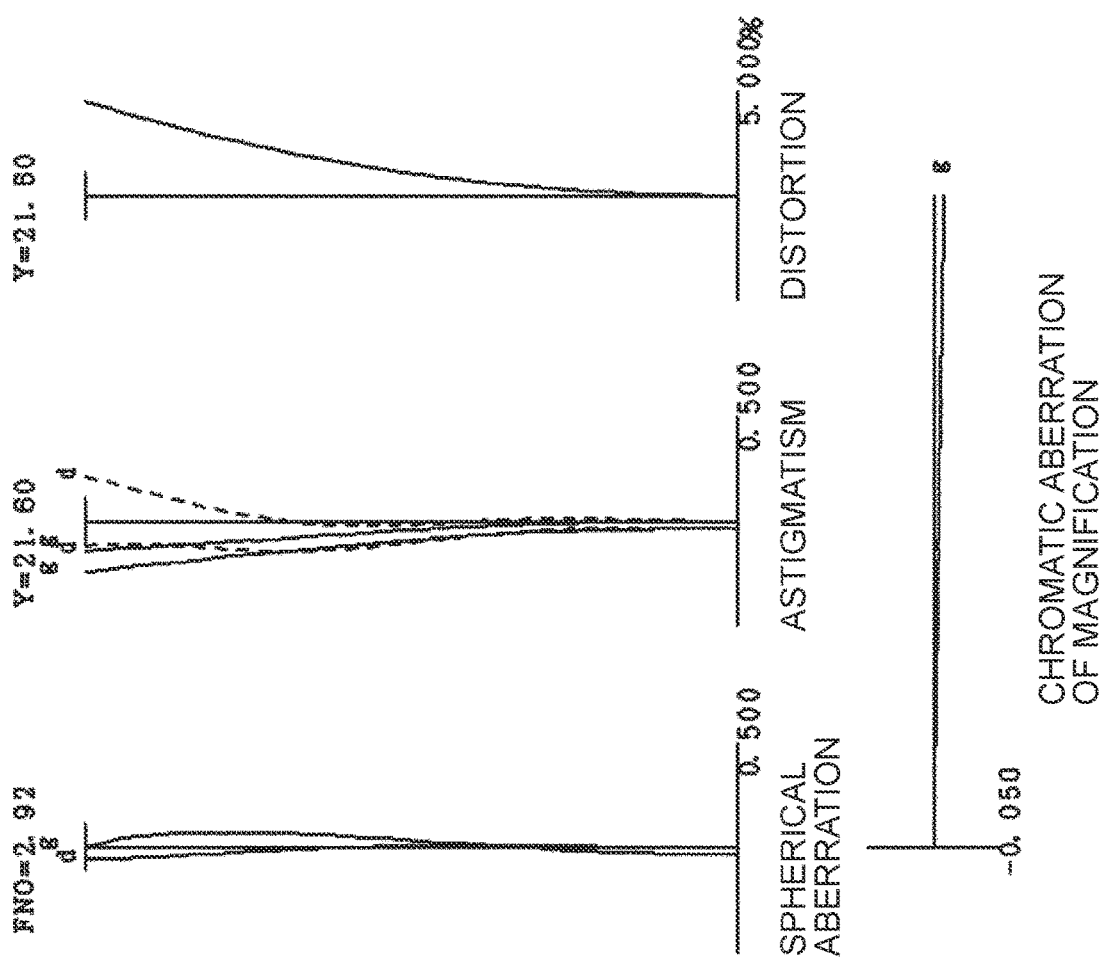

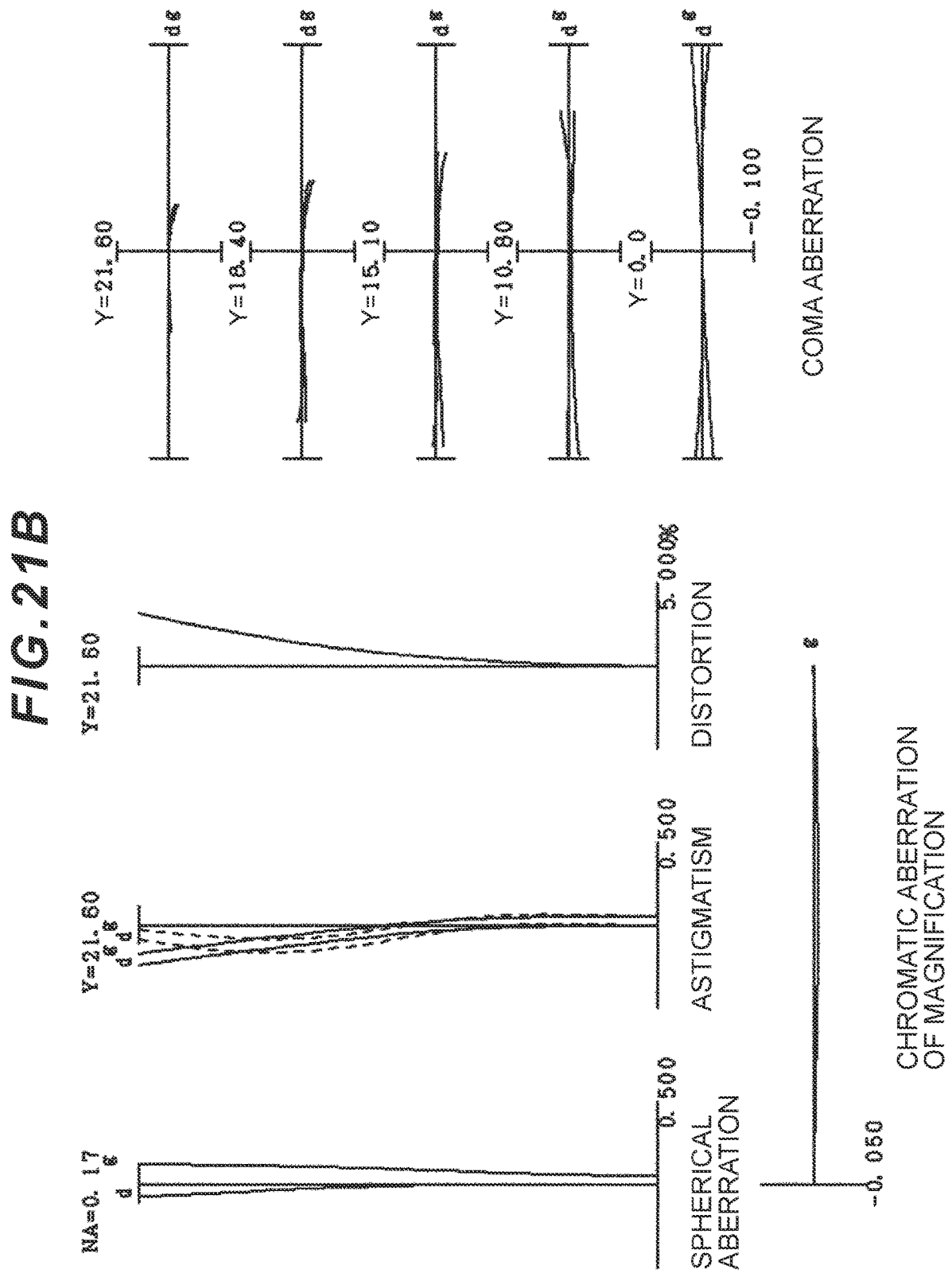

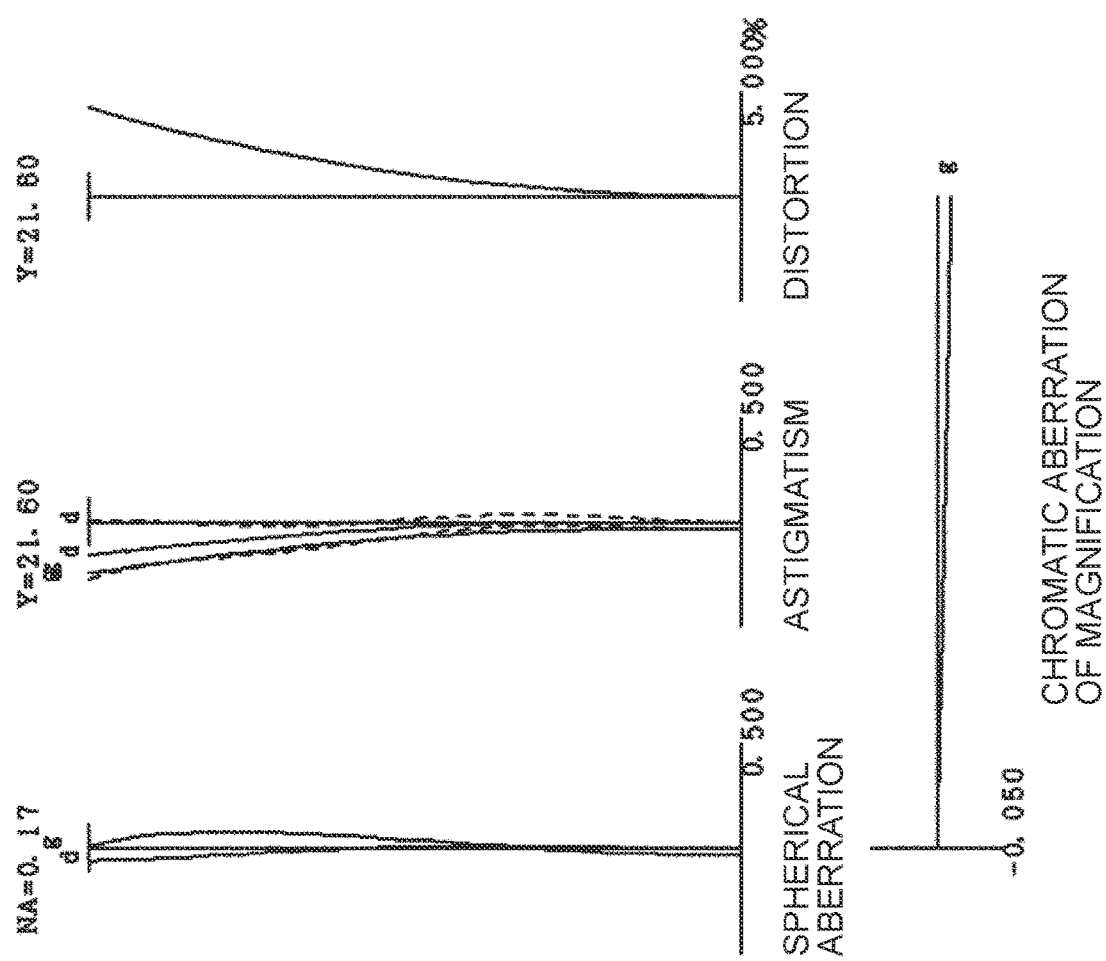

ZOOM OPTICAL SYSTEM, OPTICAL APPARATUS AND METHOD FOR MANUFACTURING THE ZOOM OPTICAL SYSTEM

TECHNICAL FIELD

The present invention relates to a zoom optical system, an optical apparatus including the same, and a method for manufacturing the zoom optical system.

TECHNICAL BACKGROUND

Conventionally, zoom optical systems suitable for photographic cameras, electronic still cameras, video cameras and the like have been proposed (for example, see Patent literature 1). The zoom optical systems are required to suppress variation in aberration upon zooming or focusing.

PRIOR ARTS LIST

Patent Document

Patent literature 1: Japanese Laid-Open Patent Publication No. 2013-160944(A)

SUMMARY OF THE INVENTION

A zoom optical system according to a first aspect comprises, in order from an object: a first lens group having a positive refractive power; a second lens group having a negative refractive power; a first intermediate lens group having a positive refractive power; a second intermediate lens group having a positive or negative refractive power; and a last lens group having a positive or negative refractive power, wherein upon zooming, distances between adjacent lens groups change, the second intermediate lens group includes a focusing lens group that moves upon focusing, the first lens group includes, in order from the object: a 1-1st lens having a negative refractive power; and a 1-2nd lens having a positive refractive power, and the zoom optical system satisfies a following conditional expression, $$0.010 < dP1/f1 < 0.075$$

where dP1: a sum of a center thickness of the 1-1st lens and a center thickness of the 1-2nd lens, and f1: a focal length of the first lens group.

An optical apparatus according to a second aspect comprises the zoom optical system mounted thereon.

A method for manufacturing a zoom optical system according to a third aspect is a method for manufacturing a zoom optical system that comprises, in order from an object: a first lens group having a positive refractive power; a second lens group having a negative refractive power; a first intermediate lens group having a positive refractive power; a second intermediate lens group having a positive or negative refractive power; and a last lens group having a positive or negative refractive power, wherein upon zooming, distances between adjacent lens groups change, the second intermediate lens group includes a focusing lens group that moves upon focusing, the first lens group includes, in order from the object: a 1-1st lens having a negative refractive power; and a 1-2nd lens having a positive refractive power, and the method arranges each lens in a lens barrel such that the zoom optical system satisfies a following conditional expression, $$0.010 < dP1/f1 < 0.075$$

where dP1: a sum of a center thickness of the 1-1st lens and a center thickness of the 1-2nd lens, and f1: a focal length of the first lens group.

BRIEF DESCRIPTION OF THE DRAWINGS

FIGS. 2A, 2B and 2C are graphs respectively showing various aberrations of the zoom optical system according to the first example upon focusing on infinity in a wide-angle end state, an intermediate focal length state and a telephoto end state;

FIGS. 3A, 3B and 3C are graphs respectively showing various aberrations of the zoom optical system according to the first example upon focusing on a short-distance object in the wide-angle end state, the intermediate focal length state and the telephoto end state;

FIGS. 5A, 5B and 5C are graphs respectively showing various aberrations of the zoom optical system according to the second example upon focusing on infinity in the wide-angle end state, the intermediate focal length state and the telephoto end state;

FIGS. 6A, 6B and 6C are graphs respectively showing various aberrations of the zoom optical system according to the second example upon focusing on a short-distance object in the wide-angle end state, the intermediate focal length state and the telephoto end state;

FIGS. 8A, 8B and 8C are graphs respectively showing various aberrations of the zoom optical system according to the third example upon focusing on infinity in the wide-angle end state, the intermediate focal length state and the telephoto end state;

FIGS. 9A, 9B and 9C are graphs respectively showing various aberrations of the zoom optical system according to the third example upon focusing on a short-distance object in the wide-angle end state, the intermediate focal length state and the telephoto end state;

FIG. 10 is a lens configuration diagram of a zoom optical system according to a fourth example;

FIGS. 11A, 11B and 11C are graphs respectively showing various aberrations of the zoom optical system according to the fourth example upon focusing on infinity in the wide-angle end state, the intermediate focal length state and the telephoto end state;

FIGS. 12A, 12B and 12C are graphs respectively showing various aberrations of the zoom optical system according to the fourth example upon focusing on a short-distance object in the wide-angle end state, the intermediate focal length state and the telephoto end state;

FIGS. 14A, 14B and 14C are graphs respectively showing various aberrations of the zoom optical system according to the fifth example upon focusing on infinity in the wide-angle end state, the intermediate focal length state and the telephoto end state;

FIGS. 15A, 15B and 15C are graphs respectively showing various aberrations of the zoom optical system according to the fifth example upon focusing on a short-distance object in the wide-angle end state, the intermediate focal length state and the telephoto end state;

FIGS. 17A, 17B and 17C are graphs respectively showing various aberrations of the zoom optical system according to the sixth example upon focusing on infinity in the wide-angle end state, the intermediate focal length state and the telephoto end state;

FIGS. 18A, 18B and 18C are graphs respectively showing various aberrations of the zoom optical system according to the sixth example upon focusing on a short-distance object in the wide-angle end state, the intermediate focal length state and the telephoto end state;

FIGS. 20A, 20B and 20C are graphs respectively showing various aberrations of the zoom optical system according to the seventh example upon focusing on infinity in the wide-angle end state, the intermediate focal length state and the telephoto end state;

FIGS. 21A, 21B and 21C are graphs respectively showing various aberrations of the zoom optical system according to the seventh example upon focusing on a short-distance object in the wide-angle end state, the intermediate focal length state and the telephoto end state;

DESCRIPTION OF THE EMBODIMENTS

Figure 22:
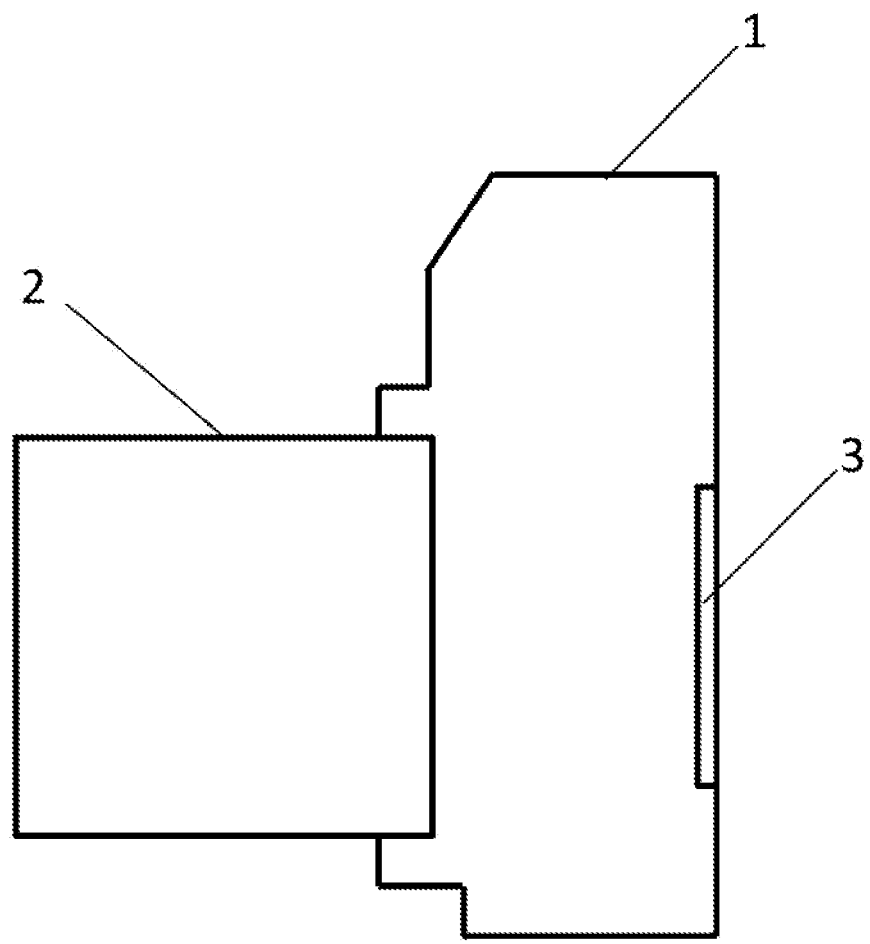
FIG. 22 shows a configuration of a camera that comprises a zoom optical system according to this embodiment.

Hereinafter, a zoom optical system and an optical apparatus according to this embodiment are described with reference to the drawings. First, a camera (optical apparatus) that comprises the zoom optical system according to this embodiment is described with reference to FIG. 22. As shown in FIG. 22, the camera 1 is a digital camera that comprises the zoom optical system according to this embodiment as a photographing lens 2. In the camera 1, light from an object (photographic subject), not shown, is collected by the photographing lens 2, and reaches an image pickup element 3. Accordingly, the light from the photographic subject is captured by the image pickup element 3, and is recorded as a photographic subject image in a memory, not shown. A photographer can thus take an image of the photographic subject through the camera 1. Note that this camera may be a mirrorless camera, or a single-lens reflex type camera including a quick return mirror.

Figure 1:
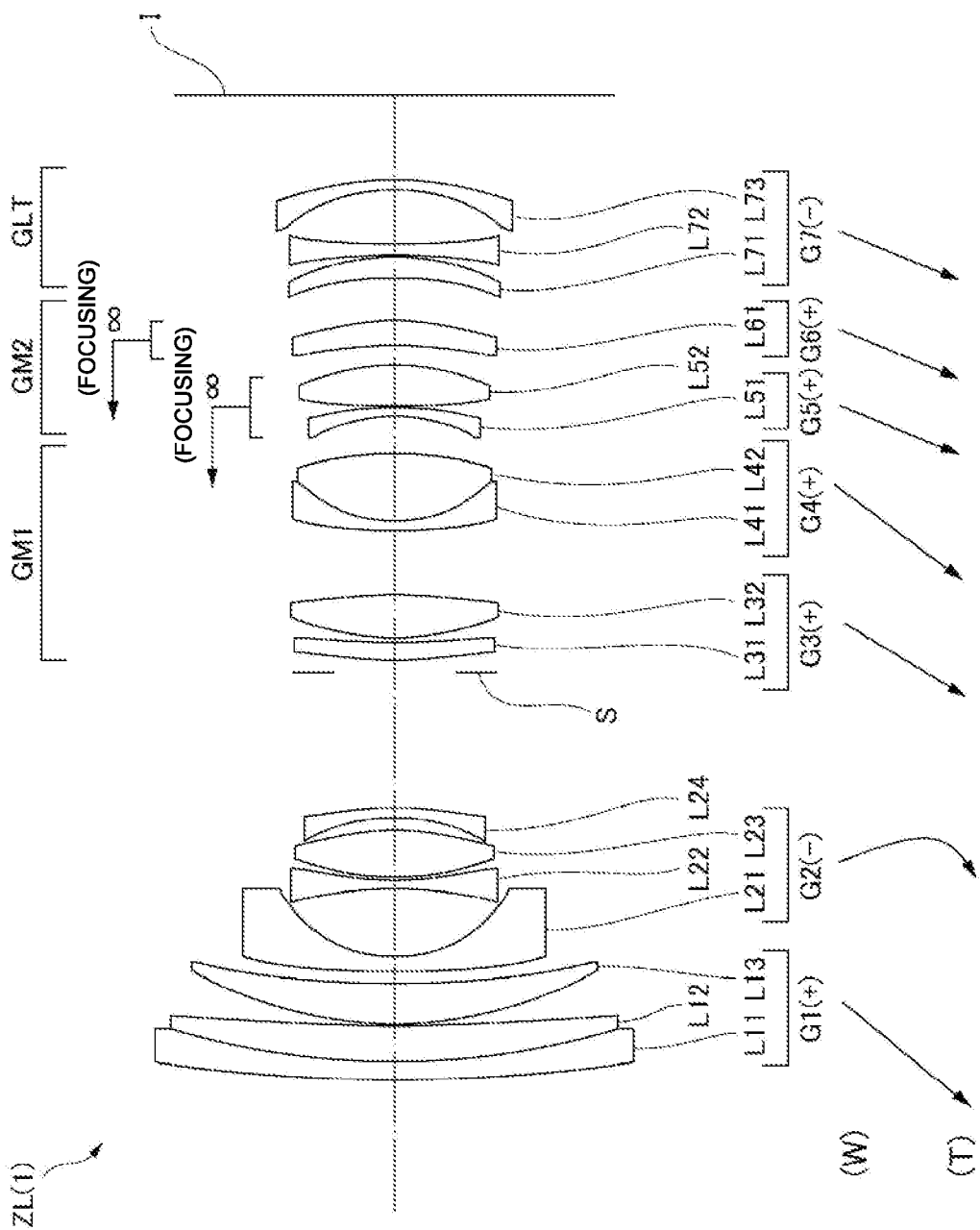
FIG. 1 is a lens configuration diagram of a zoom optical system according to a first example.

Next, a zoom optical system (photographing lens) according to this embodiment is described. As shown in FIG. 1, a zoom optical system ZL(1) that is an example of a zoom optical system (zoom lens) ZL according to this embodiment comprises, in order from an object: a first lens group G1 having a positive refractive power; a second lens group G2 having a negative refractive power; a first intermediate lens group G1 having a positive refractive power; a second intermediate lens group GM2 having a positive or negative refractive power; and a last lens group GLT having a positive or negative refractive power, wherein upon zooming, distances between adjacent lens groups change. The second intermediate lens group GH2 includes a focusing lens group that moves upon focusing. The first lens group G1 includes, in order from the object: a 1-1st lens having a negative refractive power; and a 1-2nd lens having a positive refractive power.

The zoom optical system ZL according to this embodiment includes at least five lens groups. The distances between lens groups change upon zooming. According to this embodiment, the variation in various aberrations upon zooming from a wide-angle end state to a telephoto end state can be suppressed. By disposing the focusing lens groups in the second intermediate lens group Gd2, the focusing lens groups can be reduced in size and weight, and high-speed and highly silent autofocus can be achieved without increasing the size of the lens barrel. The first lens group G1 thus includes, in order from the object, the 1-1st lens having the negative refractive power, and the 1-2nd lens having the positive refractive power. Accordingly, the coma aberration in the wide-angle end state can be favorably corrected.

Figure 4:
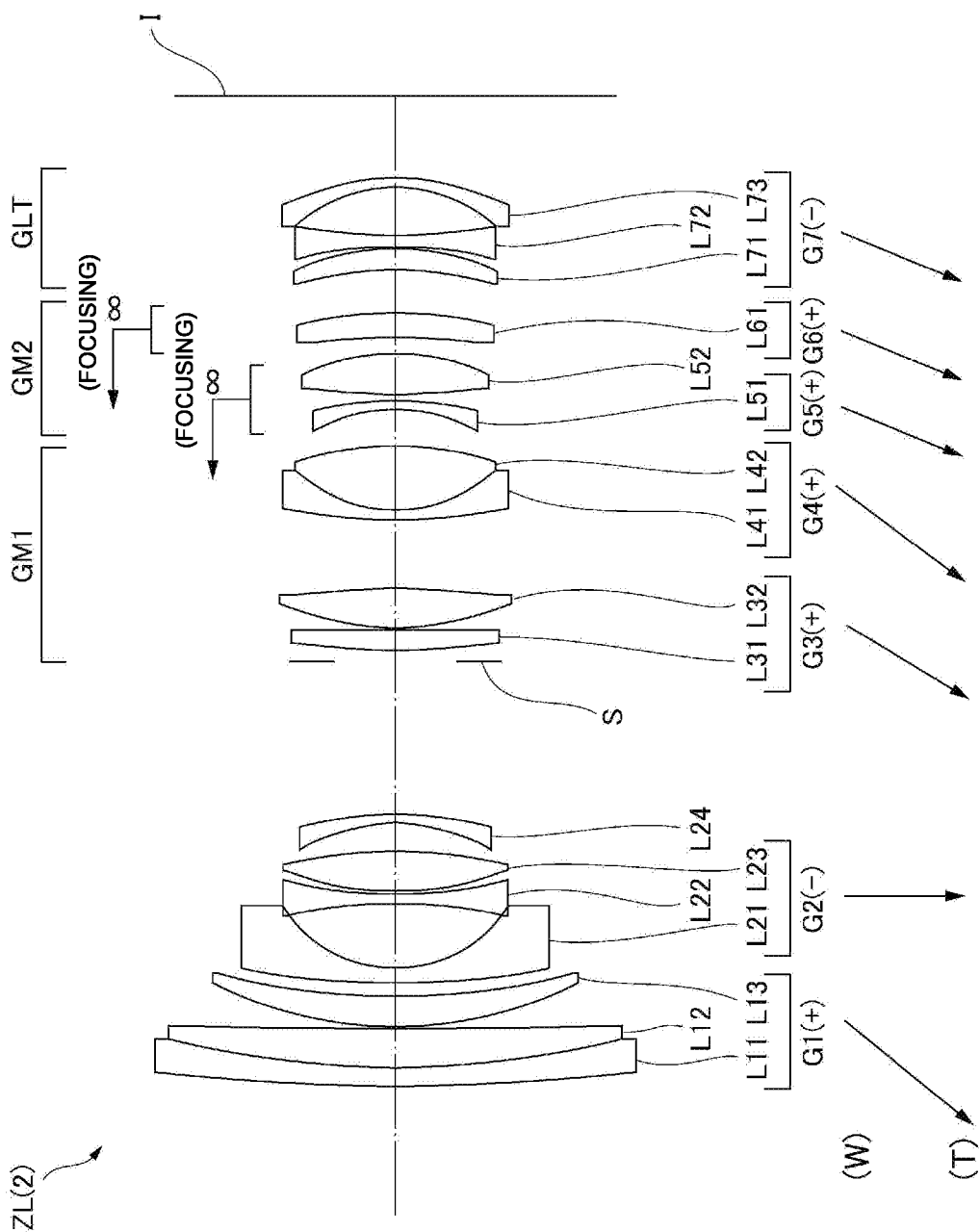
FIG. 4 is a lens configuration diagram of a zoom optical system according to a second example.
Figure 7:
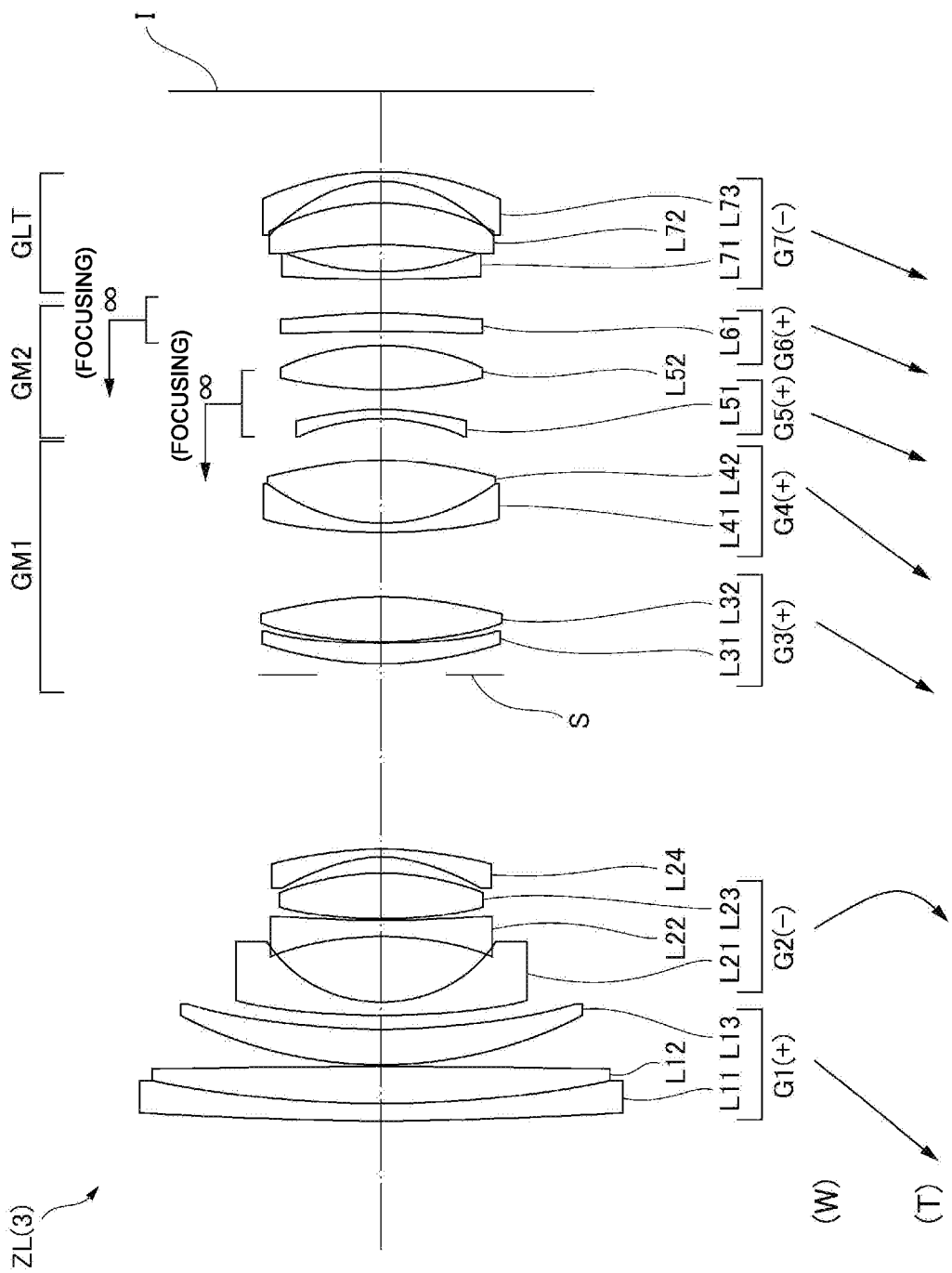
FIG. 7 is a lens configuration diagram of a zoom optical system according to a third example.

The zoom optical system ZL according to this embodiment may be a zoom optical system ZL(2) shown in FIG. 4, a zoom optical system ZL(3) shown in FIG. 7, or a zoom optical system ZL(4) shown in FIG. 10. The zoom optical system ZL according to this embodiment may be a zoom optical system ZL(5) shown in FIG. 13, a zoom optical system ZL(6) shown in FIG. 16, or a zoom optical system ZL(7) shown in FIG. 19.

In the configuration described above, the zoom optical system ZL according to this embodiment satisfies a following conditional expression (1).

$$0.010 < dP1/f1 < 0.075 \quad (1)$$

where dP1: a sum of a center thickness of the 1-1st lens and a center thickness of the 1-2nd lens, and f1: a focal length of the first lens group G1.

The conditional expression (1) defines the ratio between the sum of the center thickness of the 1-1st lens and the center thickness of the 1-2nd lens, and the focal length of the first lens group G1. By satisfying the conditional expression (1), the variation in various aberrations including the spherical aberration upon zooming from the wide-angle end state to the telephoto end state can be suppressed.

If the corresponding value of the conditional expression (1) exceeds the upper limit value, the refractive power of the first lens group G1 becomes too strong. Accordingly, it is difficult to suppress the variation in various aberrations including the spherical aberration upon zooming. By setting the upper limit value of the conditional expression (1) to 0.074, the advantageous effects of this embodiment can be more secured. To further secure the advantageous effects of this embodiment, the upper limit value of the conditional expression (1) may be set to 0.072, 0.070, 0.069, 0.068, 0.067, and further to 0.066.

If the corresponding value of the conditional expression (1) falls below the lower limit value, the refractive power of the first lens group G1 becomes too weak. Accordingly, the lens barrel increases in size. Furthermore, it is difficult to suppress variation in various aberrations including the spherical aberration upon zooming. By setting the lower limit value of the conditional expression (1) to 0.015, the advantageous effects of this embodiment can be more secured. To further secure the advantageous effects of this embodiment, the lower limit value of the conditional expression (1) may be set to 0.020, 0.025, 0.030, 0.033, 0.035, 0.038, and further to 0.040.

Preferably, the zoom optical system ZL according to this embodiment satisfies a following conditional expression (2).

$$2.00 < |fP1|/f1 < 14.00 \quad (2)$$

where fP1: a combined focal length of the 1-1st lens and the 1-2nd lens.

The conditional expression (2) defines the ratio between the combined focal length of the 1-1st lens and the 1-2nd lens and the focal length of the first lens group G1. By satisfying the conditional expression (2), the variation in various aberrations including the spherical aberration upon zooming from the wide-angle end state to the telephoto end state can be suppressed.

If the corresponding value of the conditional expression (2) exceeds the upper limit value, the refractive power of the first lens group G1 becomes too strong. Accordingly, it is difficult to suppress the variation in various aberrations including the spherical aberration upon zooming. By setting the upper limit value of the conditional expression (2) to 13.50, the advantageous effects of this embodiment can be more secured. To further secure the advantageous effects of this embodiment, the upper limit value of the conditional expression (2) may be set to 13.30, 13.00, 12.80, 12.50, 12.30, and further to 12.00.

If the corresponding value of the conditional expression (2) falls below the lower limit value, the combined refractive power of the 1-1st lens and the 1-2nd lens becomes too strong. Accordingly, it is difficult to suppress the variation in various aberrations including the spherical aberration upon zooming. By setting the lower limit value of the conditional expression (2) to 2.20, the advantageous effects of this embodiment can be more secured. To further secure the advantageous effects of this embodiment, the lower limit value of the conditional expression (2) may be set to 2.50, 2.80, 3.00, 3.20, 3.50, 3.80, 4.00, 4.10, and further to 4.20.

Preferably, the zoom optical system ZL according to this embodiment satisfies a following conditional expression (3).

$$0.010 < dP12/f1 < 0.058 \quad (3)$$

where dP12: a center thickness of the 1-2nd lens.

The conditional expression (3) defines the ratio between the center thickness of the 1-2nd lens and the focal length of the first lens group G1. By satisfying the conditional expression (3), the variation in various aberrations including the spherical aberration upon zooming from the wide-angle end state to the telephoto end state can be suppressed.

If the corresponding value of the conditional expression (3) exceeds the upper limit value, the refractive power of the first lens group G1 becomes too strong. Accordingly, it is difficult to suppress the variation in various aberrations including the spherical aberration upon zooming. By setting the upper limit value of the conditional expression (3) to 0.056, the advantageous effects of this embodiment can be more secured. To further secure the advantageous effects of this embodiment, the upper limit value of the conditional expression (3) may be set to 0.055, 0.054, 0.053, 0.052, 0.051, 0.050, 0.049, 0.048, 0.047, 0.046, and further to 0.045.

If the corresponding value of the conditional expression (3) falls below the lower limit value, the refractive power of the first lens group G1 becomes too weak. Accordingly, the lens barrel increases in size. Furthermore, it is difficult to suppress variation in various aberrations including the spherical aberration upon zooming. By setting the lower limit value of the conditional expression (3) to 0.012, the advantageous effects of this embodiment can be more secured. To further secure the advantageous effects of this embodiment, the lower limit value of the conditional expression (3) may be set to 0.013, 0.014, 0.015, 0.018, 0.020, 0.021, 0.022, 0.023, and further to 0.024.

Preferably, the zoom optical system ZL according to this embodiment satisfies a following conditional expression (4).

$$1.15 < fP12/f1 < 4.00 \quad (4)$$

where fP12: a focal length of the 1-2nd lens.

The conditional expression (4) defines the ratio between the focal length of the 1-2nd lens and the focal length of the first lens group G1. By satisfying the conditional expression (4), the variation in various aberrations including the spherical aberration upon zooming from the wide-angle end state to the telephoto end state can be suppressed.

If the corresponding value of the conditional expression (4) exceeds the upper limit value, the refractive power of the first lens group G1 becomes too strong. Accordingly, it is difficult to suppress the variation in various aberrations including the spherical aberration upon zooming. By setting the upper limit value of the conditional expression (4) to 3.90, the advantageous effects of this embodiment can be more secured. To further secure the advantageous effects of this embodiment, the upper limit value of the conditional expression (4) may be set to 3.80, 3.70, 3.50, 3.40, 3.30, and further to 3.20.

If the corresponding value of the conditional expression (4) falls below the lower limit value, the refractive power of the 1-2nd lens becomes too strong. Accordingly, it is difficult to suppress the variation in various aberrations including the spherical aberration upon zooming. By setting the lower limit value of the conditional expression (4) to 1.18, the advantageous effects of this embodiment can be more secured. To further secure the advantageous effects of this embodiment, the lower limit value of the conditional expression (4) may be set to 1.20, 1.23, 1.25, 1.26, 1.27, 1.28, 1.29, 1.30, and further to 1.31.

Preferably, the zoom optical system ZL according to this embodiment satisfies a following conditional expression (5).

$$-3.00 < fM2w/fLw < 0 \quad (5)$$

where fM2w: a focal length of the second intermediate lens group Gd2 in a wide-angle end state, and fLw: a focal length of the last lens group GLT in the wide-angle end state.

The conditional expression (5) defines the ratio between the focal length of the second intermediate lens group Gd2 in the wide-angle end state and the focal length of the last lens group GLT in the wide-angle end state. By satisfying the conditional expression (5), the variation in various aberrations including the coma aberration upon zooming from the wide-angle end state to the telephoto end state can be suppressed.

If the corresponding value of the conditional expression (5) exceeds the upper limit value, the positive or negative signs of the focal length of the second intermediate lens group Gd2 and the focal length of the last lens group GLT become the same as each other. Accordingly, it is difficult to suppress the variation in various aberrations including the coma aberration upon zooming. By setting the upper limit value of the conditional expression (5) to −0.05, the advantageous effects of this embodiment can be more secured. To further secure the advantageous effects of this embodiment, the upper limit value of the conditional expression (5) may be set to −0.08, −0.10, −0.12, −0.15, −0.18, −0.20, −0.22, −0.25, −0.28, and further to −0.30.

If the corresponding value of the conditional expression (5) falls below the lower limit value, the refractive power of the last lens group GLT becomes too strong. Accordingly, it is difficult to suppress the variation in various aberrations including the coma aberration upon zooming. By setting the lower limit value of the conditional expression (5) to −2.90, the advantageous effects of this embodiment can be more secured. To further secure the advantageous effects of this embodiment, the lower limit value of the conditional expression (5) may be set to −2.80, −2.70, −2.60, −2.40, −2.20, −2.00, −1.80, −1.60, and further to −1.50.

Preferably, the zoom optical system ZL according to this embodiment satisfies a following conditional expression (6).

$$0.10 < fM1w/fM2w < 2.00 \quad (6)$$

where fM1w: a focal length of the first intermediate lens group GM1 in a wide-angle end state, and fM2w: a focal length of the second intermediate lens group Gd2 in the wide-angle end state.

The conditional expression (6) defines the ratio between the focal length of the first intermediate lens group G41 in the wide-angle end state and the focal length of the second intermediate lens group Gd2 in the wide-angle end state. By satisfying the conditional expression (6), the variation in various aberrations including the spherical aberration upon zooming from the wide-angle end state to the telephoto end state can be suppressed.

If the corresponding value of the conditional expression (6) exceeds the upper limit value, the refractive power of the second intermediate lens group GM2 becomes too strong. Accordingly, it is difficult to suppress the variation in various aberrations including the spherical aberration upon zooming. By setting the upper limit value of the conditional expression (6) to 1.90, the advantageous effects of this embodiment can be more secured. To further secure the advantageous effects of this embodiment, the upper limit value of the conditional expression (6) may be set to 1.80, 1.60, 1.50, 1.45, 1.40, 1.35, 1.30, 1.25, 1.23, and further to 1.20.

If the corresponding value of the conditional expression (6) falls below the lower limit value, the refractive power of the first intermediate lens group H41 becomes too strong. Accordingly, it is difficult to suppress the variation in various aberrations including the spherical aberration upon zooming. By setting the lower limit value of the conditional expression (6) to 0.20, the advantageous effects of this embodiment can be more secured. To further secure the advantageous effects of this embodiment, the lower limit value of the conditional expression (6) may be set to 0.25, 0.30, 0.35, 0.40, 0.43, 0.45, 0.48, 0.50, 0.53, and further to 0.55.

Preferably, the zoom optical system ZL according to this embodiment satisfies a following conditional expression (7).

$$-2.00 < fM1w/fLw < 2.00 \quad (7)$$

where fM1w: a focal length of the first intermediate lens group GM1 in a wide-angle end state, and fLw: a focal length of the last lens group GLT in the wide-angle end state.

The conditional expression (7) defines the ratio between the focal length of the first intermediate lens group G41 in the wide-angle end state and the focal length of the last lens group GLT in the wide-angle end state. By satisfying the conditional expression (7), the variation in various aberrations including the coma aberration upon zooming from the wide-angle end state to the telephoto end state can be suppressed.

If the corresponding value of the conditional expression (7) exceeds the upper limit value, the positive refractive power of the last lens group GLT becomes too strong. Accordingly, it is difficult to suppress the variation in various aberrations including the coma aberration upon zooming. By setting the upper limit value of the conditional expression (7) to 1.80, the advantageous effects of this embodiment can be more secured. To further secure the advantageous effects of this embodiment, the upper limit value of the conditional expression (7) may be set to 1.60, 1.40, 1.20, 1.00, 0.90, 0.80, 0.70, 0.65, 0.60, 0.55, and further to 0.50.

If the corresponding value of the conditional expression (7) falls below the lower limit value, the negative refractive power of the last lens group GLT becomes too strong. Accordingly, it is difficult to suppress the variation in various aberrations including the coma aberration upon zooming. By setting the lower limit value of the conditional expression (7) to −1.80, the advantageous effects of this embodiment can be more secured. To further secure the advantageous effects of this embodiment, the lower limit value of the conditional expression (7) may be set to −1.60, −1.50, −1.40, −1.30, −1.20, −1.10, −1.00, −0.95, −0.90, and further to −0.85.

Preferably, the zoom optical system ZL according to this embodiment satisfies a following conditional expression (8).

$$3.40 < f1/(-f2) < 7.00 \quad (8)$$

where f2: a focal length of the second lens group G2.

The conditional expression (8) defines the ratio between the focal length of the first lens group G1 and the focal length of the second lens group G2. By satisfying the conditional expression (8), the variation in various aberrations including the spherical aberration upon zooming from the wide-angle end state to the telephoto end state can be suppressed.

If the corresponding value of the conditional expression (8) exceeds the upper limit value, the refractive power of the second lens group G2 becomes too strong. Accordingly, it is difficult to suppress the variation in various aberrations including the spherical aberration upon zooming. By setting the upper limit value of the conditional expression (8) to 6.80, the advantageous effects of this embodiment can be more secured. To further secure the advantageous effects of this embodiment, the upper limit value of the conditional expression (8) may be set to 6.60, 6.50, 6.40, 6.30, 6.20, 6.10, 6.00, and further to 5.90.

If the corresponding value of the conditional expression (8) falls below the lower limit value, the refractive power of the first lens group G1 becomes too strong. Accordingly, it is difficult to suppress the variation in various aberrations including the spherical aberration upon zooming. By setting the lower limit value of the conditional expression (8) to 3.70, the advantageous effects of this embodiment can be more secured. To further secure the advantageous effects of this embodiment, the lower limit value of the conditional expression (8) may be set to 4.00, 4.20, 4.40, 4.50, 4.60, 4.80, 4.90, 5.00, 5.10, and further to 5.20.

Preferably, in the zoom optical system ZL according to this embodiment, the focusing lens groups consist of three or less single lenses. Accordingly, the focusing lens groups can be reduced in size and weight.

Preferably, in the zoom optical system ZL according to this embodiment, at least one of the focusing lens groups includes a single lens having a negative refractive power. Accordingly, the variation in various aberrations including the spherical aberration upon focusing from the infinity object to the short-distance object can be suppressed.

Preferably, in the zoom optical system ZL according to this embodiment, the focusing lens group is disposed closer to an image than an aperture stop S. Accordingly, the focusing lens groups can be reduced in size and weight.

Preferably, in the zoom optical system ZL according to this embodiment, at least four lens groups are disposed closer to an image than an aperture stop S. Accordingly, the variation in various aberrations including the spherical aberration upon zooming from the wide-angle end state to the telephoto end state can be suppressed.

Preferably, the zoom optical system ZL according to this embodiment satisfies a following conditional expression (9).

$$0.20<|fF|/ft<4.00 \tag{9}$$

where fF: a focal length of a focusing lens group having a strongest refractive power among the focusing lens groups, and ft: a focal length of the zoom optical system ZL in a telephoto end state.

The conditional expression (9) defines the ratio between the focal length of the focusing lens group having the strongest refractive power among the focusing lens groups, and the focal length of the zoom optical system ZL in the telephoto end state. By satisfying the conditional expression (9), the variation in various aberrations including the spherical aberration upon focusing from the infinity object to the short-distance object can be suppressed without increasing the size of the lens barrel.

If the corresponding value of the conditional expression (9) exceeds the upper limit value, the refractive power of the focusing lens group becomes too weak. Accordingly, the amount of movement of the focusing lens group upon focusing becomes large, thereby increasing the size of the lens barrel. By setting the upper limit value of the conditional expression (9) to 3.80, the advantageous effects of this embodiment can be more secured. To further secure the advantageous effects of this embodiment, the upper limit value of the conditional expression (9) may be set to 3.60, 3.40, 3.20, 3.00, 2.80, 2.60, 2.40, 2.20, and further to 2.00.

If the corresponding value of the conditional expression (9) falls below the lower limit value, the refractive power of the focusing lens group becomes too strong. Accordingly, it is difficult to suppress the variation in various aberrations including the spherical aberration upon focusing. By setting the lower limit value of the conditional expression (9) to 0.23, the advantageous effects of this embodiment can be more secured. To further secure the advantageous effects of this embodiment, the lower limit value of the conditional expression (9) may be set to 0.25, 0.28, 0.30, 0.33, and further to 0.35.

Preferably, in the zoom optical system ZL according to this embodiment, a lens group disposed closest to an image in the first intermediate lens group GM1 includes a cemented lens including a negative lens and a positive lens. Accordingly, the variation in various aberrations including the spherical aberration upon zooming from the wide-angle end state to the telephoto end state can be suppressed.

Preferably, in the zoom optical system ZL according to this embodiment, a lens group disposed closest to an image in the first intermediate lens group GM1 includes a cemented lens including a negative lens and a positive lens, and the zoom optical system ZL satisfies a following conditional expression (10).

$$1.00<nN/nP<1.35 \tag{10}$$

where nN: a refractive index of the negative lens in the cemented lens, and nP: a refractive index of the positive lens in the cemented lens.

The conditional expression (10) defines the ratio between the refractive index of the negative lens and the refractive index of the positive lens in the cemented lens in the lens group disposed closest to the image in the first intermediate lens group GM1. By satisfying the conditional expression (10), the variation in various aberrations including the spherical aberration upon zooming from the wide-angle end state to the telephoto end state can be suppressed.

If the corresponding value of the conditional expression (10) exceeds the upper limit value, the refractive power of the negative lens in the cemented lens becomes too strong. Accordingly, correction of the spherical aberration in the telephoto end state becomes excessive, and it is difficult to suppress the variation in various aberrations including the spherical aberration upon zooming from the wide-angle end state to the telephoto end state. By setting the upper limit value of the conditional expression (10) to 1.33, the advantageous effects of this embodiment can be more secured. To further secure the advantageous effects of this embodiment, the upper limit value of the conditional expression (10) may be set to 1.30, 1.29, 1.28, 1.27, 1.26, and further to 1.25.

If the corresponding value of the conditional expression (10) falls below the lower limit value, the refractive power of the negative lens in the cemented lens becomes too weak. Accordingly, correction of the spherical aberration in the telephoto end state becomes insufficient, and it is difficult to suppress the variation in various aberrations including the spherical aberration upon zooming from the wide-angle end state to the telephoto end state. By setting the lower limit value of the conditional expression (10) to 1.02, the advantageous effects of this embodiment can be more secured. To further secure the advantageous effects of this embodiment, the lower limit value of the conditional expression (10) may be set to 1.05, 1.08, 1.10, 1.11, 1.12, 1.13, 1.14, and 1.15.

Preferably, in the zoom optical system ZL according to this embodiment, a lens group disposed closest to an image in the first intermediate lens group GM1 includes a cemented lens including a negative lens and a positive lens, and the zoom optical system ZL satisfies a following conditional expression (11).

$$0.20<\nu N/\nu P<0.85 \tag{11}$$

where νN: an Abbe number of the negative lens in the cemented lens, and

νP: an Abbe number of the positive lens in the cemented lens.

The conditional expression (11) defines the ratio between the Abbe number of the negative lens and the Abbe number of the positive lens in the cemented lens in the lens group disposed closest to the image in the first intermediate lens group GM1. By satisfying the conditional expression (11), the chromatic aberration can be favorably corrected.

If the corresponding value of the conditional expression (11) exceeds the upper limit value, the Abbe number of the positive lens in the cemented lens becomes small. Accordingly, the chromatic aberration excessively occurs, and it is difficult to correct the chromatic aberration. By setting the upper limit value of the conditional expression (11) to 0.83, the advantageous effects of this embodiment can be more secured. To further secure the advantageous effects of this embodiment, the upper limit value of the conditional expression (11) may be set to 0.80, 0.78, 0.75, 0.73, 0.70, 0.68, 0.65, 0.63, 0.60, 0.58, 0.55, 0.53, and further to 0.50.

If the corresponding value of the conditional expression (11) falls below the lower limit value, the Abbe number of the negative lens in the cemented lens becomes small. Accordingly, correction for the chromatic aberration becomes excessive. By setting the lower limit value of the conditional expression (11) to 0.22, the advantageous effects of this embodiment can be more secured. To further secure the advantageous effects of this embodiment, the lower limit value of the conditional expression (11) may be set to 0.24, 0.25, 0.26, 0.27, 0.28, and further to 0.29.

Preferably, the zoom optical system ZL according to this embodiment satisfies a following conditional expression (12).

$$f1/|fRw|<5.00 \tag{12}$$

where f1: a focal length of the first lens group G1, and
fRw: a combined focal length of lens groups disposed closer to an image than the first intermediate lens group G41 in a wide-angle end state.

The conditional expression (12) defines the ratio between the focal length of the first lens group G1 and the combined focal length of the lens groups disposed closer to the image than the first intermediate lens group G41 in the wide-angle end state. By satisfying the conditional expression (12), the variation in various aberrations including the spherical aberration upon zooming from the wide-angle end state to the telephoto end state can be suppressed.

If the corresponding value of the conditional expression (12) exceeds the upper limit value, the combined refractive power of the lens groups disposed closer to the image than the first intermediate lens group GM1 becomes too strong. Accordingly, it is difficult to suppress the variation in various aberrations including the spherical aberration upon zooming. By setting the upper limit value of the conditional expression (12) to 4.80, the advantageous effects of this embodiment can be more secured. To further secure the advantageous effects of this embodiment, the upper limit value of the conditional expression (12) may be set to 4.60, 4.40, 4.20, 4.00, 3.80, 3.50, 3.00, 2.80, 2.50, 2.30, 2.00, 1.80, and further to 1.50.

Preferably, the zoom optical system ZL according to this embodiment satisfies a following conditional expression (13).

$$2\omega w>75° \tag{13}$$

where ωw: a half angle of view of the zoom optical system ZL in a wide-angle end state.

The conditional expression (13) defines the half angle of view of the zoom optical system ZL in the wide-angle end state. By satisfying the conditional expression (13), the variation in aberrations upon zooming from the wide-angle end state to the telephoto end state can be suppressed while providing a large angle of view. By setting the lower limit value of the conditional expression (13) to 76°, the advantageous effects of this embodiment can be more secured. To further secure the advantageous effects of this embodiment, the lower limit value of the conditional expression (13) may be set to 77°, 78°, 79°, 80°, 81°, and further to 82°.

Preferably, the zoom optical system ZL according to this embodiment satisfies a following conditional expression (14).

$$0.10<BFw/fw<1.00 \tag{14}$$

where BFw: a back focus of the zoom optical system ZL in a wide-angle end state, and
fw: a focal length of the zoom optical system ZL in the wide-angle end state.

The conditional expression (14) defines the ratio between the back focus of the zoom optical system ZL in the wide-angle end state, and the focal length of the zoom optical system ZL in the wide-angle end state. By satisfying the conditional expression (14), the various aberrations including the coma aberration in the wide-angle end state can be favorably corrected.

If the corresponding value of the conditional expression (14) exceeds the upper limit value, the back focus becomes too large with respect to the focal length of the zoom optical system ZL in the wide-angle end state. Accordingly, it is difficult to correct the various aberrations including the coma aberration in the wide-angle end state. By setting the upper limit value of the conditional expression (14) to 0.95, the advantageous effects of this embodiment can be more secured. To further secure the advantageous effects of this embodiment, the upper limit value of the conditional expression (14) may be set to 0.90, 0.85, 0.80, 0.78, 0.75, 0.73, 0.70, 0.68, and further to 0.65.

If the corresponding value of the conditional expression (14) falls below the lower limit value, the back focus becomes too small with respect to the focal length of the zoom optical system ZL in the wide-angle end state. Accordingly, it is difficult to correct the various aberrations including the coma aberration in the wide-angle end state. Furthermore, it is difficult to arrange the mechanism member of the lens barrel. By setting the lower limit value of the conditional expression (14) to 0.15, the advantageous effects of this embodiment can be more secured. To further secure the advantageous effects of this embodiment, the lower limit value of the conditional expression (14) may be set to 0.20, 0.25, 0.30, 0.35, 0.37, 0.38, 0.40, 0.42, 0.44, and further to 0.45.

Preferably, in the zoom optical system ZL according to this embodiment, in a case where the focusing lens group has a positive refractive power, the zoom optical system ZL satisfies a following conditional expression (15).

$$0.00<(rR2+rR1)/(rR2-rR1)<8.00 \tag{15}$$

where rR1: a radius of curvature of an object-side lens surface of a lens disposed closest to an image in the zoom optical system ZL, and
rR2: a radius of curvature of an image-side lens surface of the lens disposed closest to the image in the zoom optical system ZL.

The conditional expression (15) defines the shape factor of the lens disposed closest to the image in the zoom optical system ZL. By satisfying the conditional expression (15), the variation in various aberrations including the spherical aberration upon zooming from the wide-angle end state to the telephoto end state can be suppressed.

If the corresponding value of the conditional expression (15) exceeds the upper limit value, the correction power for the coma aberration of the lens disposed closest to the image in the zoom optical system ZL is insufficient. Accordingly, it is difficult to suppress the variation in various aberrations upon zooming. By setting the upper limit value of the conditional expression (15) to 7.50, the advantageous effects of this embodiment can be more secured. To further secure the advantageous effects of this embodiment, the upper limit value of the conditional expression (15) may be set to 7.00, 6.80, 6.50, 6.30, 6.00, 5.80, 5.50, 5.30, and further to 5.00.

If the corresponding value of the conditional expression (15) falls below the lower limit value, the correction power for the coma aberration of the lens disposed closest to the image in the zoom optical system ZL is insufficient. Accordingly, it is difficult to suppress the variation in various aberrations upon zooming. By setting the lower limit value of the conditional expression (15) to 0.10, the advantageous effects of this embodiment can be more secured. To further secure the advantageous effects of this embodiment, the lower limit value of the conditional expression (15) may be set to 0.50, 0.80, 1.00, 1.20, 1.50, 1.80, 2.00, 2.20, and further to 2.50.

Preferably, in the zoom optical system ZL according to this embodiment, in a case where the focusing lens group has a negative refractive power, the zoom optical system ZL satisfies a following conditional expression (16).

$$-4.00<(rR2+rR1)/(rR2-rR1)<4.00 \quad (16)$$

where rR1: a radius of curvature of an object-side lens surface of a lens disposed closest to an image in the zoom optical system ZL, and rR2: a radius of curvature of an image-side lens surface of the lens disposed closest to the image in the zoom optical system ZL.

The conditional expression (16) defines the shape factor of the lens disposed closest to the image in the zoom optical system ZL. By satisfying the conditional expression (16), the variation in various aberrations including the spherical aberration upon zooming from the wide-angle end state to the telephoto end state can be suppressed.

If the corresponding value of the conditional expression (16) exceeds the upper limit value, the correction power for the coma aberration of the lens disposed closest to the image in the zoom optical system ZL is insufficient. Accordingly, it is difficult to suppress the variation in various aberrations upon zooming. By setting the upper limit value of the conditional expression (16) to 3.80, the advantageous effects of this embodiment can be more secured. To further secure the advantageous effects of this embodiment, the upper limit value of the conditional expression (16) may be set to 3.50, 3.30, 3.00, 2.80, 2.50, 2.30, 2.00, 1.80, and further to 1.50.

If the corresponding value of the conditional expression (16) falls below the lower limit value, the correction power for the coma aberration of the lens disposed closest to the image in the zoom optical system ZL is insufficient. Accordingly, it is difficult to suppress the variation in various aberrations upon zooming. By setting the lower limit value of the conditional expression (16) to −3.80, the advantageous effects of this embodiment can be more secured. To further secure the advantageous effects of this embodiment, the lower limit value of the conditional expression (16) may be set to −3.50, −3.30, −3.00, −2.80, −2.50, −2.30, −2.00, −1.80, and further to −1.50.

Figure 23:
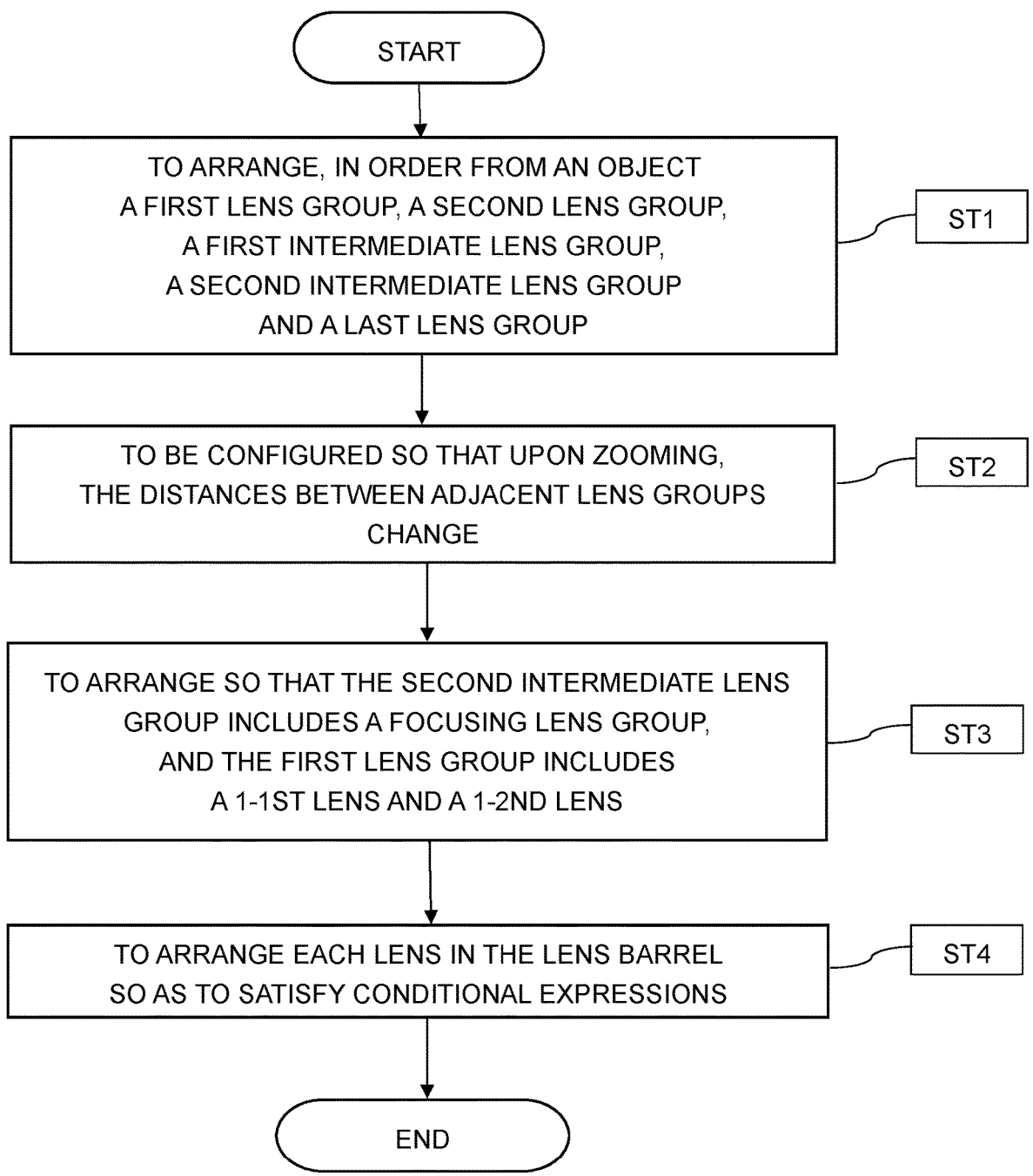
FIG. 23 is a flowchart showing a method for manufacturing the zoom optical system according to this embodiment.

Subsequently, referring to FIG. 23, a method of manufacturing the zoom optical system ZL according to this embodiment is generally described. First, arrange, in order from an object: a first lens group G1 having a positive refractive power; a second lens group G2 having a negative refractive power; a first intermediate lens group G1 having a positive refractive power; a second intermediate lens group GM2 having a positive or negative refractive power; and a last lens group GLT having a positive or negative refractive power (step ST1). Achieve a configuration such that upon zooming, the distances between adjacent lens groups change (step ST2). Achieve an arrangement where the second intermediate lens group Gd2 includes a focusing lens group that moves upon focusing, and an arrangement where the first lens group G1 includes a 1-1st lens having a negative refractive power, and a 1-2nd lens having a positive refractive power (step ST3). Furthermore, arrange each lens in the lens barrel so as to satisfy at least the conditional expression (1) (step ST4). Such a manufacturing method can manufacture the zoom optical system that can achieve high-speed and highly silent autofocus without increasing the size of the lens barrel, and suppress the variation in aberrations upon zooming from the wide-angle end state to the telephoto end state, and the variation in aberrations upon focusing from the infinity object to the short-distance object.

EXAMPLES

Zoom optical systems ZL according to the respective examples are hereinafter described with reference to the drawings. FIGS. 1, 4, 7, 10, 13, 16 and 19 are sectional views showing configurations and refractive power distributions of the zoom optical systems ZL {ZL(1) to ZL(7)} according to first to seventh examples. Note that the first to seventh examples are examples corresponding to this embodiment. In each sectional view, the movement direction of each lens group along the optical axis upon zooming from the wide-angle end state (W) to the telephoto end state (T) is indicated by an arrow. Furthermore, the movement direction of each focusing lens group upon zooming from the infinity to the short-distance object is indicated by an arrow accompanied by characters "FOCUSING".

In these drawings (FIGS. 1, 4, 7, 10, 13, 16 and 19), each lens group is represented by a combination of a symbol G and a numeral, and each lens is represented by a combination of a symbol L and a numeral. In this case, to prevent the types and numbers of symbols and numerals from being large and complicated, the lens groups and the like are represented using combinations of symbols and numerals independently among the examples. Accordingly, even if the same combinations of symbols and numerals are used among the examples, such use does not mean the same configurations.

Tables 1 to 7 are hereinafter shown. Among them, Table 1 is a table showing each data item in the first example, Table 2 is that in the second example, Table 3 is that in the third example, Table 4 is that in the fourth example, Table 5 is that in the fifth example, Table 6 is that in the sixth example, and Table 7 is that in the seventh example. In each example, d-line (wavelength $\lambda$=587.6 nm), and g-line (wavelength $\lambda$=435.8 nm) are selected as calculation targets of aberration characteristics.

In the table of [General Data], f indicates the focal length of the entire lens system, FNO indicates the F-number, 2ω indicates the angle of view (the unit is ° (degrees), and ω is the half angle of view), and Ymax indicates the maximum image height. TL indicates a distance obtained by adding BF to the distance from the lens foremost surface to the lens last surface on the optical axis upon focusing on infinity. BF indicates the air equivalent distance (back focus) from the lens last surface to the image surface I on the optical axis upon focusing on infinity. Note that these values are indicated for each of zoom states at the wide-angle end (W), the intermediate focal length (M) and the telephoto end (T). In the table of [General Data], fRw indicates the combined focal length of the lens groups placed on an image side of the first intermediate lens group in the wide-angle end state. fP1 indicates the combined focal length of the 1-1St lens and the 1-2nd lens. fP12 indicates the focal length of the 1-2nd lens. fM1w indicates the focal length of the first intermediate lens group in the wide-angle end state. fM2w indicates the focal length of the second intermediate lens group in the wide-angle end state.

In the table of [Lens Data], Surface Number indicates the order of the optical surface from the object side along the direction in which the ray travels, R indicates the radius of curvature (the surface whose center of curvature resides on the image side is regarded to have a positive value) of each optical surface, D indicates a surface distance, which is the distance to the next optical surface (or the image surface)

from each optical surface on the optical axis, nd indicates the refractive index of the material of the optical member for d-line, and vd indicates the Abbe number of the material of the optical member with respect to d-line. The radius of curvature "∞" indicates a plane or an aperture, and (aperture stop S) indicates an aperture stop. The description of the refractive index nd=1.00000 of air is omitted. In a case where the lens surface is an aspherical surface, the surface number is assigned * symbol, and the field of the radius of curvature R indicates the paraxial radius of curvature.

In the table of [Aspherical Surface Data], the shape of the aspherical surface indicated in [Lens Data] is indicated by the following expression (A). X(y) indicates the distance (sag amount) from the tangent plane at the vertex of the aspherical surface to the position on the aspherical surface at the height y along the optical axis direction. R indicates the radius of curvature (paraxial radius of curvature) of the reference spherical surface. K indicates the conic constant. Ai indicates the i-th aspherical coefficient. "E-n" indicates "x10$^{-n}$". For example, 1.234E-05=1.234×10$^{-5}$. Note that the second-order aspherical coefficient A2 is 0, and description of which is omitted.

$$X(y)=(y^2/R)/\{1+(1-\kappa \times y^2/R^2)^{1/2}\}+A4 \times y^4+A6 \times y^6+A8 \times y^8+A10 \times y^{10}+A12 \times y^{12} \quad (A)$$

The table of [Lens Group Data] shows the first surface (the surface closest to the object) of each lens group and the focal length.

The table of [Variable Distance Data] shows the surface distances at surface numbers where the distance to the next lens surface is "Variable" in the table showing [Lens Data]. Here, surface distances in the zoom states at the wide-angle end (W), the intermediate focal length (M) and the telephoto end (T) upon the infinity focus and the short range focus are indicated.

The table of [Conditional Expression Corresponding Value] shows the value corresponding to each conditional expression.

Hereinafter, among all the data values, "m" is generally used for the listed focal length f, radius of curvature R, surface distance D, other lengths and the like if not otherwise specified. However, there is no limitation thereto, because the optical system can achieve equivalent optical performances even if being proportionally enlarged or reduced.

The description of the table so far is common to all the examples. Hereinafter, redundant description is omitted.

First Example

A first example is described with reference to FIGS. 1 to 3 and Table 1. FIG. 1 is a lens configuration diagram of a zoom optical system according to the first example. The zoom optical system ZL(1) according to the first example consists of, in order from the object: a first lens group G1 having a positive refractive power; a second lens group G2 having a negative refractive power; an aperture stop S; a third lens group G3 having a positive refractive power; a fourth lens group G4 having a positive refractive power; a fifth lens group G5 having a positive refractive power; a sixth lens group G6 having a positive refractive power; and a seventh lens group G7 having a negative refractive power. Upon zooming from the wide-angle end state (W) to the telephoto end state (T), the first to seventh lens groups G1 to G7 move in directions respectively indicated by arrows in FIG. 1, and the distances between adjacent lens groups change. A lens group that consists of the third lens group G3 and the fourth lens group G4 corresponds to the first intermediate lens group H41. A lens group that consists of the fifth lens group G5 and the sixth lens group G6 corresponds to the second intermediate lens group Gd2. The seventh lens group G7 corresponds to the last lens group GLT. A sign (+) or a sign (−) assigned to each lens group indicates the refractive power of the corresponding lens group. This analogously applies to all the following examples.

The first lens group G1 consists of, in order from the object: a positive cemented lens that includes a negative meniscus lens L11 having a convex surface facing the object, and a positive meniscus lens L12 having a convex surface facing the object; and a positive meniscus lens L13 having a convex surface facing the object. The negative meniscus lens L11 corresponds to the 1-1st lens. The positive meniscus lens L12 corresponds to the 1-2nd lens.

The second lens group G2 consists of, in order from the object: a negative meniscus lens L21 having a convex surface facing the object; a biconcave negative lens L22; a biconvex positive lens L23; and a negative meniscus lens L24 having a concave surface facing the object. The negative meniscus lens L21 has an object-side lens surface that is an aspherical surface.

The third lens group G3 consists of, in order from the object: a positive meniscus lens L31 having a convex surface facing the object; and a biconvex positive lens L32. The aperture stop S is provided on an object-side neighborhood of the third lens group G3, and moves together with the third lens group G3 upon zooming. The positive meniscus lens L31 has an object-side lens surface that is an aspherical surface.

The fourth lens group G4 consists of a positive cemented lens that includes a negative meniscus lens L41 having a convex surface facing the object, and a biconvex positive lens L42.

The fifth lens group G5 consists of, in order from the object: a negative meniscus lens L51 having a concave surface facing the object; and a biconvex positive lens L52.

The sixth lens group G6 consists of a positive meniscus lens L61 having a concave surface facing the object. The positive meniscus lens L61 has an image-side lens surface that is an aspherical surface.

The seventh lens group G7 consists of, in order from the object: a positive meniscus lens L71 having a concave surface facing the object; a biconcave negative lens L72; and a negative meniscus lens L73 having a concave surface facing the object. The negative lens L72 has an object-side lens surface that is an aspherical surface. An image surface I is disposed on the image side of the seventh lens group G7.

In this example, the fifth lens group G5 and the sixth lens group G6 are independently moved toward the object, thereby focusing from a far-distant object to a short-distance object (from an infinity object to a finite distance object). That is, the fifth lens group G5 corresponds to the first focusing lens group, and the sixth lens group G6 corresponds to the second focusing lens group.

The following Table 1 lists values of data on the zoom optical system according to the first example.

TABLE 1

| [General Data] |
| --- |
| Zooming ratio 2.74 |
| fRw = −4993.677 |
| fP1 = 1152.940 |

TABLE 1-continued

[General Data]

fP12 = 200.162
fM1w = 34.638
fM2w = 55.257

| | W | M | T |
|---|---|---|---|
| f | 24.8 | 50.0 | 67.9 |
| FNO | 2.92 | 2.92 | 2.92 |
| 2ω | 85.10 | 45.26 | 33.84 |
| Ymax | 21.60 | 21.60 | 21.60 |
| TL | 139.35 | 158.45 | 169.16 |
| BF | 11.93 | 23.42 | 28.62 |

[Lens Data]

| Surface Number | R | D | nd | νd |
|---|---|---|---|---|
| Object Surface | ∞ | | | |
| 1 | 234.3873 | 2.500 | 1.84666 | 23.80 |
| 2 | 109.5180 | 5.200 | 1.75500 | 52.34 |
| 3 | 389.6852 | 0.200 | | |
| 4 | 59.0627 | 5.700 | 1.77250 | 49.62 |
| 5 | 135.3649 | D5(Variable) | | |
| 6* | 218.4420 | 2.000 | 1.74389 | 49.53 |
| 7 | 18.6957 | 9.658 | | |
| 8 | −59.6856 | 1.300 | 1.77250 | 49.62 |
| 9 | 59.6856 | 0.442 | | |
| 10 | 39.2099 | 6.400 | 1.72825 | 28.38 |
| 11 | −48.6731 | 1.933 | | |
| 12 | −26.4065 | 1.300 | 1.61800 | 63.34 |
| 13 | −71.7612 | D13(Variable) | | |
| 14 | ∞ | 1.712 | | (Aperture Stop S) |
| 15* | 71.8876 | 2.500 | 1.69370 | 53.32 |
| 16 | 127.6411 | 0.716 | | |
| 17 | 38.7492 | 5.900 | 1.59319 | 67.90 |
| 18 | −105.4274 | D18(Variable) | | |
| 19 | 67.0276 | 1.300 | 1.73800 | 32.33 |
| 20 | 19.5126 | 9.700 | 1.49782 | 82.57 |
| 21 | −50.5609 | D21(Variable) | | |
| 22 | −23.9237 | 1.200 | 1.72047 | 34.71 |
| 23 | −56.2081 | 0.200 | | |
| 24 | 103.1749 | 5.900 | 1.59349 | 67.00 |
| 25 | −33.0197 | D25(Variable) | | |
| 26 | −70.6288 | 3.500 | 1.79189 | 45.04 |
| 27* | −38.2153 | D27(Variable) | | |
| 28 | −43.9824 | 3.000 | 1.94595 | 17.98 |
| 29 | −32.4253 | 0.200 | | |
| 30* | −100.5837 | 1.500 | 1.85207 | 40.15 |
| 31 | 88.1634 | 7.847 | | |
| 32 | −25.2838 | 1.400 | 1.58913 | 61.22 |
| 33 | −45.3661 | BF | | |
| Image Surface | ∞ | | | |

[Aspherical Surface Data]

6th Surface

K = 1.0000, A4 = 5.27866E−06, A6 = −5.41835E−09
A8 = 1.33113E−11, A10 = −2.04736E−14, A12 = 2.05090E−17

15th Surface

K = 1.0000, A4 = −4.55747E−06, A6 = −1.40092E−10
A8 = −8.81384E−13, A10 = −8.42653E−15, A12 = 0.00000E+00

27th Surface

K = 1.0000, A4 = 1.09543E−05, A6 = −2.36281E−08
A8 = 1.42728E−10, A10 = −5.02724E−13, A12 = 7.51800E−16

30th Surface

K = 1.0000, A4 = −2.18913E−06, A6 = −2.29301E−08
A8 = 3.94582E−11, A10 = −9.84200E−14, A12 = 0.00000E+00

TABLE 1-continued

[General Data]

[Lens Group Data]

| Group | First surface | Focal length |
|---|---|---|
| G1 | 1 | 119.124 |
| G2 | 6 | −22.126 |
| G3 | 14 | 40.880 |
| G4 | 19 | 115.687 |
| G5 | 22 | 124.717 |
| G6 | 26 | 100.365 |
| G7 | 28 | −47.354 |

[Variable Distance Data]

| | W Infinity | M Infinity | T Infinity | W Short-distance | M Short-distance | T Short-distance |
|---|---|---|---|---|---|---|
| D5 | 1.780 | 21.220 | 30.246 | 1.780 | 21.220 | 30.246 |
| D13 | 19.285 | 6.132 | 2.013 | 19.285 | 6.132 | 2.013 |
| D18 | 9.167 | 3.866 | 1.493 | 9.167 | 3.866 | 1.493 |
| D21 | 5.179 | 14.279 | 19.018 | 4.137 | 12.991 | 17.666 |
| D25 | 2.679 | 3.515 | 2.616 | 3.249 | 4.079 | 3.027 |
| D27 | 6.128 | 2.807 | 1.953 | 6.600 | 3.530 | 2.893 |

[Conditional Expression Corresponding Value]

Conditional Expression (1) dP1/f1 = 0.065
Conditional Expression (2) |fP1|/f1 = 9.678
Conditional Expression (3) dP12/f1 = 0.044
Conditional Expression (4) fP12/f1 = 1.680
Conditional Expression (5) fM2w/fLw = −1.170
Conditional Expression (6) fM1w/fM2w = 0.627
Conditional Expression (7) fM1w/fLw = −0.730
Conditional Expression (8) f1/(−f2) = 5.384
Conditional Expression (9) |fF|/ft = 1.837
Conditional Expression (10) nN/nP = 1.160
Conditional Expression (11) νN/νP = 0.392
Conditional Expression (12) f1/|fRw| = 0.024
Conditional Expression (13) 2ωw = 85.10
Conditional Expression (14) BFw/fw = 0.482
Conditional Expression (15) (rR2 + rR1)/(rR2 − rR1) = 3.518

Figure 3A:
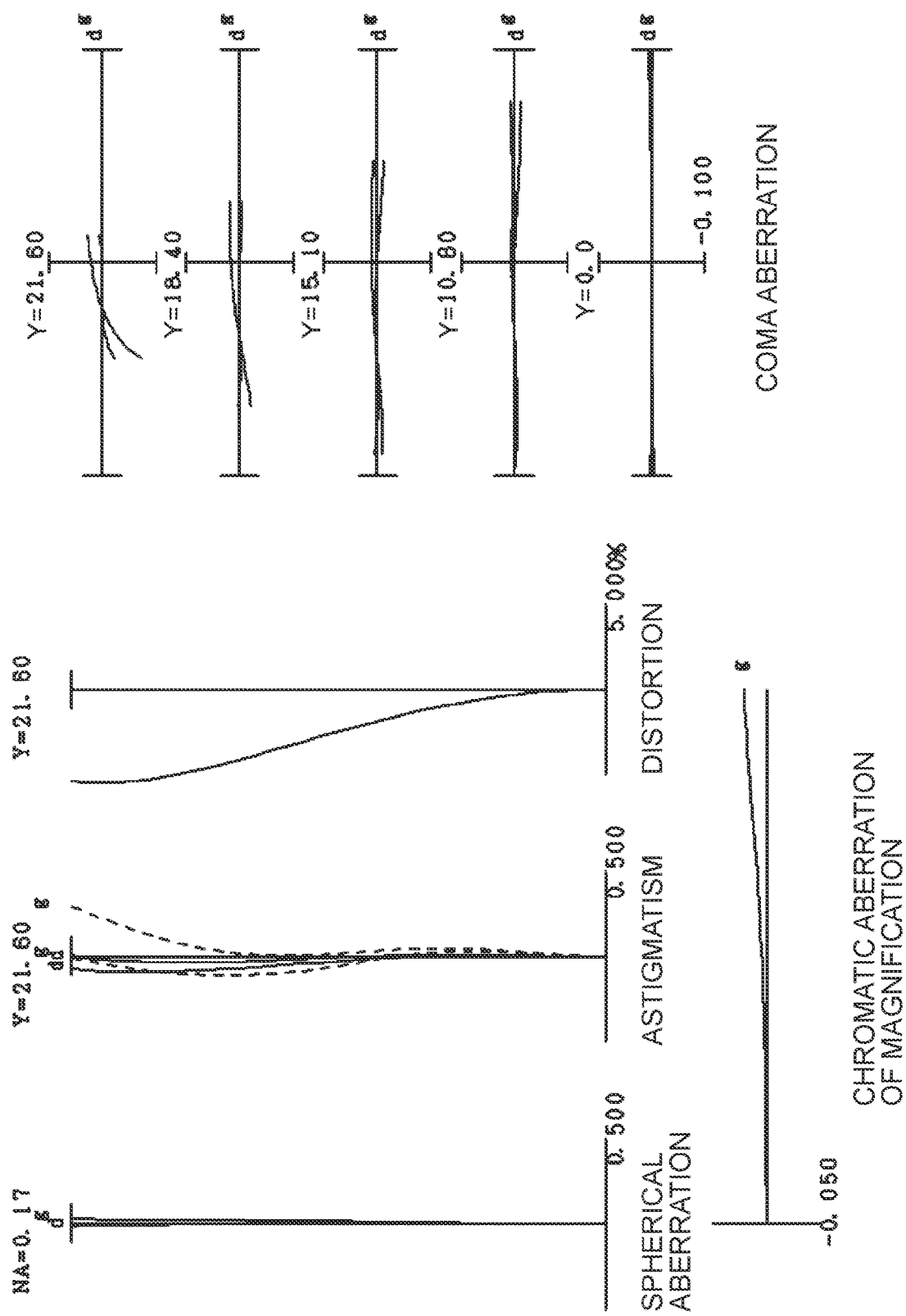

FIGS. 2A, 2B and 2C are graphs respectively showing various aberrations of the zoom optical system according to the first example upon focusing on infinity in the wide-angle end state, the intermediate focal length state and the telephoto end state. FIGS. 3A, 3B and 3C are graphs respectively showing various aberrations of the zoom optical system according to the first example upon focusing on a short-distance object in the wide-angle end state, the intermediate focal length state and the telephoto end state.

In the aberration graphs in FIGS. 2A to 2C, FNO indicates the F-number, and Y indicates the image height. The spherical aberration graph indicates the value of the F-number corresponding to the maximum diameter. The astigmatism graph and the distortion graph indicate the maximum value of the image height. The lateral aberration graph indicates the value of each image height. In the aberration graphs in FIGS. 3A to 3C, NA indicates the numerical aperture, and Y indicates the image height. The spherical aberration graph indicates the value of the numerical aperture corresponding to the maximum diameter. The astigmatism graph and the distortion graph indicate the maximum value of the image height. The lateral aberration graph indicates the value of each image height. In each aberration graph, d indicates d-line (wavelength λ=587.6 nm), and g indicates g-line (wavelength λ=435.8 nm). In the astigmatism graph, a solid line indicates a sagittal image surface, and a broken line indicates a meridional image surface. Note that also in the aberration graph in each example described below, symbols similar to those in this example are used, and redundant description is omitted.

The various aberration graphs show that the zoom optical system according to the first example favorably corrects the various aberrations from the wide-angle end state to the telephoto end state, has an excellent imaging performance, and also has an excellent imaging performance even upon focusing on a short-distance object.

Second Example

The second example is described with reference to FIGS. 4 to 6 and Table 2. FIG. 4 is a lens configuration diagram of a zoom optical system according to the second example. The zoom optical system ZL(2) according to the second example consists of, in order from the object: a first lens group G1 having a positive refractive power; a second lens group G2 having a negative refractive power; an aperture stop S; a third lens group G3 having a positive refractive power; a fourth lens group G4 having a positive refractive power; a fifth lens group G5 having a positive refractive power; a sixth lens group G6 having a positive refractive power; and a seventh lens group G7 having a negative refractive power. Upon zooming from the wide-angle end state (W) to the telephoto end state (T), the first to seventh lens groups G1 to G7 move in directions respectively indicated by arrows in FIG. 4, and the distances between adjacent lens groups change. A lens group that consists of the third lens group G3 and the fourth lens group G4 corresponds to the first intermediate lens group H41. A lens group that consists of the fifth lens group G5 and the sixth lens group G6 corresponds to the second intermediate lens group GM2. The seventh lens group G7 corresponds to the last lens group GLT.

The first lens group G1 consists of, in order from the object: a positive cemented lens that includes a negative meniscus lens L11 having a convex surface facing the object, and a positive meniscus lens L12 having a convex surface facing the object; and a positive meniscus lens L13 having a convex surface facing the object. The negative meniscus lens L11 corresponds to the 1-1st lens. The positive meniscus lens L12 corresponds to the 1-2nd lens.

The second lens group G2 consists of, in order from the object: a negative meniscus lens L21 having a convex surface facing the object; a biconcave negative lens L22; a biconvex positive lens L23; and a negative meniscus lens L24 having a concave surface facing the object. The negative meniscus lens L21 has an object-side lens surface that is an aspherical surface.

The third lens group G3 consists of, in order from the object: a biconvex positive lens L31; and a biconvex positive lens L32. The aperture stop S is provided on an object-side neighborhood of the third lens group G3, and moves together with the third lens group G3 upon zooming. The positive lens L31 has an object-side lens surface that is an aspherical surface.

The fourth lens group G4 consists of a positive cemented lens that includes a negative meniscus lens L41 having a convex surface facing the object, and a biconvex positive lens L42.

The fifth lens group G5 consists of, in order from the object: a negative meniscus lens L51 having a concave surface facing the object; and a biconvex positive lens L52.

The sixth lens group G6 consists of a positive meniscus lens L61 having a concave surface facing the object. The positive meniscus lens L61 has an image-side lens surface that is an aspherical surface.

The seventh lens group G7 consists of, in order from the object: a positive meniscus lens L71 having a concave surface facing the object; a biconcave negative lens L72; and a negative meniscus lens L73 having a concave surface facing the object. The negative lens L72 has an object-side lens surface that is an aspherical surface. An image surface I is disposed on the image side of the seventh lens group G7.

In this example, the fifth lens group G5 and the sixth lens group G6 are independently moved toward the object, thereby focusing from a far-distant object to a short-distance object (from an infinity object to a finite distance object). That is, the fifth lens group G5 corresponds to the first focusing lens group, and the sixth lens group G6 corresponds to the second focusing lens group.

The following Table 2 lists values of data on the zoom optical system according to the second example.

TABLE 2

[General Data]

Zooming ratio 2.74
fRw = −346.533
fP1 = 570.730
fP12 = 177.716
fM1w = 34.511
fM2w = 56.580

|   | W | M | T |
|---|---|---|---|
| f | 24.8 | 50.0 | 67.9 |
| FNO | 2.92 | 2.92 | 2.92 |
| 2ω | 85.08 | 45.32 | 33.84 |
| Ymax | 21.60 | 21.60 | 21.60 |
| TL | 139.96 | 156.15 | 168.00 |
| BF | 11.76 | 26.07 | 29.33 |

[Lens Data]

| Surface Number | R | D | nd | νd |
|---|---|---|---|---|
| Object Surface | ∞ | | | |
| 1 | 282.3733 | 2.500 | 1.84666 | 23.80 |
| 2 | 123.2365 | 5.647 | 1.77250 | 49.62 |
| 3 | 1180.1775 | 0.200 | | |
| 4 | 59.2907 | 4.310 | 1.81600 | 46.59 |
| 5 | 98.9987 | D5(Variable) | | |
| 6* | 205.3191 | 2.000 | 1.74389 | 49.53 |
| 7 | 19.2200 | 9.185 | | |
| 8 | −74.7032 | 1.300 | 1.83481 | 42.73 |
| 9 | 64.3697 | 0.324 | | |
| 10 | 41.9771 | 5.683 | 1.78472 | 25.64 |
| 11 | −72.0408 | 4.071 | | |
| 12 | −26.6709 | 1.300 | 1.60300 | 65.44 |
| 13 | −52.5345 | D13(Variable) | | |
| 14 | ∞ | 1.500 | | (Aperture Stop S) |
| 15* | 84.6431 | 3.039 | 1.58913 | 61.15 |
| 16 | −4073.6051 | 0.200 | | |
| 17 | 42.4140 | 5.438 | 1.59319 | 67.90 |
| 18 | −143.7473 | D18(Variable) | | |
| 19 | 74.9775 | 1.300 | 1.73800 | 32.33 |
| 20 | 20.9860 | 9.090 | 1.49782 | 82.57 |
| 21 | −48.9247 | D21(Variable) | | |
| 22 | −23.9603 | 1.200 | 1.73800 | 32.33 |
| 23 | −52.8529 | 0.955 | | |
| 24 | 113.2572 | 5.800 | 1.59349 | 66.99 |
| 25 | −32.1120 | D25(Variable) | | |
| 26 | −120.6162 | 3.500 | 1.74389 | 49.53 |
| 27* | −50.8923 | D27(Variable) | | |
| 28 | −61.4253 | 3.215 | 1.94595 | 17.98 |
| 29 | −34.3446 | 0.200 | | |

TABLE 2-continued

[General Data]

| | | | | |
|---|---|---|---|---|
| 30* | −69.3409 | 1.500 | 1.85108 | 40.12 |
| 31 | 72.0715 | 6.683 | | |
| 32 | −23.1150 | 1.400 | 1.69680 | 55.52 |
| 33 | −36.7553 | BF | | |
| Image Surface | ∞ | | | |

[Aspherical Surface Data]

6th Surface

K = 1.0000, A4 = 4.34838E−06, A6 = −2.30274E−09
A8 = 1.34342E−12, A10 = 2.08876E−15, A12 = 0.00000E+00

15th Surface

K = 1.0000, A4 = −4.08736E−06, A6 = 2.82731E−09
A8 = −1.71368E−11, A10 = 2.81580E−14, A12 = 0.00000E+00

27th Surface

K = 1.0000, A4 = 9.77330E−06, A6 = −1.31611E−08
A8 = 7.02329E−11, A10 = −1.28887E−13, A12 = 0.00000E+00

30th Surface

K = 1.0000, A4 = −3.68898E−06, A6 = −1.92901E−08
A8 = 3.36794E−11, A10 = −8.19805E−14, A12 = 0.00000E+00

[Lens Group Data]

| Group | First surface | Focal length |
|---|---|---|
| G1 | 1 | 133.226 |
| G2 | 6 | −23.579 |
| G3 | 14 | 40.561 |
| G4 | 19 | 115.254 |
| G5 | 22 | 113.536 |
| G6 | 26 | 115.868 |
| G7 | 28 | −42.726 |

[Variable Distance Data]

| | W Infinity | M Infinity | T Infinity | W Short-distance | M Short-distance | T Short-distance |
|---|---|---|---|---|---|---|
| D5 | 2.000 | 18.194 | 30.046 | 2.000 | 18.194 | 30.046 |
| D13 | 21.479 | 6.645 | 2.000 | 21.479 | 6.645 | 2.000 |
| D18 | 9.801 | 4.462 | 1.500 | 9.801 | 4.462 | 1.500 |
| D21 | 5.195 | 13.414 | 18.760 | 4.220 | 12.328 | 17.590 |
| D25 | 2.295 | 3.824 | 2.737 | 2.742 | 4.222 | 2.950 |
| D27 | 5.890 | 2.000 | 2.087 | 6.417 | 2.689 | 3.043 |

[Conditional Expression Corresponding Value]

Conditional Expression (1) dP1/f1 = 0.061
Conditional Expression (2) |fP1|/f1 = 4.284
Conditional Expression (3) dP12/f1 = 0.042
Conditional Expression (4) fP12/f1 = 1.334
Conditional Expression (5) fM2w/fLw = −1.320
Conditional Expression (6) fM1w/fM2w = 0.610
Conditional Expression (7) fM1w/fLw = −0.810
Conditional Expression (8) f1/(−f2) = 5.650
Conditional Expression (9) |fF|/ft = 1.706
Conditional Expression (10) nN/nP = 1.160
Conditional Expression (11) νN/νP = 0.392
Conditional Expression (12) f1/|fRw| = 0.384
Conditional Expression (13) 2ωw = 85.08
Conditional Expression (14) BFw/fw = 0.475
Conditional Expression (15) (rR2 + rR1)/(rR2 − rR1) = 4.389

FIGS. 5A, 5B and 5C are graphs respectively showing various aberrations of the zoom optical system according to the second example upon focusing on infinity in the wide-angle end state, the intermediate focal length state and the telephoto end state. FIGS. 6A, 6B and 6C are graphs respectively showing various aberrations of the zoom optical system according to the second example upon focusing on a short-distance object in the wide-angle end state, the intermediate focal length state and the telephoto end state. The various aberration graphs show that the zoom optical system according to the second example favorably corrects the various aberrations from the wide-angle end state to the telephoto end state, has an excellent imaging performance, and also has an excellent imaging performance even upon focusing on a short-distance object.

Third Example

The third example is described with reference to FIGS. 7 to 9 and Table 3. FIG. 7 is a lens configuration diagram of a zoom optical system according to the third example. The zoom optical system ZL(3) according to the third example consists of, in order from the object: a first lens group G1 having a positive refractive power; a second lens group G2 having a negative refractive power; an aperture stop S; a third lens group G3 having a positive refractive power; a fourth lens group G4 having a positive refractive power; a fifth lens group G5 having a positive refractive power; a sixth lens group G6 having a positive refractive power; and a seventh lens group G7 having a negative refractive power. Upon zooming from the wide-angle end state (W) to the telephoto end state (T), the first to seventh lens groups G1 to G7 move in directions respectively indicated by arrows in FIG. 7, and the distances between adjacent lens groups change. A lens group that consists of the third lens group G3 and the fourth lens group G4 corresponds to the first intermediate lens group H41. A lens group that consists of the fifth lens group G5 and the sixth lens group G6 corresponds to the second intermediate lens group Gd2. The seventh lens group G7 corresponds to the last lens group GLT.

The first lens group G1 consists of, in order from the object: a positive cemented lens that includes a negative meniscus lens L11 having a convex surface facing the object, and a biconvex positive lens L12; and a positive meniscus lens L13 having a convex surface facing the object. The negative meniscus lens L11 corresponds to the 1-1st lens. The positive lens L12 corresponds to the 1-2nd lens.

The second lens group G2 consists of, in order from the object: a negative meniscus lens L21 having a convex surface facing the object; a biconcave negative lens L22; a biconvex positive lens L23; and a negative meniscus lens L24 having a concave surface facing the object. The negative meniscus lens L21 has an object-side lens surface that is an aspherical surface.

The third lens group G3 consists of, in order from the object: a positive meniscus lens L31 having a convex surface facing the object; and a biconvex positive lens L32. The aperture stop S is provided on an object-side neighborhood of the third lens group G3, and moves together with the third lens group G3 upon zooming. The positive meniscus lens L31 has an object-side lens surface that is an aspherical surface.

The fourth lens group G4 consists of a positive cemented lens that includes a negative meniscus lens L41 having a convex surface facing the object, and a biconvex positive lens L42.

The fifth lens group G5 consists of, in order from the object: a negative meniscus lens L51 having a concave surface facing the object; and a biconvex positive lens L52.

The sixth lens group G6 consists of a positive meniscus lens L61 having a concave surface facing the object. The positive meniscus lens L61 has an image-side lens surface that is an aspherical surface.

The seventh lens group G7 consists of, in order from the object: a negative meniscus lens L71 having a convex surface facing the object; a positive meniscus lens L72 having a concave surface facing the object; and a negative meniscus lens L73 having a concave surface facing the object. The negative meniscus lens L73 has an object-side lens surface that is an aspherical surface. An image surface I is disposed on the image side of the seventh lens group G7.

In this example, the fifth lens group G5 and the sixth lens group G6 are independently moved toward the object, thereby focusing from a far-distant object to a short-distance object (from an infinity object to a finite distance object). That is, the fifth lens group G5 corresponds to the first focusing lens group, and the sixth lens group G6 corresponds to the second focusing lens group.

The following Table 3 lists values of data on the zoom optical system according to the third example.

TABLE 3

[General Data]

Zooming ratio 3.33
fRw = −219.096
fP1 = 586.507
fP12 = 179.492
fM1w = 35.662
fM2w = 59.932

|  | W | M | T |
|---|---|---|---|
| f | 24.8 | 50.0 | 82.5 |
| FNO | 2.92 | 2.92 | 2.92 |
| 2ω | 85.12 | 45.44 | 28.34 |
| Ymax | 21.60 | 21.60 | 21.60 |
| TL | 150.97 | 164.85 | 185.45 |
| BF | 11.75 | 21.93 | 30.78 |

[Lens Data]

| Surface Number | R | D | nd | vd |
|---|---|---|---|---|
| Object Surface | ∞ | | | |
| 1 | 454.1335 | 2.500 | 1.94594 | 17.98 |
| 2 | 158.8346 | 5.629 | 1.81600 | 46.59 |
| 3 | −1850.8518 | 0.200 | | |
| 4 | 62.5732 | 5.149 | 1.81600 | 46.59 |
| 5 | 111.4228 | D5(Variable) | | |
| 6* | 143.7538 | 2.000 | 1.81600 | 46.59 |
| 7 | 20.1321 | 9.695 | | |
| 8 | −48.3009 | 2.346 | 1.88300 | 40.66 |
| 9 | 156.4679 | 0.200 | | |
| 10 | 65.6396 | 6.565 | 1.80518 | 25.45 |
| 11 | −42.2522 | 2.354 | | |
| 12 | −26.3896 | 1.200 | 1.69680 | 55.52 |
| 13 | −61.8795 | D13(Variable) | | |
| 14 | ∞ | 1.500 | | (Aperture Stop S) |
| 15* | 46.9137 | 2.985 | 1.81600 | 46.59 |
| 16 | 79.9069 | 0.200 | | |
| 17 | 56.4482 | 6.543 | 1.49782 | 82.57 |
| 18 | −69.0474 | D18(Variable) | | |
| 19 | 78.4165 | 1.300 | 1.90366 | 31.27 |
| 20 | 26.6178 | 9.263 | 1.59319 | 67.90 |
| 21 | −58.5857 | D21(Variable) | | |
| 22 | −29.0948 | 1.200 | 1.80100 | 34.92 |
| 23 | −53.3089 | 2.957 | | |
| 24 | 64.8393 | 6.500 | 1.48749 | 70.32 |
| 25 | −36.2810 | D25(Variable) | | |
| 26 | −486.6338 | 2.667 | 1.58887 | 61.13 |
| 27* | −77.9833 | D27(Variable) | | |
| 28 | 208.9420 | 1.200 | 1.90366 | 31.27 |
| 29 | 40.1016 | 3.903 | | |
| 30 | −103.6980 | 6.199 | 1.84666 | 23.80 |
| 31 | −35.7067 | 3.104 | | |
| 32* | −19.6292 | 1.500 | 1.81600 | 46.59 |
| 33 | −40.5502 | BF | | |
| Image Surface | ∞ | | | |

[Aspherical Surface Data]

6th Surface

K = 1.0000, A4 = 4.25283E−06, A6 = −2.28156E−09
A8 = −7.12258E−14, A10 = 7.16065E−15, A12 = 0.00000E+00

15th Surface

K = 1.0000, A4 = −3.75837E−06, A6 = 9.56813E−10
A8 = −1.31531E−12, A10 = 1.97978E−16, A12 = 0.00000E+00

27th Surface

K = 1.0000, A4 = 1.09037E−05, A6 = −5.09501E−11
A8 = −1.76649E−12, A10 = 1.58609E−14, A12 = 0.00000E+00

32nd Surface

K = 1.0000, A4 = 1.01091E−05, A6 = 1.61408E−08
A8 = 3.76726E−12, A10 = 1.25182E−13, A12 = 0.00000E+00

[Lens Group Data]

| Group | First surface | Focal length |
|---|---|---|
| G1 | 1 | 130.092 |
| G2 | 6 | −23.049 |
| G3 | 14 | 44.414 |
| G4 | 19 | 100.000 |
| G5 | 22 | 98.812 |
| G6 | 26 | 157.320 |
| G7 | 28 | −42.703 |

[Variable Distance Data]

|  | W Infinity | M Infinity | T Infinity | W Short-distance | M Short-distance | T Short-distance |
|---|---|---|---|---|---|---|
| D5 | 2.000 | 21.323 | 36.906 | 2.000 | 21.323 | 36.906 |
| D13 | 25.662 | 7.746 | 2.000 | 25.662 | 7.746 | 2.000 |
| D18 | 9.597 | 5.312 | 1.500 | 9.597 | 5.312 | 1.500 |
| D21 | 6.192 | 11.864 | 21.415 | 5.303 | 10.833 | 20.070 |
| D25 | 2.000 | 3.105 | 2.000 | 2.411 | 3.415 | 2.346 |
| D27 | 4.901 | 4.716 | 2.000 | 5.379 | 5.438 | 2.999 |

[Conditional Expression Corresponding Value]

Conditional Expression (1) dP1/f1 = 0.062
Conditional Expression (2) |fP1|/f1 = 4.508
Conditional Expression (3) dP12/f1 = 0.043
Conditional Expression (4) fP12/f1 = 1.380
Conditional Expression (5) fM2w/fLw = −1.400
Conditional Expression (6) fM1w/fM2w = 0.595
Conditional Expression (7) fM1w/fLw = −0.840
Conditional Expression (8) f1/(−f2) = 5.644
Conditional Expression (9) |fF|/ft = 1.907
Conditional Expression (10) nN/nP = 1.195
Conditional Expression (11) vN/vP = 0.461
Conditional Expression (12) f1/|fRw| = 0.594
Conditional Expression (13) 2ωw = 85.12
Conditional Expression (14) BFw/fw = 0.475
Conditional Expression (15) (rR2 + rR1)/(rR2 − rR1) = 2.877

Figure 8A:
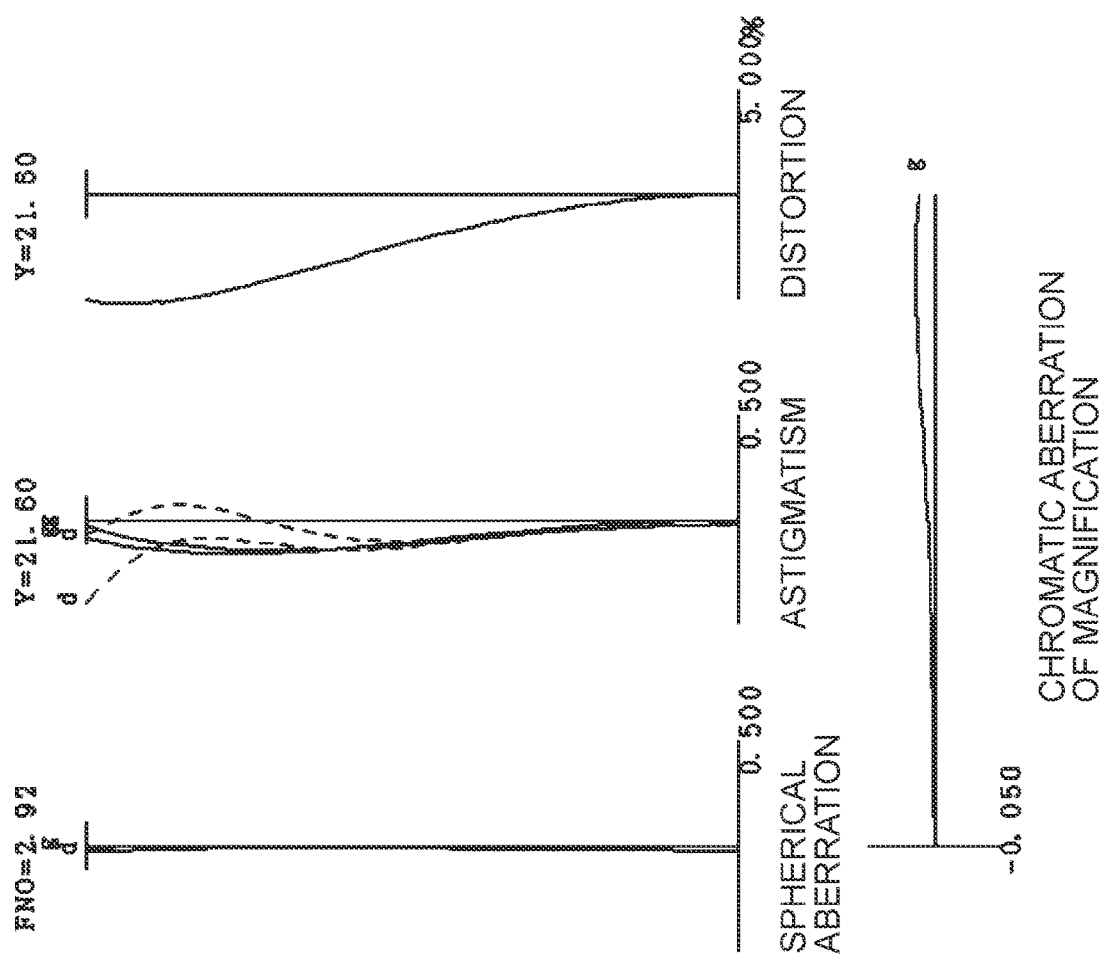
Figure 8B:
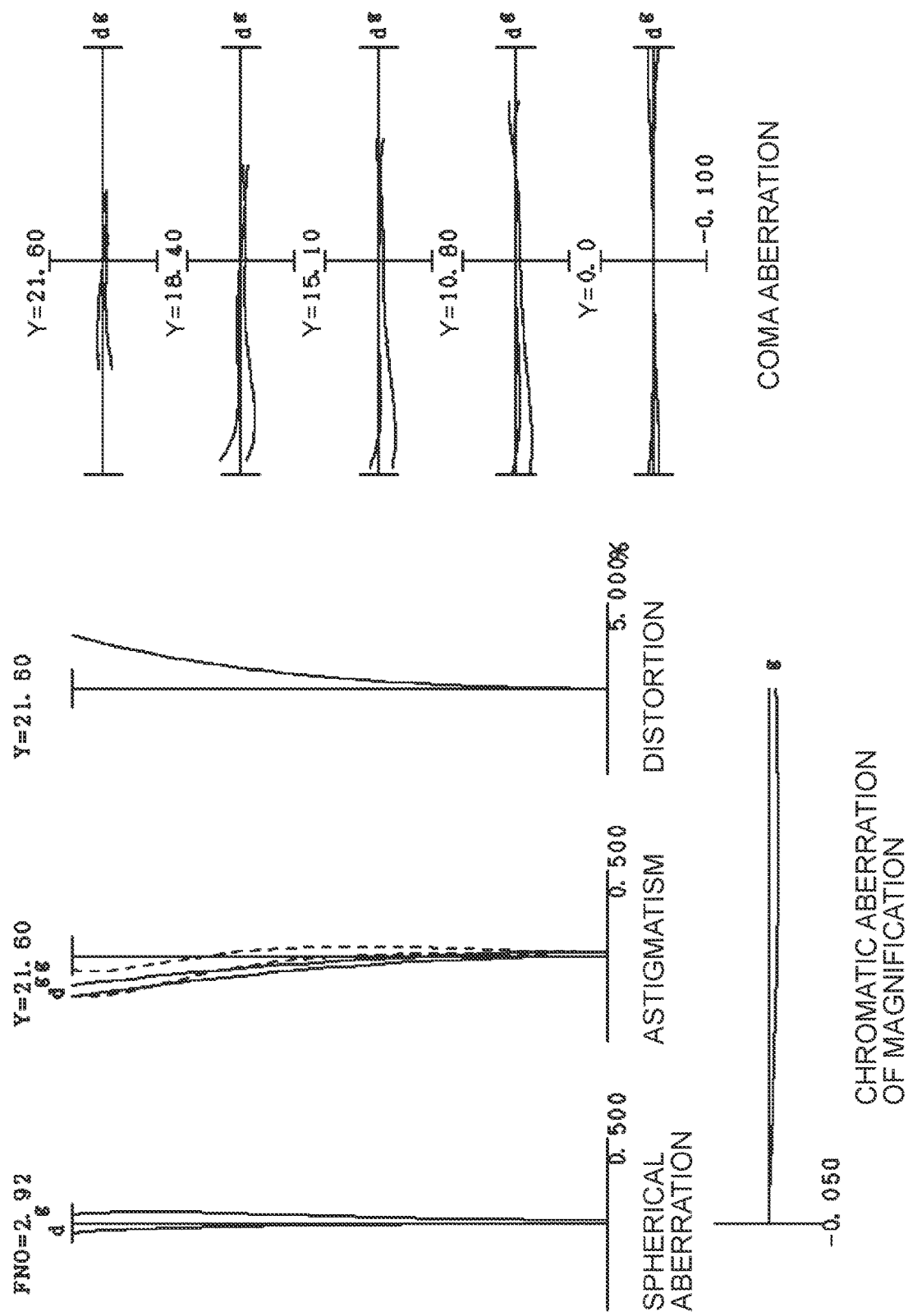
Figure 9C:
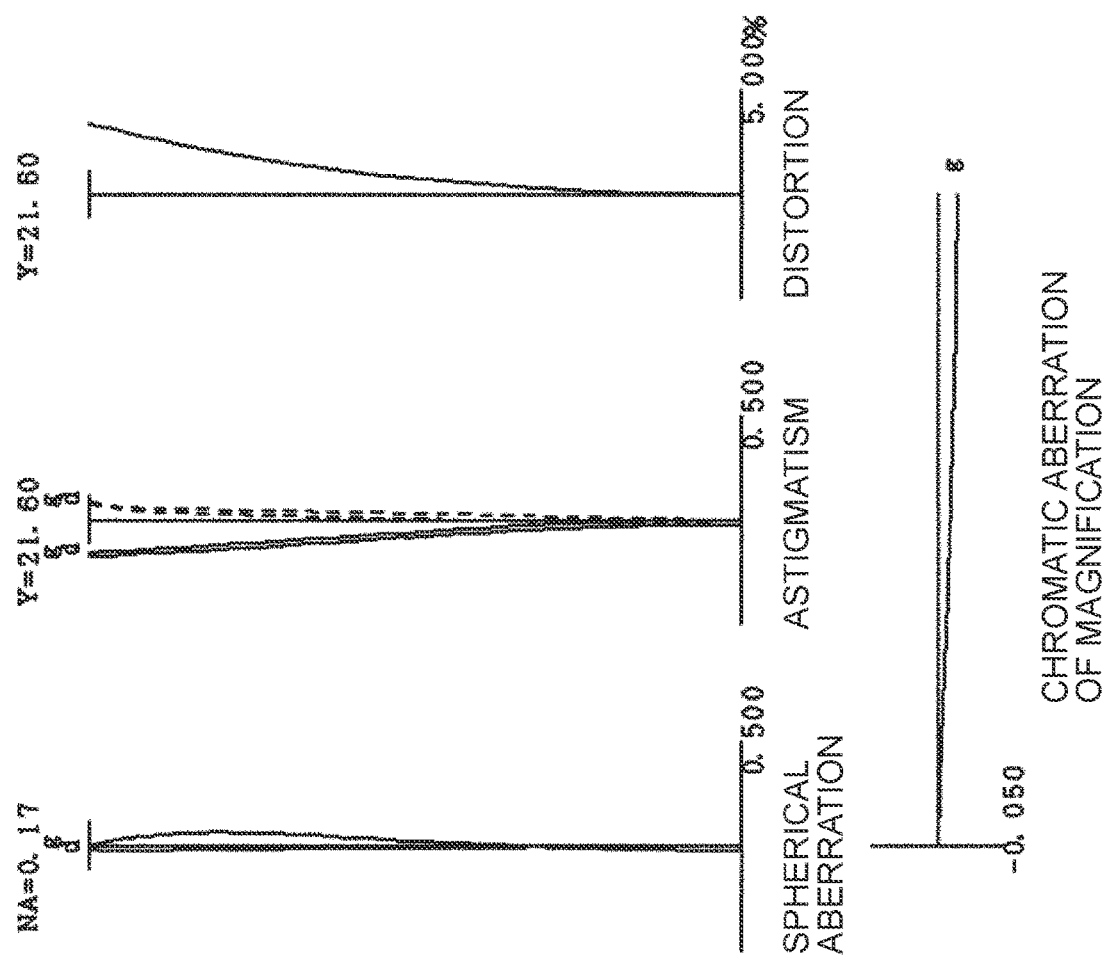

FIGS. 8A, 8B and 8C are graphs respectively showing various aberrations of the zoom optical system according to the third example upon focusing on infinity in the wide-angle end state, the intermediate focal length state and the telephoto end state. FIGS. 9A, 9B and 9C are graphs respectively showing various aberrations of the zoom optical system according to the third example upon focusing on a short-distance object in the wide-angle end state, the intermediate focal length state and the telephoto end state. The various aberration graphs show that the zoom optical system according to the third example favorably corrects the various aberrations from the wide-angle end state to the telephoto end state, has an excellent imaging performance, and also has an excellent imaging performance even upon focusing on a short-distance object.

Fourth Example

The fourth example is described with reference to FIGS. 10 to 12 and Table 4. FIG. 10 is a lens configuration diagram of a zoom optical system according to the fourth example. The zoom optical system ZL(4) according to the fourth example consists of: a first lens group G1 having a positive refractive power; a second lens group G2 having a negative refractive power; an aperture stop S; a third lens group G3 having a positive refractive power; a fourth lens group G4 having a positive refractive power; a fifth lens group G5 having a positive refractive power; and a sixth lens group G6 having a negative refractive power, these elements being disposed in order from an object. Upon zooming from the wide-angle end state (W) to the telephoto end state (T), the first to sixth lens groups G1 to G6 move in directions respectively indicated by arrows in FIG. 10, and the distances between adjacent lens groups change. A lens group that consists of the third lens group G3 and the fourth lens group G4 corresponds to the first intermediate lens group GM1. The fifth lens group G5 corresponds to the second intermediate lens group Gd2. The sixth lens group G6 corresponds to the last lens group GLT.

The first lens group G1 consists of, in order from the object: a positive cemented lens that includes a negative meniscus lens L11 having a convex surface facing the object, and a positive meniscus lens L12 having a convex surface facing the object; and a positive meniscus lens L13 having a convex surface facing the object. The negative meniscus lens L11 corresponds to the 1-1st lens. The positive meniscus lens L12 corresponds to the 1-2nd lens.

The second lens group G2 consists of, in order from the object: a negative meniscus lens L21 having a convex surface facing the object; a biconcave negative lens L22; a biconvex positive lens L23; and a negative meniscus lens L24 having a concave surface facing the object. The negative meniscus lens L21 has an object-side lens surface that is an aspherical surface.

The third lens group G3 consists of, in order from the object: a positive meniscus lens L31 having a convex surface facing the object; and a biconvex positive lens L32. The aperture stop S is provided on an object-side neighborhood of the third lens group G3, and moves together with the third lens group G3 upon zooming. The positive meniscus lens L31 has an object-side lens surface that is an aspherical surface.

The fourth lens group G4 consists of a positive cemented lens that includes a negative meniscus lens L41 having a convex surface facing the object, and a biconvex positive lens L42.

The fifth lens group G5 consists of, in order from the object: a negative meniscus lens L51 having a concave surface facing the object; a biconvex positive lens L52; and a positive meniscus lens L53 having a concave surface facing the object. The positive meniscus lens L53 has an image-side lens surface that is an aspherical surface.

The sixth lens group G6 consists of, in order from the object: a positive meniscus lens L61 having a concave surface facing the object; a biconcave negative lens L62; and a negative meniscus lens L63 having a concave surface facing the object. The negative lens L62 has an object-side lens surface that is an aspherical surface. An image surface I is disposed on the image side of the sixth lens group G6.

In this example, the fifth lens group G5 is moved toward the object, thereby focusing from a far-distant object to a short-distance object (from an infinity object to a finite distance object). That is, the fifth lens group G5 corresponds to the focusing lens group.

The following Table 4 lists values of data on the zoom optical system according to the fourth example.

TABLE 4

[General Data]

Zooming ratio 2.75
fRw = −356.649
fP1 = 1625.162
fP12 = 181.395
fM1w = 34.482
fM2w = 53.777

|  | W | M | T |
|---|---|---|---|
| f | 24.7 | 50.0 | 67.9 |
| FNO | 2.92 | 2.92 | 2.92 |
| 2ω | 85.08 | 45.26 | 33.84 |
| Ymax | 21.60 | 21.60 | 21.60 |
| TL | 139.95 | 154.92 | 168.36 |
| BF | 11.75 | 26.42 | 30.21 |

[Lens Data]

| Surface Number | R | D | nd | νd |
|---|---|---|---|---|
| Object Surface | ∞ | | | |
| 1 | 500.0000 | 2.500 | 1.84666 | 23.80 |
| 2 | 128.5654 | 5.629 | 1.77250 | 49.62 |
| 3 | 1528.3565 | 0.200 | | |
| 4 | 51.0685 | 4.893 | 1.81600 | 46.59 |
| 5 | 84.5957 | D5(Variable) | | |
| 6* | 150.2756 | 2.000 | 1.74389 | 49.53 |
| 7 | 19.5218 | 9.332 | | |
| 8 | −70.5990 | 1.300 | 1.83481 | 42.73 |
| 9 | 68.8663 | 0.377 | | |
| 10 | 44.7171 | 5.665 | 1.78472 | 25.64 |
| 11 | −66.3119 | 4.463 | | |
| 12 | −25.4625 | 1.300 | 1.60300 | 65.44 |
| 13 | −54.4747 | D13(Variable) | | |
| 14 | ∞ | 1.500 | | (Aperture Stop S) |
| 15* | 93.5557 | 2.758 | 1.58913 | 61.15 |
| 16 | 731.3943 | 0.200 | | |
| 17 | 45.8800 | 5.212 | 1.59319 | 67.90 |
| 18 | −126.9127 | D18(Variable) | | |
| 19 | 57.2400 | 1.300 | 1.73800 | 32.33 |
| 20 | 21.3782 | 8.742 | 1.49782 | 82.57 |
| 21 | −52.7685 | D21(Variable) | | |
| 22 | −23.6692 | 1.200 | 1.73800 | 32.33 |
| 23 | −59.4644 | 0.200 | | |
| 24 | 110.3346 | 5.800 | 1.59349 | 67.00 |
| 25 | −32.1046 | 4.444 | | |
| 26 | −114.5585 | 3.326 | 1.74389 | 49.53 |
| 27* | −41.8456 | D27(Variable) | | |
| 28 | −51.0521 | 2.929 | 1.94594 | 17.98 |
| 29 | −33.3238 | 0.200 | | |

TABLE 4-continued

[General Data]

| | | | | |
|---|---|---|---|---|
| 30* | −98.8101 | 1.500 | 1.85108 | 40.12 |
| 31 | 58.4711 | 6.329 | | |
| 32 | −25.4692 | 1.400 | 1.69680 | 55.52 |
| 33 | −42.7921 | BF | | |
| Image Surface | ∞ | | | |

[Aspherical Surface Data]

6th Surface

K = 1.0000, A4 = 4.65692E−06, A6 = −1.64542E−09
A8 = 3.72186E−13, A10 = 4.82369E−15, A12 = 0.00000E+00

15th Surface

K = 1.0000, A4 = −3.70657E−06, A6 = 3.18672E−09
A8 = −1.82835E−11, A10 = 3.59863E−14, A12 = 0.00000E+00

27th Surface

K = 1.0000, A4 = 1.13375E−05, A6 = −1.49475E−08
A8 = 6.38011E−11, A10 = −1.10074E−13, A12 = 0.00000E+00

30th Surface

K = 1.0000, A4 = −5.84233E−06, A6 = −2.49185E−08
A8 = 2.26680E−11, A10 = −7.54165E−14, A12 = 0.00000E+00

[Lens Group Data]

| Group | First surface | Focal length |
|---|---|---|
| G1 | 1 | 136.259 |
| G2 | 6 | −23.493 |
| G3 | 14 | 44.223 |
| G4 | 19 | 90.807 |
| G5 | 22 | 53.777 |
| G6 | 28 | −40.364 |

[Variable Distance Data]

| | W Infinity | M Infinity | T Infinity | W Short-distance | M Short-distance | T Short-distance |
|---|---|---|---|---|---|---|
| D5 | 2.000 | 16.966 | 30.403 | 2.000 | 16.966 | 30.403 |
| D13 | 20.342 | 6.266 | 2.000 | 20.342 | 6.266 | 2.000 |
| D18 | 10.475 | 3.778 | 2.048 | 10.475 | 3.778 | 2.048 |
| D21 | 4.711 | 14.758 | 17.000 | 4.046 | 13.957 | 16.055 |
| D27 | 5.973 | 2.030 | 2.000 | 6.639 | 2.831 | 2.945 |

[Conditional Expression Corresponding Value]

Conditional Expression (1) dP1/f1 = 0.060
Conditional Expression (2) |fP1|/f1 = 11.930
Conditional Expression (3) dP12/f1 = 0.041
Conditional Expression (4) fP12/f1 = 1.331
Conditional Expression (5) fM2w/fLw = −1.330
Conditional Expression (6) fM1w/fM2w = 0.641
Conditional Expression (7) fM1w/fLw = −0.850
Conditional Expression (8) f1/(−f2) = 5.800
Conditional Expression (9) |fF|/ft = 0.792
Conditional Expression (10) nN/nP = 1.160
Conditional Expression (11) vN/vP = 0.392
Conditional Expression (12) f1/|fRw| = 0.382
Conditional Expression (13) 2ωw = 85.08
Conditional Expression (14) BFw/fw = 0.475
Conditional Expression (15) (rR2 + rR1)/(rR2 − rR1) = 3.941

Figure 11C:
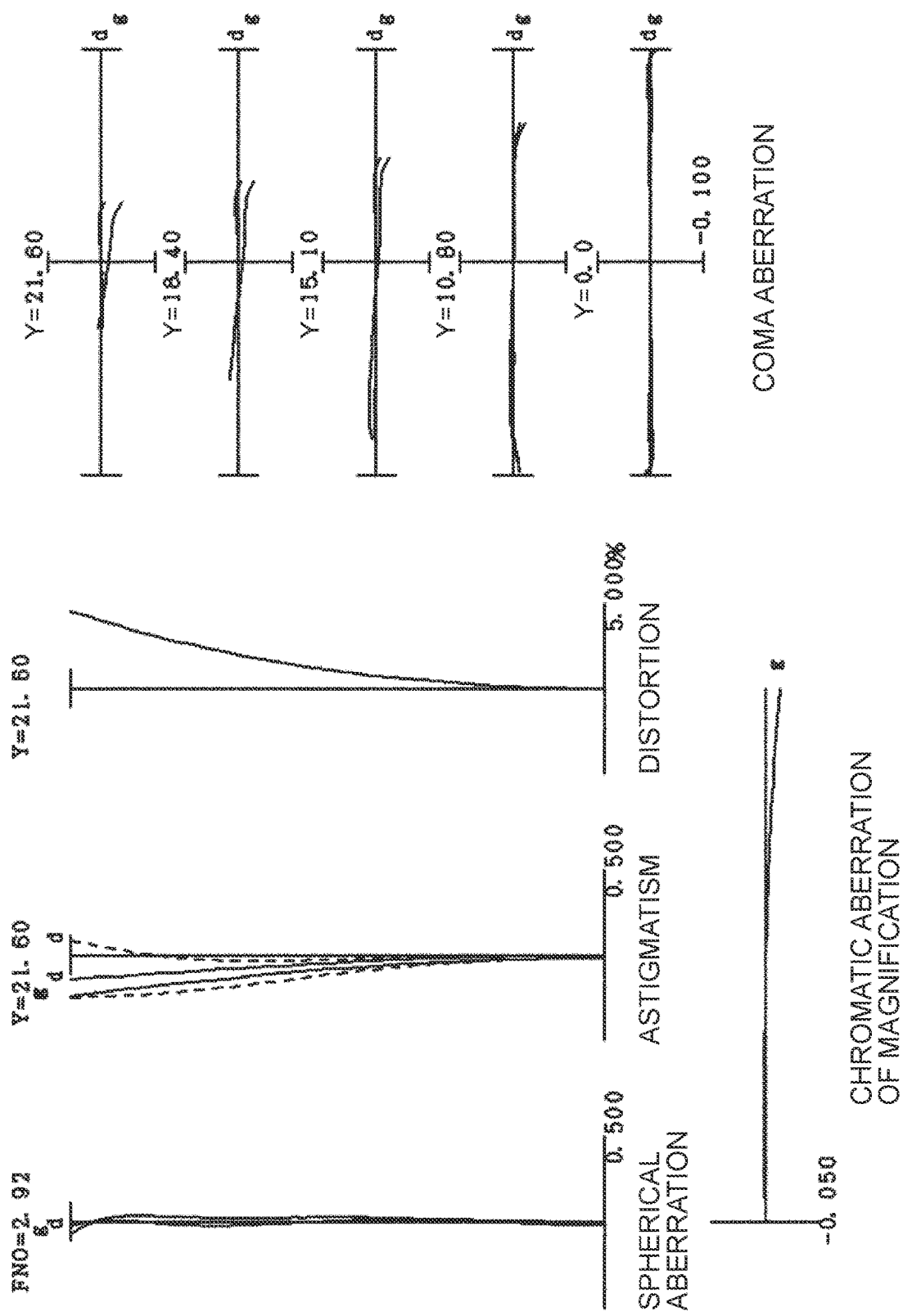
Figure 12A:
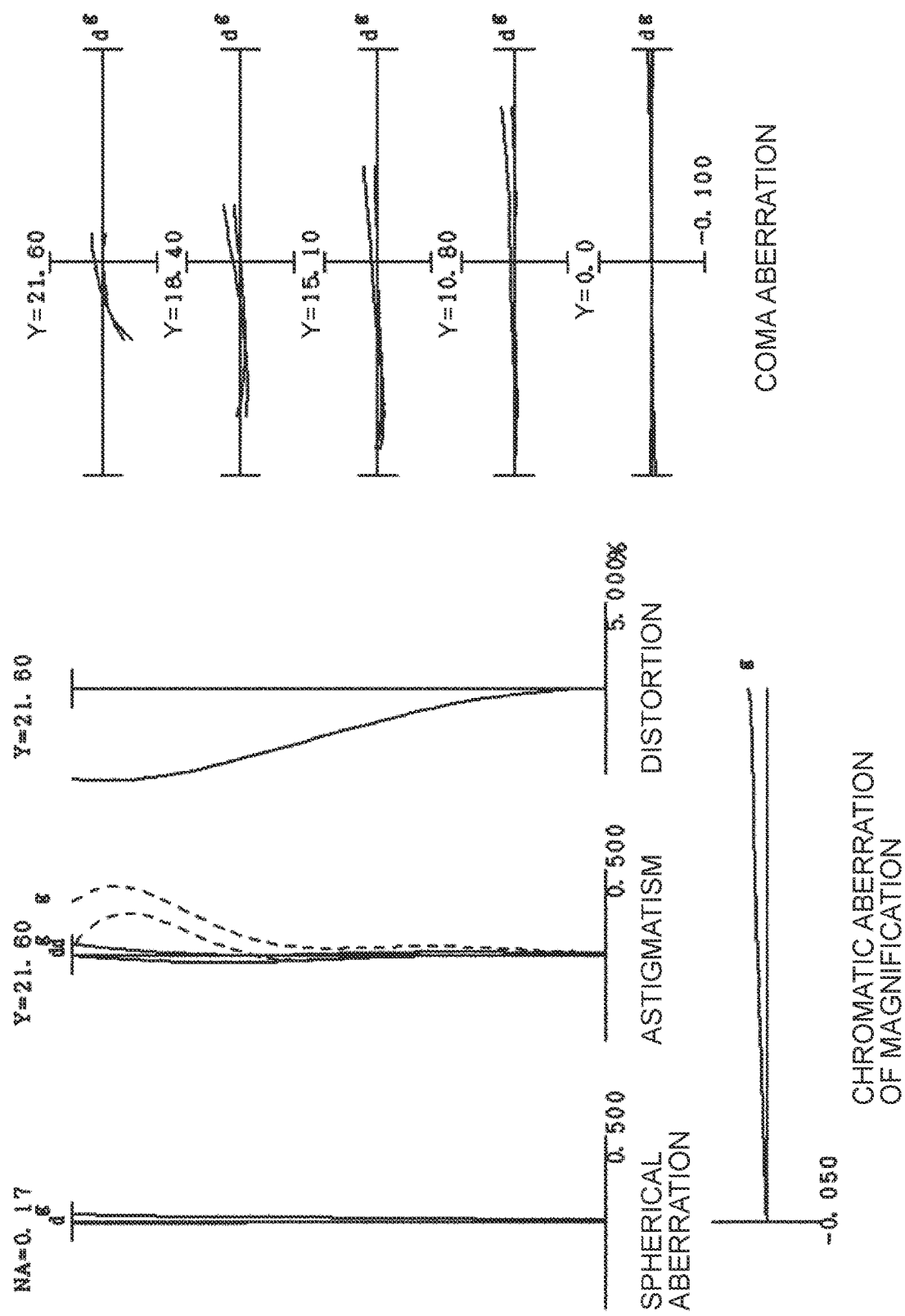

FIGS. 11A, 11B and 11C are graphs respectively showing various aberrations of the zoom optical system according to the fourth example upon focusing on infinity in the wide-angle end state, the intermediate focal length state and the telephoto end state. FIGS. 12A, 12B and 12C are graphs respectively showing various aberrations of the zoom optical system according to the fourth example upon focusing on a short-distance object in the wide-angle end state, the intermediate focal length state and the telephoto end state. The various aberration graphs show that the zoom optical system according to the fourth example favorably corrects the various aberrations from the wide-angle end state to the telephoto end state, has an excellent imaging performance, and also has an excellent imaging performance even upon focusing on a short-distance object.

Fifth Example

Figure 13:
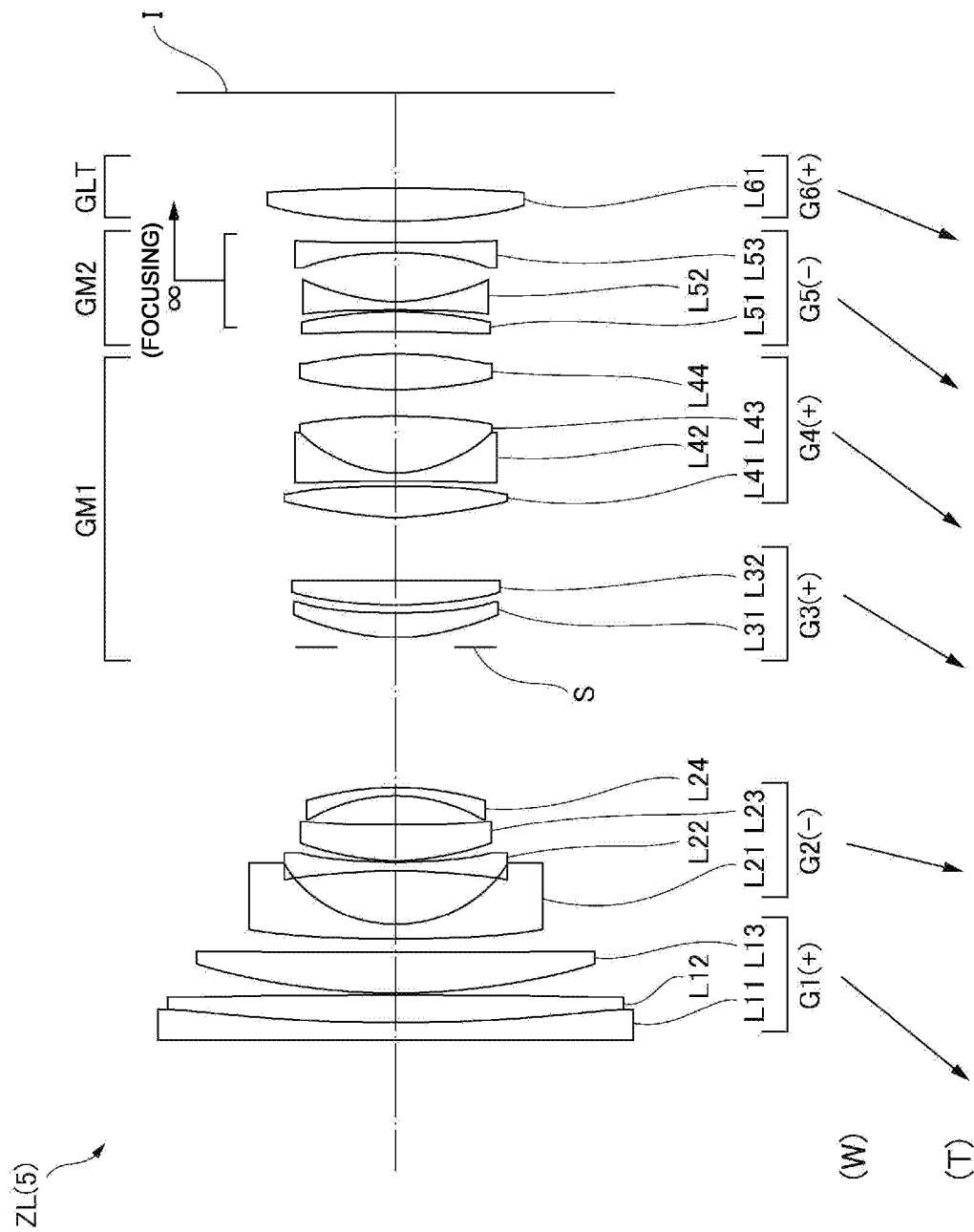
FIG. 13 is a lens configuration diagram of a zoom optical system according to a fifth example.

The fifth example is described with reference to FIGS. 13 to 15 and Table 5. FIG. 13 is a lens configuration diagram of a zoom optical system according to the fifth example. The zoom optical system ZL(5) according to the fifth example consists of, in order from the object: a first lens group G1 having a positive refractive power; a second lens group G2 having a negative refractive power; an aperture stop S; a third lens group G3 having a positive refractive power; a fourth lens group G4 having a positive refractive power; a fifth lens group G5 having a negative refractive power; and a sixth lens group G6 having a positive refractive power. Upon zooming from the wide-angle end state (W) to the telephoto end state (T), the first to sixth lens groups G1 to G6 move in directions respectively indicated by arrows in FIG. 13, and the distances between adjacent lens groups change. A lens group that consists of the third lens group G3 and the fourth lens group G4 corresponds to the first intermediate lens group Gd1. The fifth lens group G5 corresponds to the second intermediate lens group Gd2. The sixth lens group G6 corresponds to the last lens group GLT.

The first lens group G1 consists of, in order from the object: a negative cemented lens that includes a negative meniscus lens L11 having a convex surface facing the object, and a biconvex positive lens L12; and a positive meniscus lens L13 having a convex surface facing the object. The negative meniscus lens L11 corresponds to the 1-1st lens. The positive lens L12 corresponds to the 1-2nd lens.

The second lens group G2 consists of, in order from the object: a negative meniscus lens L21 having a convex surface facing the object; a biconcave negative lens L22; a positive meniscus lens L23 having a convex surface facing the object; and a negative meniscus lens L24 having a concave surface facing the object. The negative meniscus lens L21 has an object-side lens surface that is an aspherical surface.

The third lens group G3 consists of, in order from the object: a positive meniscus lens L31 having a convex surface facing the object; and a biconvex positive lens L32. The aperture stop S is provided on an object-side neighborhood of the third lens group G3, and moves together with the third lens group G3 upon zooming. The positive meniscus lens L31 has an object-side lens surface that is an aspherical surface.

The fourth lens group G4 consists of, in order from the object: a biconvex positive lens L41; a negative cemented lens that includes a biconcave negative lens L42, and a biconvex positive lens L43; and a biconvex positive lens L44. The positive lens L41 has an object-side lens surface that is an aspherical surface. The positive lens L44 has an image-side lens surface that is an aspherical surface.

The fifth lens group G5 consists of, in order from the object: a positive meniscus lens L51 having a concave surface facing the object; a biconcave negative lens L52; and a biconcave negative lens L53. The negative lens L53 has an object-side lens surface that is an aspherical surface.

The sixth lens group G6 consists of a biconvex positive lens L61. An image surface I is disposed on the image side of the sixth lens group G6.

In this example, the fifth lens group G5 is moved toward the image I, thereby focusing from a far-distant object to a short-distance object (from an infinity object to a finite distance object). That is, the fifth lens group G5 corresponds to the focusing lens group.

The following Table 5 lists values of data on the zoom optical system according to the fifth example.

TABLE 5

[General Data]

Zooming ratio 2.75
fRw = −45.339
fP1 = −1413.362
fP12 = 432.427
fM1w = 28.537
fM2w = −24.892

| | W | M | T |
|---|---|---|---|
| f | 24.7 | 50.0 | 67.9 |
| FNO | 2.92 | 2.92 | 2.92 |
| 2ω | 85.16 | 45.24 | 34.12 |
| Ymax | 21.60 | 21.60 | 21.60 |
| TL | 134.73 | 154.61 | 169.45 |
| BF | 13.56 | 26.94 | 34.84 |

[Lens Data]

| Surface Number | R | D | nd | vd |
|---|---|---|---|---|
| Object Surface | ∞ | | | |
| 1 | 10957.4900 | 2.500 | 1.84666 | 23.80 |
| 2 | 273.2507 | 3.923 | 1.59319 | 67.90 |
| 3 | −4164.8091 | 0.200 | | |
| 4 | 97.8909 | 5.850 | 1.81600 | 46.59 |
| 5 | 1686.5488 | D5(Variable) | | |
| 6* | 500.0000 | 2.000 | 1.67798 | 54.89 |
| 7 | 19.6217 | 7.571 | | |
| 8 | −119.4257 | 1.200 | 1.59319 | 67.90 |
| 9 | 74.2767 | 0.211 | | |
| 10 | 36.8572 | 5.028 | 1.85000 | 27.03 |
| 11 | 146.1931 | 4.217 | | |
| 12 | −25.9063 | 1.200 | 1.60300 | 65.44 |
| 13 | −48.3220 | D13(Variable) | | |
| 14 | ∞ | 1.500 | | (Aperture Stop S) |
| 15* | 31.8609 | 3.346 | 1.79504 | 28.69 |
| 16 | 60.3817 | 1.288 | | |
| 17 | 65.3208 | 3.503 | 1.49782 | 82.57 |
| 18 | −22831.8850 | D18(Variable) | | |
| 19* | 52.1943 | 4.361 | 1.82098 | 42.50 |
| 20 | −99.8775 | 0.663 | | |
| 21 | −484.1811 | 1.200 | 1.85478 | 24.80 |
| 22 | 19.0497 | 8.079 | 1.49782 | 82.57 |
| 23 | −86.9834 | 3.675 | | |
| 24 | 61.0249 | 5.155 | 1.80604 | 40.74 |
| 25* | −60.8291 | D25(Variable) | | |
| 26 | −310.5249 | 2.912 | 1.94594 | 17.98 |
| 27 | −59.5174 | 0.200 | | |
| 28 | −155.6589 | 1.200 | 1.77250 | 49.62 |
| 29 | 30.4299 | 6.880 | | |
| 30* | −54.7368 | 1.300 | 1.95150 | 29.83 |
| 31 | 317.1233 | D31(Variable) | | |
| 32 | 72.1520 | 4.819 | 1.83481 | 42.73 |
| 33 | −315.4491 | BF | | |
| Image Surface | ∞ | | | |

[Aspherical Surface Data]

6th Surface

K = 1.0000, A4 = 5.57412E−06, A6 = −5.71627E−09
A8 = 9.08385E−12, A10 = −4.74214E−15, A12 = 0.00000E+00

15th Surface

K = 1.0000, A4 = −5.90450E−06, A6 = 3.98445E−09
A8 = −4.29920E−11, A10 = 9.10161E−14, A12 = 0.00000E+00

TABLE 5-continued

[General Data]

19th Surface

K = 1.0000, A4 = −5.71112E−06, A6 = −6.16170E−10
A8 = 2.42198E−11, A10 = −5.71940E−14, A12 = 0.00000E+00

25th Surface

K = 1.0000, A4 = 2.37352E−06, A6 = −6.63258E−09
A8 = −2.39696E−11, A10 = 1.99908E−14, A12 = 0.00000E+00

30th Surface

K = 1.0000, A4 = −6.17314E−06, A6 = −3.26346E−08
A8 = 1.32620E−10, A10 = −6.33629E−13, A12 = 0.00000E+00

[Lens Group Data]

| Group | First surface | Focal length |
|---|---|---|
| G1 | 1 | 139.410 |
| G2 | 6 | −23.353 |
| G3 | 14 | 51.116 |
| G4 | 19 | 31.271 |
| G5 | 26 | −24.892 |
| G6 | 32 | 70.741 |

[Variable Distance Data]

| | W Infinity | M Infinity | T Infinity | W Short-distance | M Short-distance | T Short-distance |
|---|---|---|---|---|---|---|
| D5 | 2.000 | 21.443 | 31.758 | 2.000 | 21.443 | 31.758 |
| D13 | 19.908 | 6.376 | 2.000 | 19.908 | 6.376 | 2.000 |
| D18 | 9.100 | 3.184 | 2.000 | 9.100 | 3.184 | 2.000 |
| D25 | 3.162 | 2.189 | 2.000 | 3.569 | 2.602 | 2.454 |
| D31 | 3.023 | 10.499 | 12.881 | 2.616 | 10.087 | 12.426 |

[Conditional Expression Corresponding Value]

Conditional Expression (1) dP1/f1 = 0.046
Conditional Expression (2) |fP1|/f1 = 10.140
Conditional Expression (3) dP12/f1 = 0.028
Conditional Expression (4) fP12/f1 = 3.102
Conditional Expression (5) fM2w/fLw = −0.350
Conditional Expression (6) fM1w/fM2w = 1.146
Conditional Expression (7) fM1w/fLw = 0.403
Conditional Expression (8) f1/(−f2) = 5.970
Conditional Expression (9) |fF|/ft = 0.367
Conditional Expression (10) nN/nP = 1.238
Conditional Expression (11) vN/vP = 0.300
Conditional Expression (12) f1/|fRw| = 3.075
Conditional Expression (13) 2ωw = 85.16
Conditional Expression (14) BFw/fw = 0.548
Conditional Expression (16) (rR2 + rR1)/(rR2 − rR1) = 0.628

Figure 15B:
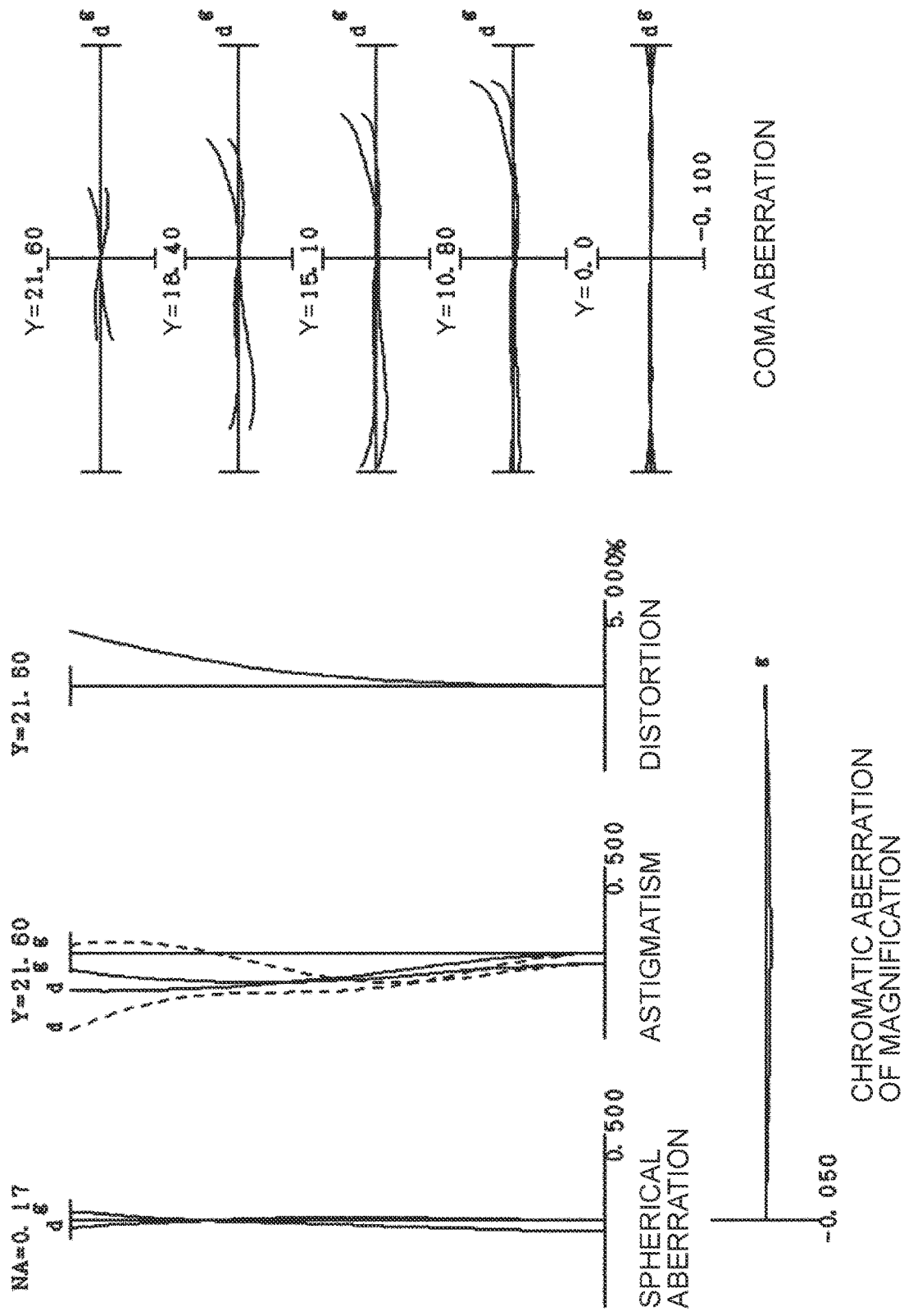

FIGS. 14A, 14B and 14C are graphs respectively showing various aberrations of the zoom optical system according to the fifth example upon focusing on infinity in the wide-angle end state, the intermediate focal length state and the telephoto end state. FIGS. 15A, 15B and 15C are graphs respectively showing various aberrations of the zoom optical system according to the fifth example upon focusing on a short-distance object in the wide-angle end state, the intermediate focal length state and the telephoto end state. The various aberration graphs show that the zoom optical system according to the fifth example favorably corrects the various aberrations from the wide-angle end state to the telephoto end state, has an excellent imaging performance, and also has an excellent imaging performance even upon focusing on a short-distance object.

Sixth Example

Figure 16:
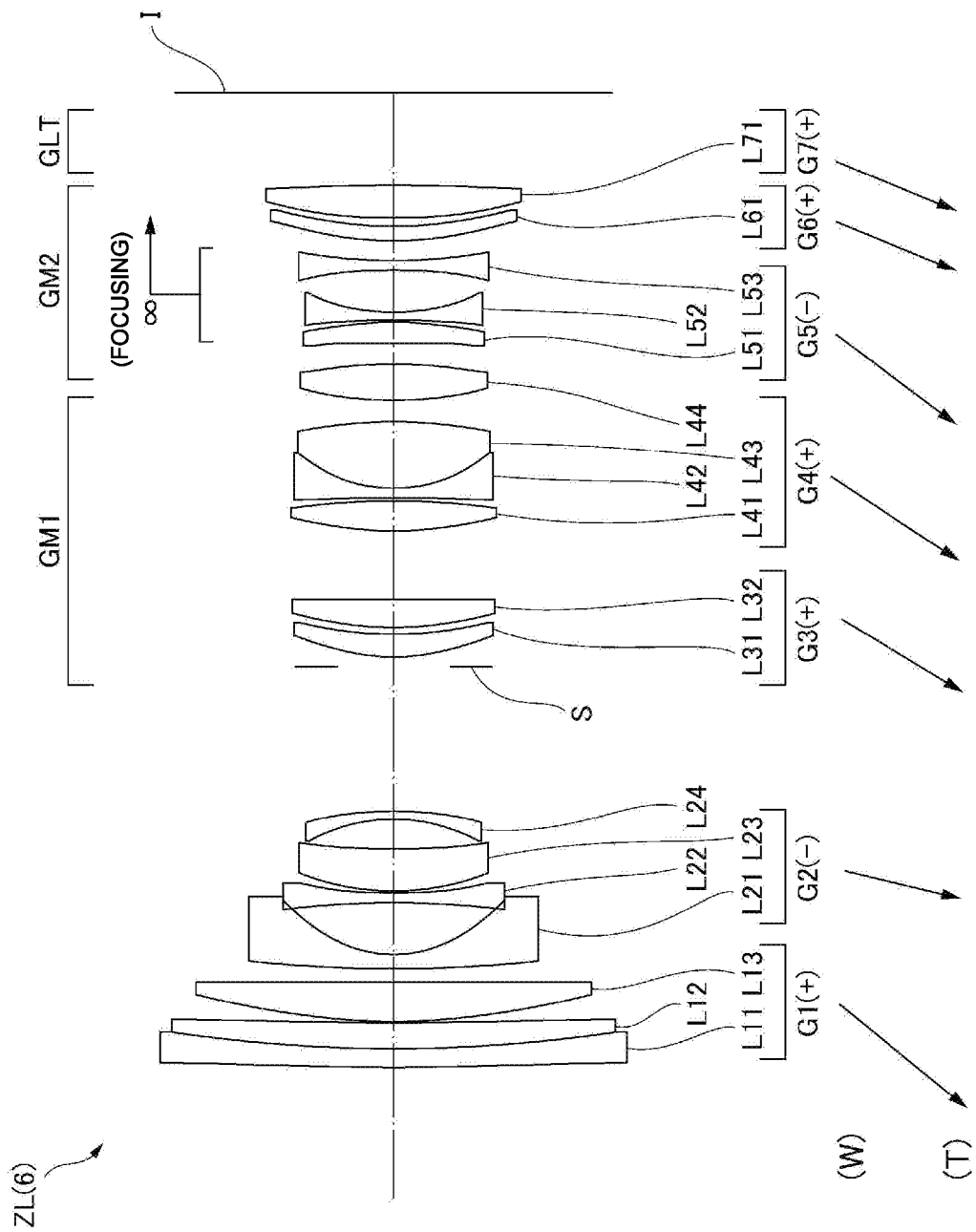
FIG. 16 is a lens configuration diagram of a zoom optical system according to a sixth example.

The sixth example is described with reference to FIGS. 16 to 18 and Table 6. FIG. 16 is a lens configuration diagram of a zoom optical system according to the sixth example. The zoom optical system ZL(6) according to the sixth example consists of, in order from the object: a first lens group G1 having a positive refractive power; a second lens group G2 having a negative refractive power; an aperture stop S; a third lens group G3 having a positive refractive power; a fourth lens group G4 having a positive refractive power; a fifth lens group G5 having a negative refractive power; a sixth lens group G6 having a positive refractive power; and a seventh lens group G7 having a positive refractive power. Upon zooming from the wide-angle end state (W) to the telephoto end state (T), the first to seventh lens groups G1 to G7 move in directions respectively indicated by arrows in FIG. 16, and the distances between adjacent lens groups change. A lens group that consists of the third lens group G3 and the fourth lens group G4 corresponds to the first intermediate lens group H41. A lens group that consists of the fifth lens group G5 and the sixth lens group G6 corresponds to the second intermediate lens group GM2. The seventh lens group G7 corresponds to the last lens group GLT.

The first lens group G1 consists of: a negative cemented lens that includes a negative meniscus lens L11 having a convex surface facing the object, and a positive meniscus lens L12 having a convex surface facing the object; and a positive meniscus lens L13 having a convex surface facing the object, the lenses being disposed in order from the object. The negative meniscus lens L11 corresponds to the 1-1st lens. The positive meniscus lens L12 corresponds to the 1-2nd lens.

The second lens group G2 consists of, in order from the object: a negative meniscus lens L21 having a convex surface facing the object; a biconcave negative lens L22; a positive meniscus lens L23 having a convex surface facing the object; and a negative meniscus lens L24 having a concave surface facing the object. The negative meniscus lens L21 has an object-side lens surface that is an aspherical surface.

The third lens group G3 consists of, in order from the object: a positive meniscus lens L31 having a convex surface facing the object; and a biconvex positive lens L32. The aperture stop S is provided on an object-side neighborhood of the third lens group G3, and moves together with the third lens group G3 upon zooming. The positive meniscus lens L31 has an object-side lens surface that is an aspherical surface.

The fourth lens group G4 consists of, in order from the object: a biconvex positive lens L41; a negative cemented lens that includes a biconcave negative lens L42, and a biconvex positive lens L43; and a biconvex positive lens L44. The positive lens L41 has an object-side lens surface that is an aspherical surface. The positive lens L44 has an image-side lens surface that is an aspherical surface.

The fifth lens group G5 consists of, in order from the object: a positive meniscus lens L51 having a concave surface facing the object; a biconcave negative lens L52; and a biconcave negative lens L53. The negative lens L53 has an object-side lens surface that is an aspherical surface.

The sixth lens group G6 consists of a positive meniscus lens L61 having a convex surface facing the object.

The seventh lens group G7 consists of a biconvex positive lens L71. An image surface I is disposed on the image side of the seventh lens group G7.

In this example, the fifth lens group G5 is moved toward the image I, thereby focusing from a far-distant object to a short-distance object (from an infinity object to a finite distance object). That is, the fifth lens group G5 corresponds to the focusing lens group.

The following Table 6 lists values of data on the zoom optical system according to the sixth example.

TABLE 6

[General Data]

Zooming ratio 2.74
fRw = −40.687
fP1 = −1748.072
fP12 = 431.152
fM1w = 28.592
fM2w = −24.147

|  | W | M | T |
|---|---|---|---|
| f | 24.8 | 50.0 | 67.9 |
| FNO | 2.96 | 2.98 | 2.99 |
| 2ω | 85.16 | 45.20 | 34.12 |
| Ymax | 21.60 | 21.60 | 21.60 |
| TL | 138.57 | 158.72 | 174.45 |
| BF | 13.13 | 25.93 | 34.76 |

[Lens Data]

| Surface Number | R | D | nd | vd |
|---|---|---|---|---|
| Object Surface | ∞ | | | |
| 1 | 800.0000 | 2.500 | 1.84666 | 23.80 |
| 2 | 214.4014 | 3.846 | 1.59319 | 67.90 |
| 3 | 1317.1215 | 0.200 | | |
| 4 | 112.4262 | 5.452 | 1.81600 | 46.59 |
| 5 | 6769.9563 | D5(Variable) | | |
| 6* | 500.0000 | 2.000 | 1.67798 | 54.89 |
| 7 | 20.1483 | 7.488 | | |
| 8 | −122.7141 | 1.200 | 1.59319 | 67.90 |
| 9 | 65.7886 | 0.272 | | |
| 10 | 36.9186 | 6.199 | 1.85000 | 27.03 |
| 11 | 167.8314 | 4.151 | | |
| 12 | −26.0907 | 1.200 | 1.60300 | 65.44 |
| 13 | −47.5468 | D13(Variable) | | |
| 14 | ∞ | 1.500 | | (Aperture Stop S) |
| 15* | 34.4078 | 3.172 | 1.79504 | 28.69 |
| 16 | 61.0992 | 1.040 | | |
| 17 | 57.2334 | 3.808 | 1.49782 | 82.57 |
| 18 | −5887.8063 | D18(Variable) | | |
| 19* | 56.4489 | 4.200 | 1.82098 | 42.50 |
| 20 | −110.1792 | 0.505 | | |
| 21 | −291.5983 | 1.200 | 1.85478 | 24.80 |
| 22 | 21.3003 | 9.632 | 1.49782 | 82.57 |
| 23 | −65.8810 | 3.027 | | |
| 24 | 55.5374 | 5.156 | 1.80604 | 40.74 |
| 25* | −64.8934 | D25(Variable) | | |
| 26 | −368.5041 | 2.887 | 1.94594 | 17.98 |
| 27 | −62.4504 | 0.200 | | |
| 28 | −158.4306 | 1.200 | 1.77250 | 49.62 |
| 29 | 31.1763 | 6.060 | | |
| 30* | −91.4544 | 1.300 | 1.95150 | 29.83 |
| 31 | 81.4249 | D31(Variable) | | |
| 32 | 57.0897 | 2.149 | 1.80518 | 25.45 |
| 33 | 69.0085 | D33(Variable) | | |
| 34 | 73.7084 | 4.702 | 1.64000 | 60.19 |
| 35 | −314.5384 | BF | | |
| Image Surface | ∞ | | | |

[Aspherical Surface Data]

6th Surface

K = 1.0000, A4 = 4.89442E−06, A6 = −5.03173E−09
A8 = 9.04508E−12, A10 = −5.83062E−15, A12 = 0.00000E+00

TABLE 6-continued

[General Data]

15th Surface

K = 1.0000, A4 = −5.12384E−06, A6 = 3.61548E−09
A8 = −3.66003E−11, A10 = 7.76731E−14, A12 = 0.00000E+00
19th Surface K = 1.0000, A4 = −5.21485E−06, A6 = −8.93869E−10
A8 = 2.28848E−11, A10 = −5.34780E−14, A12 = 0.00000E+00
25th Surface K = 1.0000, A4 = 3.45860E−06, A6 = −6.25344E−09
A8 = −1.37950E−11, A10 = 2.51017E−14, A12 = 0.00000E+00
30th Surface K = 1.0000, A4 = −6.74203E−06, A6 = −2.42770E−08
A8 = 5.92492E−11, A10 = −3.49332E−13, A12 = 0.00000E+00

[Lens Group Data]

| Group | First surface | Focal length |
|---|---|---|
| G1 | 1 | 152.425 |
| G2 | 6 | −24.007 |
| G3 | 14 | 52.775 |
| G4 | 19 | 30.001 |
| G5 | 26 | −24.147 |
| G6 | 32 | 379.967 |
| G7 | 34 | 93.748 |

[Variable Distance Data]

| | W Infinity | M Infinity | T Infinity | W Short-distance | M Short-distance | T Short-distance |
|---|---|---|---|---|---|---|
| D5 | 2.000 | 22.083 | 33.118 | 2.000 | 22.083 | 33.118 |
| D13 | 20.464 | 6.484 | 2.000 | 20.464 | 6.484 | 2.000 |
| D18 | 9.842 | 3.320 | 2.000 | 9.842 | 3.320 | 2.000 |
| D25 | 2.978 | 2.225 | 2.053 | 3.339 | 2.586 | 2.447 |
| D31 | 2.915 | 10.198 | 13.200 | 2.555 | 9.837 | 12.806 |
| D33 | 1.000 | 2.234 | 1.084 | 1.000 | 2.234 | 1.084 |

[Conditional Expression Corresponding Value]

Conditional Expression (1) dP1/f1 = 0.042
Conditional Expression (2) |fP1|/f1 = 11.470
Conditional Expression (3) dP12/f1 = 0.025
Conditional Expression (4) fP12/f1 = 2.829
Conditional Expression (5) fM2w/fLw = −0.320
Conditional Expression (6) fM1w/fM2w = 1.184
Conditional Expression (7) fM1w/fLw = 0.374
Conditional Expression (8) f1/(−f2) = 6.349
Conditional Expression (9) |fF|/ft = 0.356
Conditional Expression (10) nN/nP = 1.238
Conditional Expression (11) vN/vP = 0.300
Conditional Expression (12) f1/|fRw| = 3.746
Conditional Expression (13) 2ωw = 85.16
Conditional Expression (14) BFw/fw = 0.530
Conditional Expression (16) (rR2 + rR1)/(rR2 − rR1) = 0.620

Figure 17C:
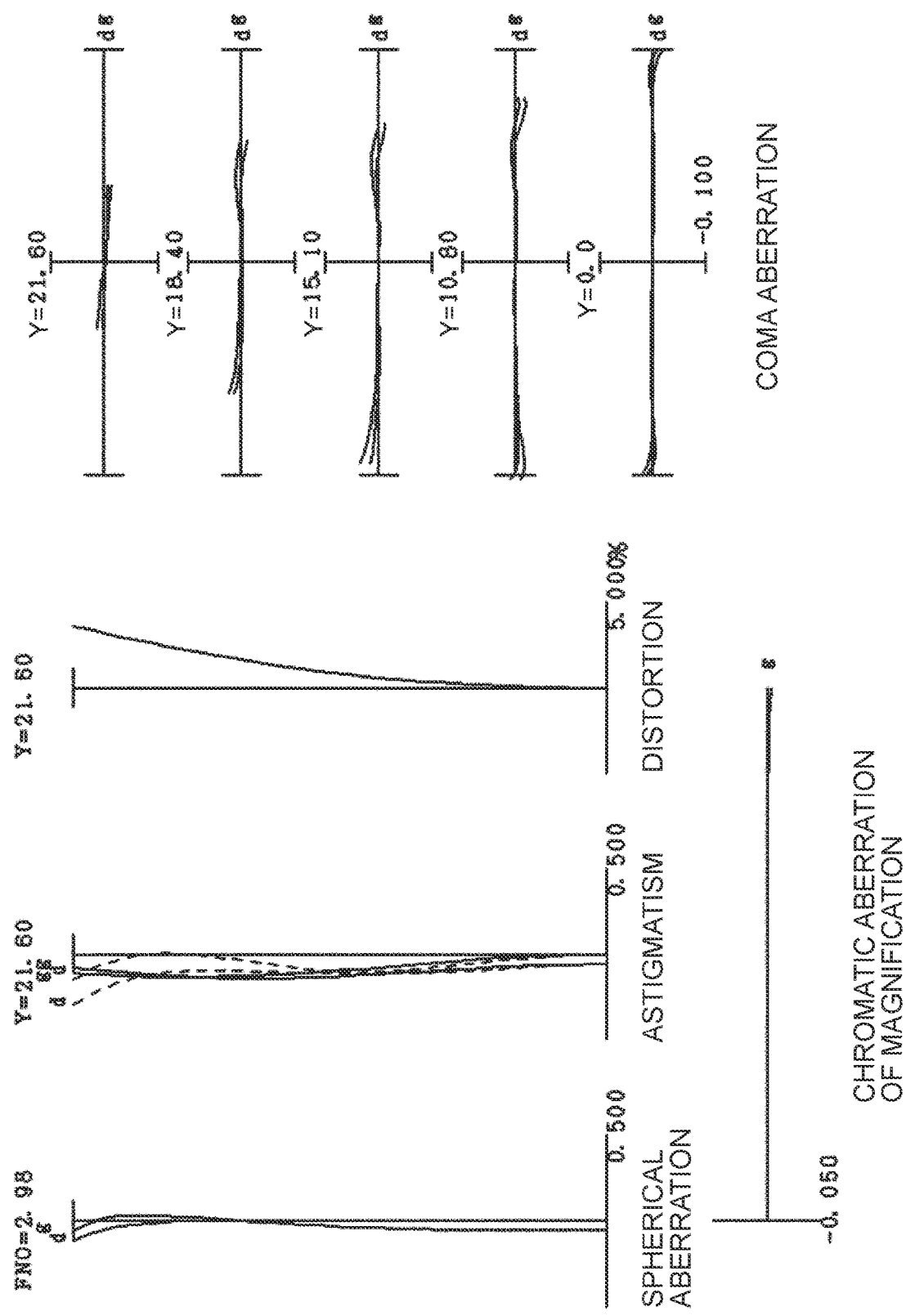
Figure 18A:
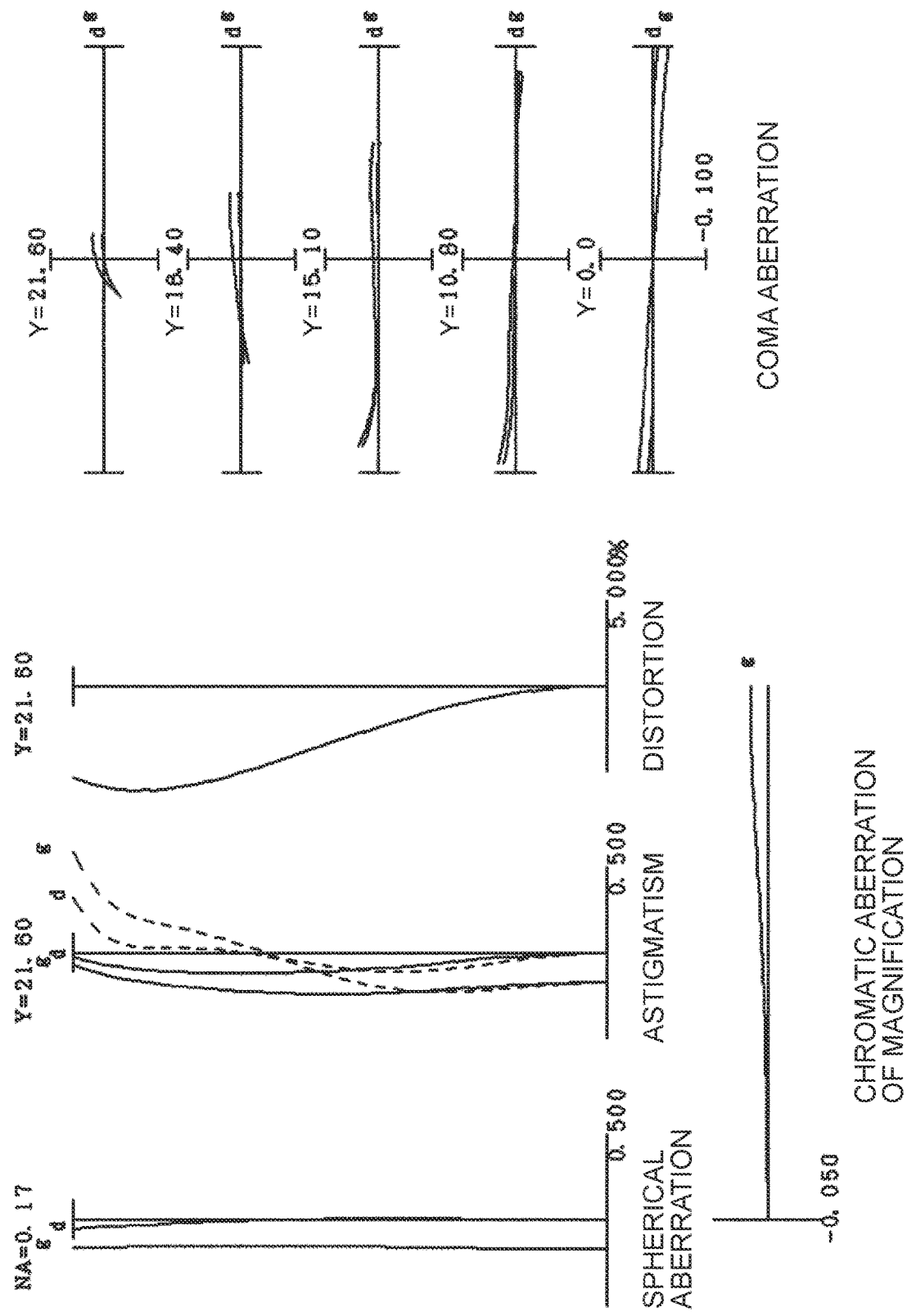
Figure 18B:
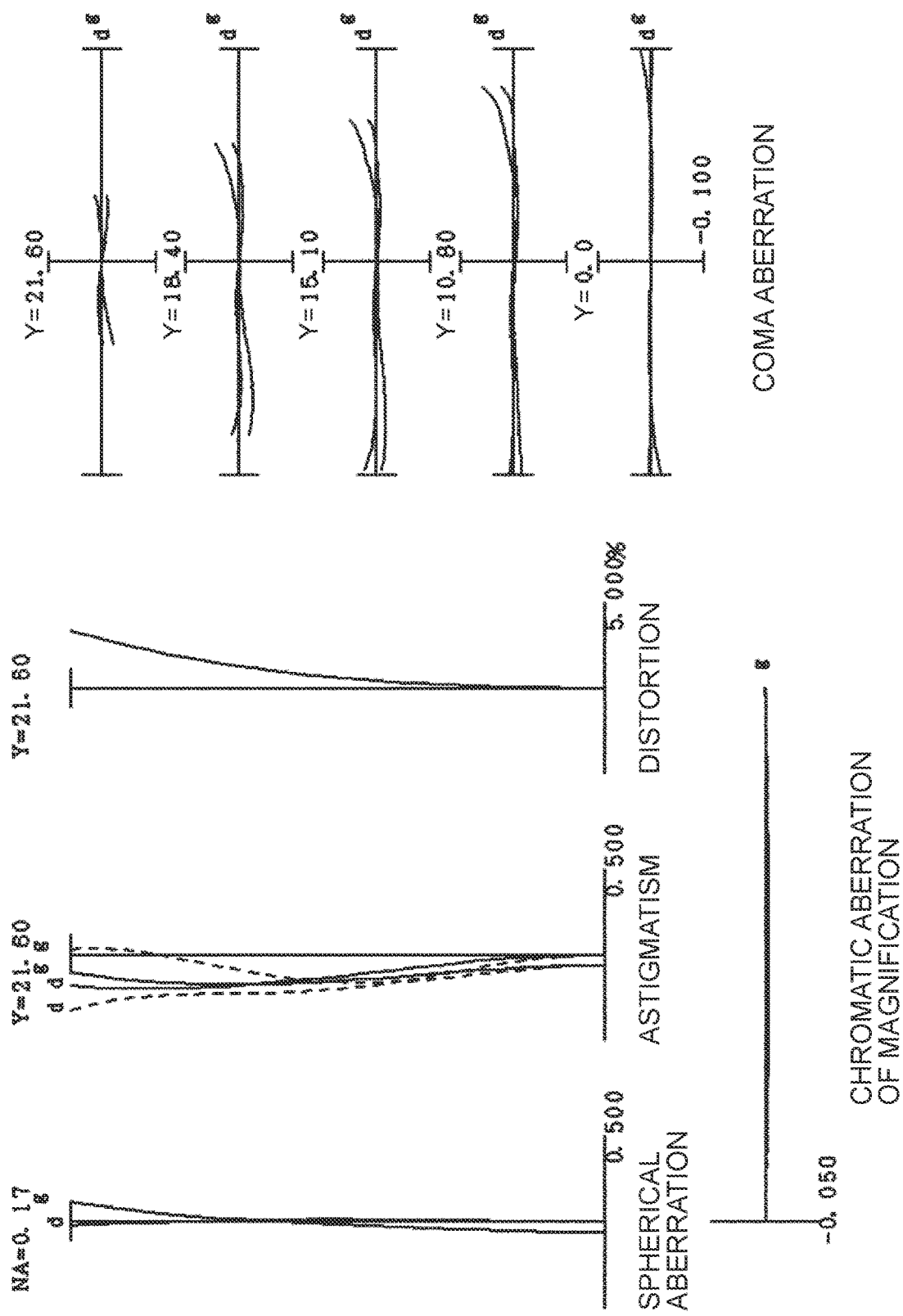

FIGS. 17A, 17B and 17C are graphs respectively showing various aberrations of the zoom optical system according to the sixth example upon focusing on infinity in the wide-angle end state, the intermediate focal length state and the telephoto end state. FIGS. 18A, 18B and 18C are graphs respectively showing various aberrations of the zoom optical system according to the sixth example upon focusing on a short-distance object in the wide-angle end state, the intermediate focal length state and the telephoto end state. The various aberration graphs show that the zoom optical system according to the sixth example favorably corrects the various aberrations from the wide-angle end state to the telephoto end state, has an excellent imaging performance, and also has an excellent imaging performance even upon focusing on a short-distance object.

Seventh Example

Figure 19:
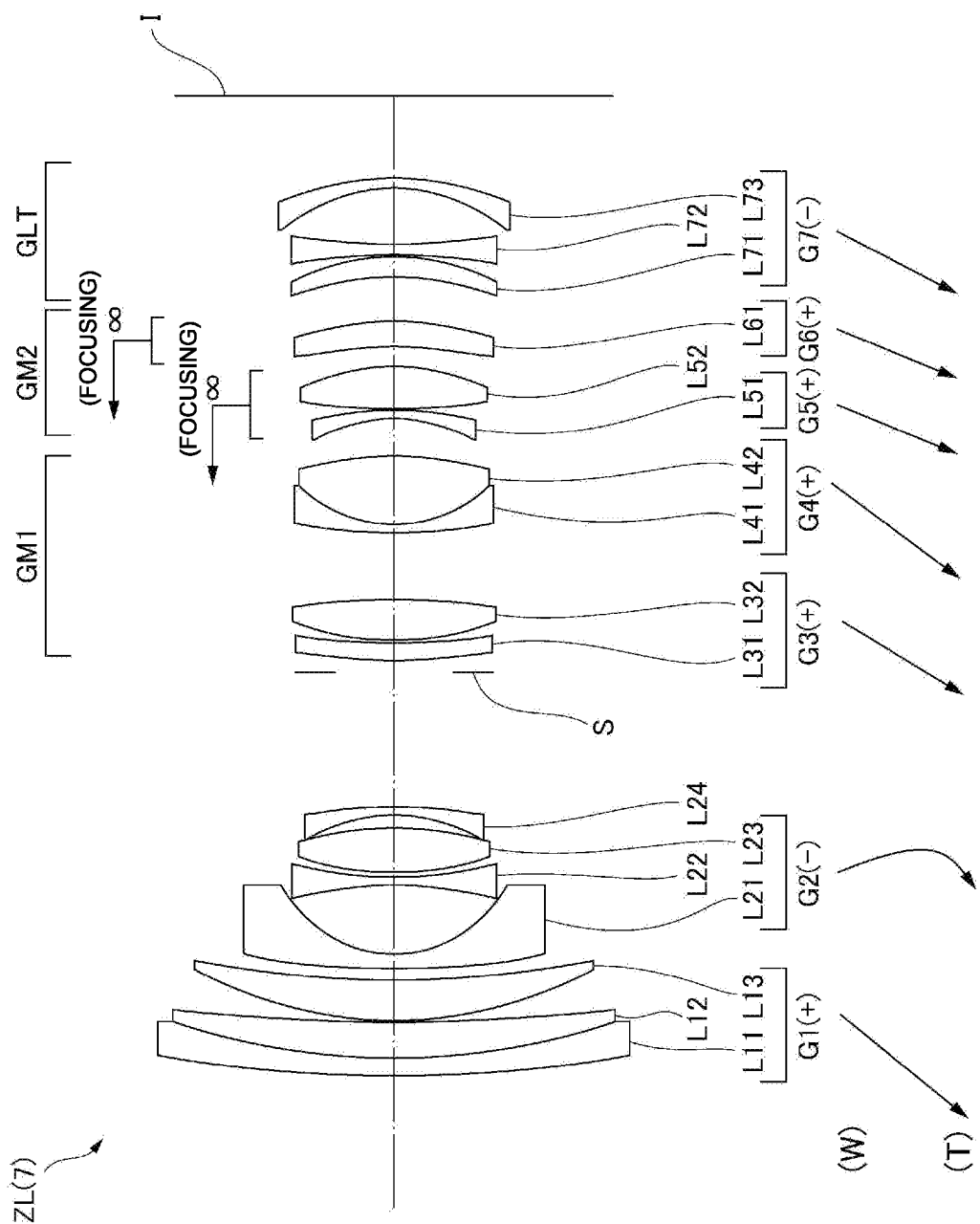
FIG. 19 is a lens configuration diagram of a zoom optical system according to a seventh example.

The seventh example is described with reference to FIGS. 19 to 21 and Table 7. FIG. 19 is a lens configuration diagram of a zoom optical system according to the seventh example. The zoom optical system ZL(7) according to the seventh example consists of, in order from the object: a first lens group G1 having a positive refractive power; a second lens group G2 having a negative refractive power; an aperture stop S; a third lens group G3 having a positive refractive power; a fourth lens group G4 having a positive refractive power; a fifth lens group G5 having a positive refractive power; a sixth lens group G6 having a positive refractive power; and a seventh lens group G7 having a negative refractive power. Upon zooming from the wide-angle end state (W) to the telephoto end state (T), the first to seventh lens groups G1 to G7 move in directions respectively indicated by arrows in FIG. 19, and the distances between adjacent lens groups change. A lens group that consists of the third lens group G3 and the fourth lens group G4 corresponds to the first intermediate lens group H41. A lens group that consists of the fifth lens group G5 and the sixth lens group G6 corresponds to the second intermediate lens group Gd2. The seventh lens group G7 corresponds to the last lens group GLT.

The first lens group G1 consists of, in order from the object: a positive cemented lens that includes a negative meniscus lens L11 having a convex surface facing the object, and a positive meniscus lens L12 having a convex surface facing the object; and a positive meniscus lens L13 having a convex surface facing the object. The negative meniscus lens L11 corresponds to the 1-1st lens. The positive meniscus lens L12 corresponds to the 1-2nd lens.

The second lens group G2 consists of, in order from the object: a negative meniscus lens L21 having a convex surface facing the object; a biconcave negative lens L22; a biconvex positive lens L23; and a negative meniscus lens L24 having a concave surface facing the object. The negative meniscus lens L21 has an object-side lens surface that is an aspherical surface.

The third lens group G3 consists of, in order from the object: a positive meniscus lens L31 having a convex surface facing the object; and a biconvex positive lens L32. The aperture stop S is provided on an object-side neighborhood of the third lens group G3, and moves together with the third lens group G3 upon zooming. The positive meniscus lens L31 has an object-side lens surface that is an aspherical surface.

The fourth lens group G4 consists of a positive cemented lens that includes a negative meniscus lens L41 having a convex surface facing the object, and a biconvex positive lens L42.

The fifth lens group G5 consists of, in order from the object: a negative meniscus lens L51 having a concave surface facing the object; and a biconvex positive lens L52.

The sixth lens group G6 consists of a positive meniscus lens L61 having a concave surface facing the object. The positive meniscus lens L61 has an image-side lens surface that is an aspherical surface.

The seventh lens group G7 consists of, in order from the object: a positive meniscus lens L71 having a concave surface facing the object; a biconcave negative lens L72; and a negative meniscus lens L73 having a concave surface facing the object. An image surface I is disposed on the image side of the seventh lens group G7. The negative lens L72 has an object-side lens surface that is an aspherical surface.

In this example, the fifth lens group G5 and the sixth lens group G6 are independently moved toward the object, thereby focusing from a far-distant object to a short-distance object (from an infinity object to a finite distance object). That is, the fifth lens group G5 corresponds to the first focusing lens group, and the sixth lens group G6 corresponds to the second focusing lens group.

The following Table 7 lists values of data on the zoom optical system according to the seventh example.

TABLE 7

[General Data]

Zooming ratio 2.74
fRw = 4055.914
fP1 = 1097.558
fP12 = 197.667
fM1w = 34.697
fM2w = 54.516

|  | W | M | T |
|---|---|---|---|
| f | 24.8 | 50.0 | 67.9 |
| FNO | 2.92 | 2.92 | 2.92 |
| 2ω | 85.10 | 45.24 | 33.84 |
| Ymax | 21.60 | 21.60 | 21.60 |
| TL | 139.31 | 158.27 | 168.76 |
| BF | 11.75 | 23.48 | 28.76 |

[Lens Data]

| Surface Number | R | D | nd | vd |
|---|---|---|---|---|
| Object Surface | ∞ |  |  |  |
| 1 | 189.0188 | 2.500 | 1.84666 | 23.80 |
| 2 | 98.2637 | 5.200 | 1.75500 | 52.33 |
| 3 | 281.1360 | 0.200 |  |  |
| 4 | 58.7593 | 5.700 | 1.77250 | 49.62 |
| 5 | 135.0000 | D5(Variable) |  |  |
| 6* | 221.1138 | 2.000 | 1.74389 | 49.53 |
| 7 | 18.6091 | 9.662 |  |  |
| 8 | −58.7660 | 1.300 | 1.77250 | 49.62 |
| 9 | 58.7660 | 0.506 |  |  |
| 10 | 39.8268 | 6.400 | 1.72825 | 28.38 |
| 11 | −48.5880 | 1.773 |  |  |
| 12 | −26.6513 | 1.300 | 1.61800 | 63.34 |
| 13 | −70.7180 | D13(Variable) |  |  |
| 14 | ∞ | 1.702 |  | (Aperture Stop S) |
| 15* | 71.3000 | 2.500 | 1.69370 | 53.32 |
| 16 | 121.5261 | 0.202 |  |  |
| 17 | 38.6117 | 5.900 | 1.59319 | 67.90 |
| 18 | −111.3842 | D18(Variable) |  |  |
| 19 | 66.4297 | 1.300 | 1.73800 | 32.33 |
| 20 | 19.7070 | 9.700 | 1.49782 | 82.57 |
| 21 | −49.1811 | D21(Variable) |  |  |
| 22 | −23.7160 | 1.200 | 1.72047 | 34.71 |
| 23 | −55.5303 | 0.200 |  |  |
| 24 | 103.5406 | 5.980 | 1.59349 | 67.00 |
| 25 | −32.7186 | D25(Variable) |  |  |
| 26 | −75.1626 | 3.736 | 1.79189 | 45.04 |
| 27* | −39.1303 | D27(Variable) |  |  |
| 28 | −44.6016 | 3.000 | 1.94594 | 17.98 |
| 29 | −32.9994 | 0.201 |  |  |
| 30* | −101.4301 | 1.500 | 1.85207 | 40.15 |
| 31 | 85.4850 | 7.927 |  |  |
| 32 | −25.8904 | 1.400 | 1.58913 | 61.22 |
| 33 | −45.0397 | BF |  |  |
| Image Surface | ∞ |  |  |  |

TABLE 7-continued

[General Data]

[Aspherical Surface Data]

6th Surface

K = 1.0000, A4 = 5.47971E−06, A6 = −6.22095E−09
A8 = 1.44104E−11, A10 = −2.08855E−14, A12 = 2.01910E−17

15th Surface

K = 1.0000, A4 = −4.50985E−06, A6 = 2.81159E−10
A8 = −2.63745E−12, A10 = −4.80538E−15, A12 = 0.00000E+00

27th Surface

K = 1.0000, A4 = 1.09182E−05, A6 = −2.25976E−08
A8 = 1.43325E−10, A10 = −4.96895E−13, A12 = 6.77820E−16

30th Surface

K = 1.0000, A4 = −2.19229E−06, A6 = −2.44256E−08
A8 = 6.38954E−11, A10 = −1.65927E−13, A12 = 0.00000E+00

[Lens Group Data]

| Group | First surface | Focal length |
|---|---|---|
| G1 | 1 | 118.121 |
| G2 | 6 | −21.898 |
| G3 | 14 | 41.497 |
| G4 | 19 | 109.585 |
| G5 | 22 | 123.527 |
| G6 | 26 | 98.560 |
| G7 | 28 | −47.807 |

[Variable Distance Data]

|  | W Infinity | M Infinity | T Infinity | W Short-distance | M Short-distance | T Short-distance |
|---|---|---|---|---|---|---|
| D5 | 1.800 | 21.061 | 29.930 | 1.800 | 21.061 | 29.930 |
| D13 | 19.119 | 6.127 | 2.000 | 19.119 | 6.127 | 2.000 |
| D18 | 9.354 | 3.967 | 1.500 | 9.354 | 3.967 | 1.500 |
| D21 | 5.286 | 14.229 | 18.845 | 4.337 | 12.953 | 17.517 |
| D25 | 2.861 | 3.580 | 2.713 | 3.291 | 4.145 | 3.115 |
| D27 | 6.143 | 2.841 | 2.028 | 6.662 | 3.552 | 2.955 |

[Conditional Expression Corresponding Value]

Conditional Expression (1) dP1/f1 = 0.065
Conditional Expression (2) |fP1|/f1 = 9.292
Conditional Expression (3) dP12/f1 = 0.044
Conditional Expression (4) fP12/f1 = 1.673
Conditional Expression (5) fM2w/fLw = −1.140
Conditional Expression (6) fM1w/fM2w = 0.636
Conditional Expression (7) fM1w/fLw = −0.730
Conditional Expression (8) f1/(−f2) = 5.394
Conditional Expression (9) |fF|/ft = 1.819
Conditional Expression (10) nN/nP = 1.160
Conditional Expression (11) vN/vP = 0.392
Conditional Expression (12) f1/|fRw| = 0.029
Conditional Expression (13) 2ωw = 85.10
Conditional Expression (14) BFw/fw = 0.475
Conditional Expression (15) (rR2 + rR1)/(rR2 − rR1) = 3.704

Figure 20B:
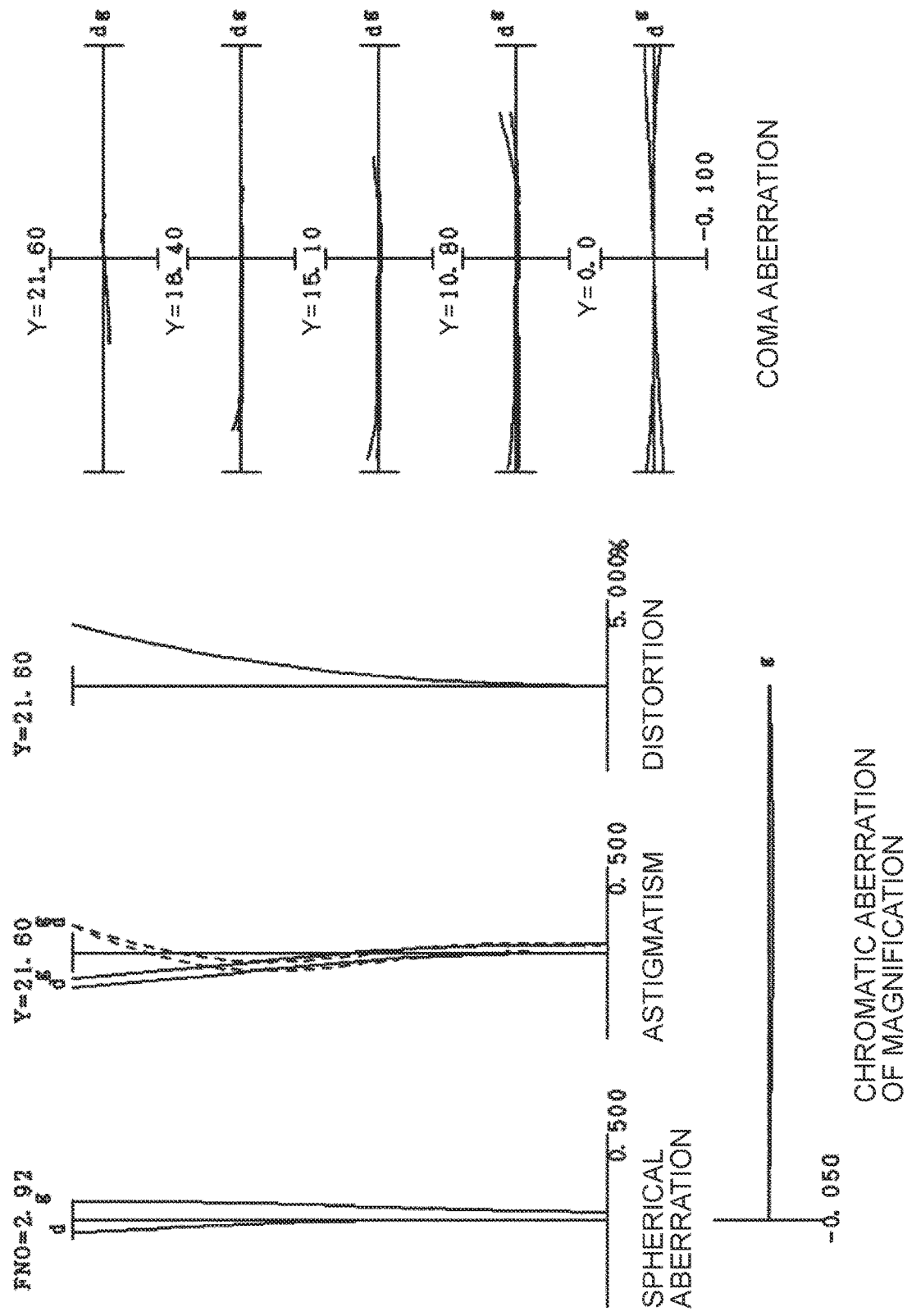
Figure 21A:
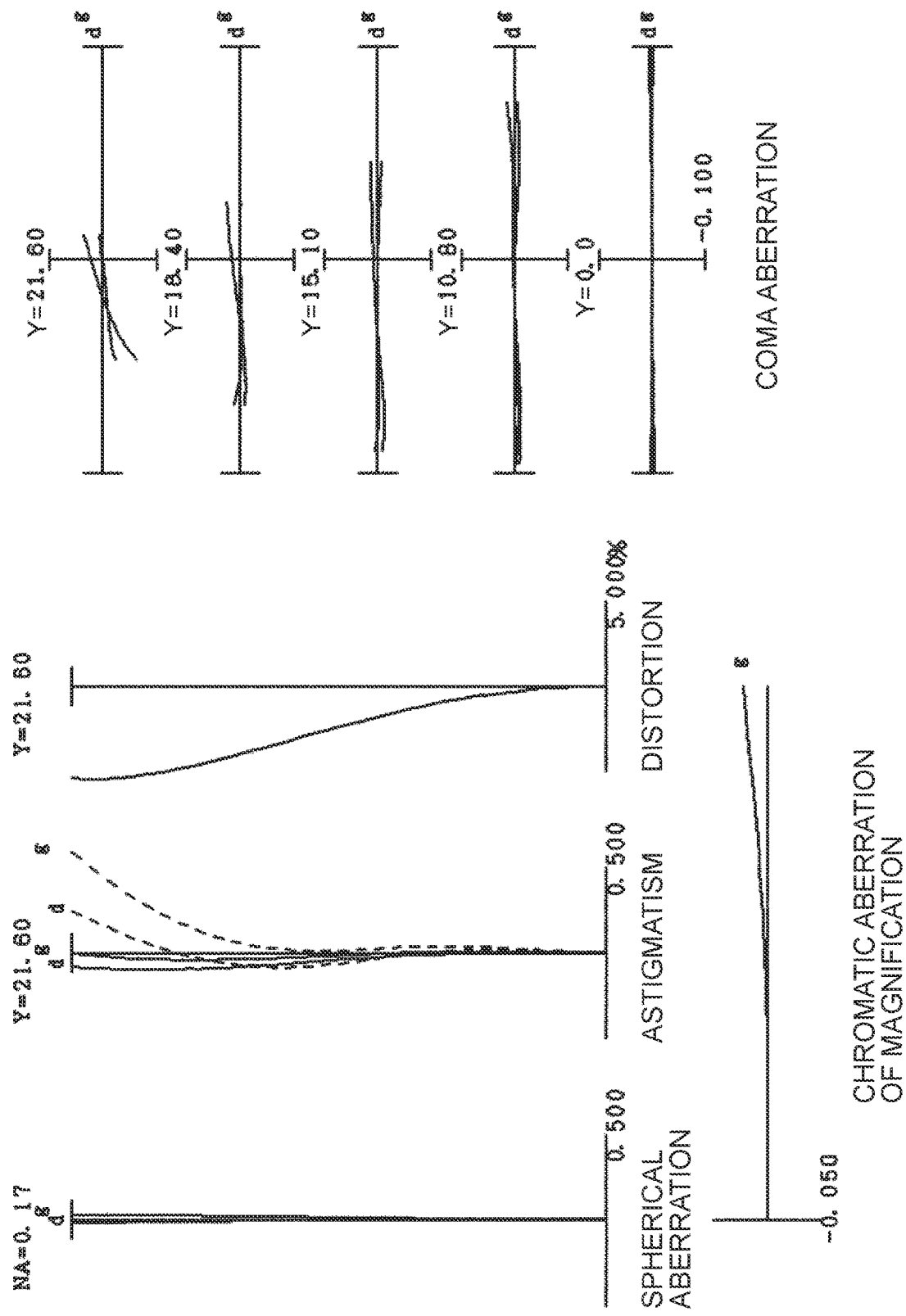

FIGS. 20A, 20B and 20C are graphs respectively showing various aberrations of the zoom optical system according to the seventh example upon focusing on infinity in the wide-angle end state, the intermediate focal length state and the telephoto end state. FIGS. 21A, 21B and 21C are graphs respectively showing various aberrations of the zoom optical system according to the seventh example upon focusing on a short-distance object in the wide-angle end state, the intermediate focal length state and the telephoto end state. The various aberration graphs show that the zoom optical system according to the seventh example favorably corrects the various aberrations from the wide-angle end state to the telephoto end state, has an excellent imaging performance, and also has an excellent imaging performance even upon focusing on a short-distance object.

Each example can achieve the zoom optical system that can achieve high-speed and highly silent autofocus without increasing the size of the lens barrel, and suppress the variation in aberrations upon zooming from the wide-angle end state to the telephoto end state, and the variation in aberrations upon focusing from the infinity object to the short-distance object.

Here, the first to the seventh examples described above each show a specific example of this embodiment. This embodiment is not limited thereto.

Note that the following details can be appropriately adopted in a range without degrading the optical performance of the zoom optical system according to this embodiment.

As numerical examples of the zoom optical system, what has the six-element group configuration and what has the seven-element group configuration are described. However, the present application is not limited thereto. A zoom optical system having another group configuration (for example, an eight-element one etc.) may be configured. Specifically, a configuration may be adopted where a lens or a lens group is added on the most-object side or the most-image side of the zoom optical system. Note that the lens group indicates a portion that includes at least one lens separated by air distances changing during zooming.

The lens surface may be formed to be a spherical surface or a plane, or formed to be an aspherical surface. A case where lens surfaces that are spherical surfaces or planes is preferable because the case facilitates lens processing, and assembly and adjustment, and can prevent degradation of optical performances due to errors in processing and assembly and adjustment. Furthermore, it is preferable because degradation of depiction performance is small even in case the image surface deviates.

In a case where the lens surface is an aspherical surface, the aspherical surface may be any of an aspherical surface made by a grinding process, a glass mold aspherical surface made by forming glass into an aspherical shape with a mold, and a composite type aspherical surface made by forming resin on a surface of glass into an aspherical shape. The lens surface may be a diffractive surface. The lens may be a gradient-index lens (GRIN lens) or a plastic lens.

Preferably, the aperture stop is disposed between the second lens group and the third lens group. However, a member as an aperture stop is not necessarily provided, and a lens frame may be substituted for the role thereof.

To reduce flares and ghosts and achieve a high optical performance having a high contrast, an antireflection film having a high transmissivity over a wide wavelength region may be applied to each lens surface. Accordingly, flares and ghosts can be reduced, and high optical performances having a high contrast can be achieved.

EXPLANATION OF NUMERALS AND CHARACTERS

| | |
|---|---|
| G1 First lens group | G2 Second lens group |
| G3 Third lens group | G4 Fourth lens group |
| G5 Fifth lens group | G6 Sixth lens group |
| G7 Seventh lens group | |
| I Image surface | S Aperture stop |

The invention claimed is:

1. A zoom optical system, comprising an arrangement of six or seven lens groups, the arrangement including, in order from an object: a first lens group having a positive refractive power; a second lens group having a negative refractive power; a first intermediate group having a positive refractive power and constituted by two lens groups; a second intermediate group constituted by one focusing lens group that moves upon focusing or by two lens groups at least one of which is a focusing lens group that moves upon focusing; and a last lens group having a positive or negative refractive power, wherein upon zooming, distances between adjacent lens groups change, the first lens group includes, in order from the object: a 1-1st lens having a negative refractive power; and a 1-2nd lens having a positive refractive power, and the following conditional expression is satisfied:

$$0.010 < dP1/f1 < 0.075$$

where dP1: a sum of a center thickness of the 1-1st lens and a center thickness of the 1-2nd lens, and f1: a focal length of the first lens group.

2. The zoom optical system according to claim 1, wherein the following conditional expression is satisfied:

$$2.00 < |fP1|/f1 < 14.00$$

where fP1: a combined focal length of the 1-1st lens and the 1-2nd lens.

3. The zoom optical system according to claim 1, wherein the following conditional expression is satisfied:

$$0.010 < dP12/f1 < 0.058$$

where dP12: a center thickness of the 1-2nd lens.

4. The zoom optical system according to claim 1, wherein the following conditional expression is satisfied:

$$1.15 < fP12/f1 < 4.00$$

where fP12: a focal length of the 1-2nd lens.

5. The zoom optical system according to claim 1, wherein the following conditional expression is satisfied:

$$-3.00 < fM2w/fLw < 0$$

where fM2w: a focal length of the second intermediate group in a wide-angle end state, and fLw: a focal length of the last lens group in the wide-angle end state.

6. The zoom optical system according to claim 1, wherein the following conditional expression is satisfied:

$$0.10 < fM1w/fM2w < 2.00$$

where fM1w: a focal length of the first intermediate group in a wide-angle end state, and fM2w: a focal length of the second intermediate group in the wide-angle end state.

7. The zoom optical system according to claim 1, wherein the following conditional expression is satisfied:

$$-2.00 < fM1w/fLw < 2.00$$

where fM1w: a focal length of the first intermediate group in a wide-angle end state, and fLw: a focal length of the last lens group in the wide-angle end state.

8. The zoom optical system according to claim 1, wherein the following conditional expression is satisfied:

$$3.40 < f1/(-f2) < 7.00$$

where f2: a focal length of the second lens group.

9. The zoom optical system according to claim 1, wherein the focusing lens group consists of three or less single lenses.

10. The zoom optical system according to claim 1, wherein the focusing lens group includes a single lens having a negative refractive power.

11. The zoom optical system according to claim 1, wherein the focusing lens group is disposed closer to an image than an aperture stop.

12. The zoom optical system according claim 1, further comprising an aperture stop, and wherein at least four of the lens groups in the arrangement are disposed closer to an image than the aperture stop.

13. The zoom optical system according to claim 1, wherein the following conditional expression is satisfied:

$$0.20<|fF|/ft<4.00$$

where fF: a focal length of the focusing lens group having a strongest refractive power among the focusing lens groups, and ft: a focal length of the zoom optical system in a telephoto end state.

14. The zoom optical system according to claim 1, wherein a lens group disposed closest to an image in the first intermediate group includes a cemented lens including a negative lens and a positive lens.

15. The zoom optical system according to claim 1, wherein a lens group disposed closest to an image in the first intermediate group includes a cemented lens including a negative lens and a positive lens, and the following conditional expression is satisfied:

$$1.00<nN/nP<1.35$$

where nN: a refractive index of the negative lens in the cemented lens, and nP: a refractive index of the positive lens in the cemented lens.

16. The zoom optical system according to claim 1, wherein a lens group disposed closest to an image in the first intermediate group includes a cemented lens including a negative lens and a positive lens, and the following conditional expression is satisfied:

$$0.20<vN/vP<0.85$$

where vN: an Abbe number of the negative lens in the cemented lens, and vP: an Abbe number of the positive lens in the cemented lens.

17. The zoom optical system according to claim 1, wherein the following conditional expression is satisfied:

$$f1/|fRw|<5.00$$

where fRw: a combined focal length of lens groups disposed closer to an image than the first intermediate group in a wide-angle end state.

18. The zoom optical system according to claim 1, wherein the following conditional expression is satisfied:

$$2\omega w>75°$$

where ωw: a half angle of view of the zoom optical system in a wide-angle end state.

19. The zoom optical system according to claim 1, wherein the following conditional expression is satisfied:

$$0.10<BFw/fw<1.00$$

where BFw: a back focus of the zoom optical system in a wide-angle end state, and fw: a focal length of the zoom optical system in the wide-angle end state.

20. The zoom optical system according to claim 1, wherein the second intermediate group is constituted by one focusing lens group;

the focusing lens group has a positive refractive power, and the following conditional expression is satisfied:

$$0.00<(rR2+rR1)/(rR2-rR1)<8.00$$

where rR1: a radius of curvature of an object-side lens surface of a lens disposed closest to an image in the zoom optical system, and rR2: a radius of curvature of an image-side lens surface of the lens disposed closest to the image in the zoom optical system.

21. The zoom optical system according to claim 1, wherein the second intermediate group is constituted by one focusing lens group, the focusing lens group has a negative refractive power, and the following conditional expression is satisfied:

$$-4.00<(rR2+rR1)/(rR2-rR1)<4.00$$

where rR1: a radius of curvature of an object-side lens surface of a lens disposed closest to an image in the zoom optical system, and rR2: a radius of curvature of an image-side lens surface of the lens disposed closest to the image in the zoom optical system.

22. An optical apparatus, comprising to zoom optical system according to claim 1 mounted thereon.

23. A method for manufacturing a zoom optical system that comprises an arrangement of six or seven lens groups, the arrangement including, in order from an object: a first lens group having a positive refractive power; a second lens group having a negative refractive power; a first intermediate group having a positive refractive power and constituted by two lens groups; a second intermediate group constituted by one focusing lens group that moves upon focusing or by two lens groups at least one of which is a focusing lens group that moves upon focusing; and a last lens group having a positive or negative refractive power, the method comprising arranging the lens groups in a lens barrel such that:

upon zooming, distances between adjacent lens groups change, the first lens group includes, in order from the object: a 1-1st lens having a negative refractive power; and a 1-2nd lens having a positive refractive power, and the following conditional expression is satisfied:

$$0.010<dP1/f1<0.075$$

where dP1: a sum of a center thickness of the 1-1st lens and a center thickness of the 1-2nd lens, and f1: a focal length of the first lens group.

* * * * *